(12) United States Patent
Kasai et al.

(10) Patent No.: US 9,343,166 B2
(45) Date of Patent: May 17, 2016

(54) NON-VOLATILE SEMICONDUCTOR STORAGE DEVICE

(71) Applicant: Floadia Corporation, Kodaira-shi, Tokyo (JP)

(72) Inventors: Hideo Kasai, Kodaira (JP); Yutaka Shinagawa, Kodaira (JP); Yasuhiro Taniguchi, Kodaira (JP)

(73) Assignee: FLOADIA CORPORATION, Kodaira-Shi (JP)

( * ) Notice: Subject to any disclaimer, the term of this patent is extended or adjusted under 35 U.S.C. 154(b) by 0 days.

(21) Appl. No.: 14/410,380

(22) PCT Filed: Jun. 21, 2013

(86) PCT No.: PCT/JP2013/067146
§ 371 (c)(1),
(2) Date: Dec. 22, 2014

(87) PCT Pub. No.: WO2014/002291
PCT Pub. Date: Jan. 3, 2014

(65) Prior Publication Data
US 2015/0318048 A1  Nov. 5, 2015

(30) Foreign Application Priority Data

Jun. 29, 2012 (JP) .................................. 2012-146954

(51) Int. Cl.
*G11C 16/04* (2006.01)
*G11C 5/06* (2006.01)
(Continued)

(52) U.S. Cl.
CPC ............ *G11C 16/30* (2013.01); *G11C 16/0408* (2013.01); *G11C 16/0466* (2013.01);
(Continued)

(58) Field of Classification Search
CPC .......... G11C 16/08; G11C 5/06; G11C 16/04; G11C 5/063; G11C 5/025; G11C 16/30
USPC ....................... 365/185.05, 185.18, 51, 63, 72
See application file for complete search history.

(56) References Cited

U.S. PATENT DOCUMENTS

| 5,886,923 A | 3/1999 | Hung |
| 5,896,340 A | 4/1999 | Wong et al. |

(Continued)

FOREIGN PATENT DOCUMENTS

| JP | S60-95794 A | 5/1985 |
| JP | H11-73791 A | 3/1999 |

(Continued)

OTHER PUBLICATIONS

Kamigaki, Yoshiaki et al.; "MNOS Nonvolatile Semiconductor Memory Technology: Present and Future"; IEICE Trans. Electron., vol. E84-C, No. 6; Jun. 2001; pp. 713-723.

(Continued)

*Primary Examiner* — Ly D Pham
(74) *Attorney, Agent, or Firm* — Pearne & Gordon LLP

(57) ABSTRACT

A non-volatile memory includes a plurality of word lines, power supply units are provided for word line columns, a different unit voltage is applied for each of power supply units depending on whether a selected memory cell exists in the column, a switching mechanism in each power supply unit is switched by the word line depending on a voltage value on a control line, a charge storage gate voltage or inhibition gate voltage is applied for each of the word lines so that the inhibition gate voltage value and a bit line voltage value can be freely set for each of the word line columns to values at which occurrence of disturbance can be suppressed. A plurality of power supply units are connected to the control line in a common row direction, and a row-direction address decoder, which is independent for each of the word line columns is not required.

12 Claims, 13 Drawing Sheets

(51) Int. Cl.
*G11C 5/02* (2006.01)
*G11C 5/14* (2006.01)
*G11C 16/08* (2006.01)
*G11C 16/30* (2006.01)
*G11C 16/24* (2006.01)
*G11C 16/12* (2006.01)

(52) U.S. Cl.
CPC ............... *G11C16/08* (2013.01); *G11C 16/12* (2013.01); *G11C 16/24* (2013.01); *G11C 5/025* (2013.01); *G11C 5/06* (2013.01); *G11C 5/063* (2013.01); *G11C 16/04* (2013.01)

(56) References Cited

U.S. PATENT DOCUMENTS

| | | | |
|---|---|---|---|
| 5,995,414 A | 11/1999 | Sato | |
| 6,356,481 B1* | 3/2002 | Micheloni | G11C 8/08 365/185.18 |
| 6,456,527 B1 | 9/2002 | Campardo et al. | |
| 6,804,148 B2 | 10/2004 | Bedarida et al. | |
| 7,184,305 B2* | 2/2007 | Tanno | G11C 29/02 365/185.09 |
| 2011/0157989 A1* | 6/2011 | Iwata | G11C 16/0483 365/185.17 |
| 2012/0155168 A1* | 6/2012 | Kim | G11C 5/14 365/185.03 |
| 2012/0230108 A1* | 9/2012 | Missiroli | G11C 16/26 365/185.18 |
| 2013/0155773 A1* | 6/2013 | Miyamoto | G11C 16/06 365/185.12 |

FOREIGN PATENT DOCUMENTS

| | | |
|---|---|---|
| JP | H11-177069 A | 7/1999 |
| JP | 2000-215683 A | 8/2000 |

OTHER PUBLICATIONS

International Search Report of Corresponding Application No. PCT/JP2013/067146; Dated Sep. 10, 2013.
Written Opinion for Corresponding Application No. SG 11201408686Q; Dated Sep. 15, 2015.
Extended European Search Report for Corresponding Application No. EP 13 81 0694; Dated Nov. 2, 2015.

* cited by examiner

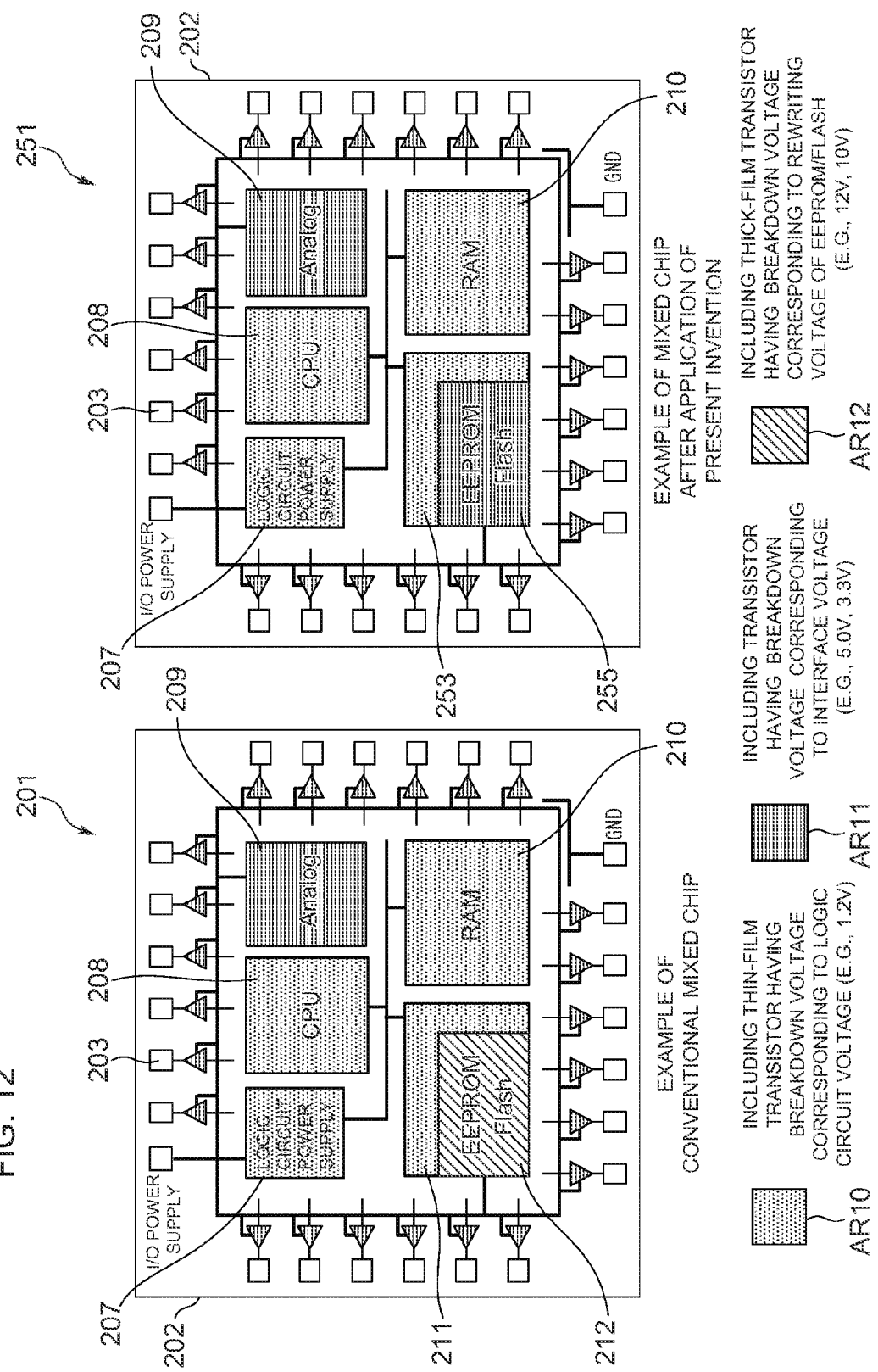

NON-VOLATILE SEMICONDUCTOR STORAGE DEVICE

TECHNICAL FIELD

The present invention relates to a non-volatile semiconductor memory device, and is appropriately applied to a non-volatile semiconductor memory device capable of writing, among a plurality of memory cell transistors (hereinafter merely referred to as memory cells) arranged in a matrix, for example, data into a predetermined memory cell.

BACKGROUND ART

Conventionally, as a non-volatile semiconductor memory device, a non-volatile semiconductor memory device that writes data by storing a charge in a charge storage layer in a memory cell by a quantum tunnel effect, for example, has been known (see, e.g., Patent Literature 1 and Non Patent Literature 1). FIG. 13 illustrates a conventional non-volatile semiconductor memory device 501, which includes a plurality of P-type memory wells W503a, W503b, W503c, and W503d arranged in a row direction (horizontal direction), for example, and has a configuration in which a plurality of memory cells C are formed in a matrix in each of the P-type memory wells W503a to W503d. In this non-volatile semiconductor memory device 501, a plurality of common word lines 502a, 502b, 502c, 502d, 502e, and 502f extending in the row direction are arranged with equal spacing in a column direction (vertical direction), and the common word lines 502a to 502f and the P-type memory wells W503a to W503d are arranged to respectively intersect each other.

The plurality of memory cells C arranged in the same row over the plurality of P-type memory wells W503a to W503d are connected to each of the common word lines 502a to 502f. A predetermined gate voltage can be uniformly applied to control gates of all the memory cells C arranged in the same row. Each of the P-type memory wells W503a to W503d is provided with a plurality of first bit lines L1 extending in the column direction and a plurality of second bit lines L2 similarly extending in the column direction.

Each of the P-type memory wells W503a to W503d has a configuration in which the one first bit line L1 and the second bit line L2 adjacent to the first bit line L1 are paired with each other and the plurality of memory cells C are arranged in parallel between the first bit line L1 and the second bit line L2 that run parallel to each other. In practice, each of the memory cells C has its one end connected to the first bit line L1 and has the other end connected to the second bit line L2. A writing voltage or a writing inhibition voltage, for example, can be applied to the one end and the other end, respectively, from the first bit line L1 and the second bit line L2.

All the memory cells C have the same configuration, and are N-channel type memory cells respectively having the P-type memory wells W503a to W503d as semiconductor substrates. Each of the memory cells C has a channel region between the one end and the other end formed with predetermined spacing in the semiconductor substrate (the p-type memory well W503a), for example, and has a configuration in which a charge storage layer, an interlayer insulating layer, and a control gate are sequentially stacked via a tunnel insulating layer on the channel region. Due to a voltage difference between a voltage applied to the one end and the other end and a voltage applied to the control gate, in the memory cells C having such a configuration, a charge is injected into the charge storage layer so that data can be written or the charge stored in the charge storage layer is extracted so that data can be erased.

Thus, the non-volatile semiconductor memory device 501 having the memory cells C can write and read out data into and out of a predetermined memory cell C, or erase the data written into the memory cell C by adjusting values of voltages respectively applied to the first bit line L1, the second bit line L2, the common word lines 502a to 502f, and the P-type memory well W503a to W503d.

FIG. 13 illustrates respective values of voltages applied to portions when data is written into only the memory cell C arranged in the first row and the first column in the P-type memory well W503a in the first column among the plurality of memory cells C and data is not written into all the other memory cells C. For convenience of illustration, the memory cell C into which data is written is referred to as a selected memory cell C1, and the memory cell C into which no data is written is referred to as a non-selected memory cell C2. The common word line 502a to which the selected memory cell C1 is connected is referred to as a selected common word line 515, and the first bit line L1 and the second bit line L2 to which the selected memory cell C1 is similarly connected are referred to as a selected first bit line L1a and a selected second bit line L2a. On the other hand, the common word lines 502b, 502c, 502d, 502e, and 502f to which only the non-selected memory cells C2 are connected are referred to as a non-selected common word line 516, and the first bit line L1 and the second bit line L2 to which only the non-selected memory cells C2 are similarly connected are referred to as non-selected first bit lines L1b and L1c and non-selected second bit lines L2b and L2c.

In this case, 0[V] is applied to each of the P-type memory wells W503a to W503d. Description is first made by paying attention to the P-type well W503a (hereinafter merely referred to as a selected byte) in which the selected memory cell C1 is arranged, and description is then made by paying attention to the P-type memory wells W503b to W503d (hereinafter merely referred to as non-selected bytes) in which only the non-selected memory cells C2 are arranged. In practice, in a selected row in which the selected common word line 515 is arranged, a writing gate voltage of 12[V] is applied to the selected common word line 515, and a writing voltage of 0[V] is applied to each of the selected first bit line L1a and the selected second bit line L2a. Thus, the selected memory cell C1 has its control gate to which the writing gate voltage of 12[V] is applied from the selected common word line 515 while having its one end and the other end to which the writing voltage of 0[V] can be applied from the selected first bit line L1a and the selected second bit line L2a. Thus, the selected memory cell C1 can enter a state where data is written thereinto because a voltage difference occurring between the control gate and a channel region becomes large, and as a result a quantum tunnel effect is produced so that a charge is injected into a charge storage layer.

In this case, in the selected byte, a writing inhibition voltage of 6[V] is applied as an intermediate voltage to the non-selected first bit line L1b and the non-selected second bit line L2b. Thus, the non-selected memory cell C2 connected to the non-selected first bit line L1b and the non-selected second bit line L2b in the selected byte has its control gate to which the writing gate voltage of 12[V] is applied from the selected common word line 515 while having its one end and the other end to which the writing inhibition voltage of 6[V] is applied from the non-selected first bit line L1b and the non-selected second bit line L2b. Thus, the non-selected memory cell C2 can enter a state where data is not written thereinto because a voltage difference occurring between the control gate and a channel region becomes small and as a result, a quantum tunnel effect is not produced so that no charge is injected into a charge storage layer. Thus, in a first area AR501 where the selected byte and the selected row intersect each other, data is written into only the selected memory cell C1 and is not written into the other non-selected memory cells C2.

On the other hand, in a non-selected row, a writing inhibition gate voltage of 0[V] is applied to the non-selected common word line 516. Thus, in a second area AR502 where the selected byte and the non-selected row intersect each other, the non-selected memory cell C2 connected to the selected first bit line L1a and the selected second bit line L2a has its one end and the other end to which the writing voltage of 0[V] is applied from the selected first bit line L1a and the selected second bit line L2a while having its control gate to which the writing inhibition gate voltage of 0[V] is applied from the non-selected common word line 516. Thus, the non-selected memory cell C2 can enter a state where data is not written thereinto because the control gate and a channel region have the same voltage and as a result, a quantum tunnel effect is not produced so that no charge is injected into a charge storage layer.

In the second area AR502, the non-selected memory cell C2 connected to the non-selected first bit line L1b and the non-selected second bit line L2b has its one end and the other end to which the writing inhibition voltage of 6[V] is applied from the non-selected first bit line L1b and the non-selected second bit line L2b and has its control gate to which the writing inhibition gate voltage of 0[V] is applied from the non-selected common word line 516. Thus, the non-selected memory cell C2 can enter a state where data is not written thereinto because a voltage difference occurring between the control gate and a channel region becomes small and as a result, a quantum tunnel effect is not produced so that no charge is injected into a charge storage layer.

A non-selected byte will then be paid attention to. In this case, in the non-selected byte, a writing inhibition voltage of 12[V] is applied to a non-selected first bit line L1c and a non-selected second bit line L2c. Thus, each of the non-selected memory cells C2 in a third area AR503 where the non-selected byte and the selected row intersect each other has its control gate to which the writing gate voltage of 12[V] is applied from the selected common word line 515 while having its one end and the other end to which the writing inhibition voltage of 12[V] is applied from the non-selected first bit line L1c and the non-selected second bit line L2c. Thus, the non-selected memory cell C2 can enter a state where data is not written thereinto because the control gate and a channel region have the same voltage and as a result, a quantum tunnel effect is not produced so that no charge is injected into a charge storage layer.

Each of the non-selected memory cells C2 in a fourth area AR504 where the non-selected row and the non-selected byte intersect each other has its control gate to which the writing inhibition gate voltage of 0[V] is applied from the non-selected common word line 516 while having its one end and the other end to which the writing inhibition voltage of 12[V] is applied from the non-selected first bit line L1c and the non-selected second bit line L2c. Thus, the non-selected memory cell C2 can enter a state where data is not written thereinto because a voltage value on the side of the control gate becomes smaller than a voltage value on the side of a channel region and as a result, a quantum tunnel effect is not produced so that no charge is injected into a charge storage layer.

Thus, in the non-volatile semiconductor memory device 501, data can be written, among the plurality of memory cells C arranged in a matrix, into only the predetermined selected memory cell C1 by adjusting each of values of the voltages applied to the common word lines 502a to 502f, the first bit line L1, and the second bit line L2.

CITATION LIST

Patent Literature

Patent Literature 1: Japanese Patent Laid-Open No. 60-95794

Non Patent Literature

Non Patent Literature 1: IEICE TRANS, ELECTRON, VOL. E84-C, NO. 6 2001 (FIG. 13)

SUMMARY OF INVENTION

Technical Problem

In the non-volatile semiconductor memory device 501 having such a configuration, the common word lines 502a to 502f, which are common between the selected byte and the non-selected byte, are used. Thus, the writing gate voltage of 12[V] applied to the selected common word line 515 is also applied to each of the non-selected memory cells C2 in the same row arranged in the third area AR503 in the non-selected byte. Thus, in the non-volatile semiconductor memory device 501, a rewriting inhibition voltage of 12[V] is also applied to the non-selected first bit line L1c and the non-selected second bit line L2c in the third area AR503 so that no charge is injected into the charge storage layer in the non-selected memory cell C2 in the third area AR503, as described above.

However, in the third area AR503 in the non-selected byte, even if the rewriting inhibition voltage of 12[V] is applied to the non-selected first bit line L1c and the non-selected second bit line L2c to match a voltage applied to the selected common word line 515, 0[V] is applied to each of the P-type memory wells W503b to W503d. Thus, the voltage values applied to the P-type memory wells W503b to W503d become lower than the voltage values applied to the selected common word line 515, the non-selected first bit line L1c, and the non-selected second bit line L2c. Therefore, in the third area AR503, when an operation for writing data into the selected memory cell C1 is repeated in the first area AR501, an unintended charge is eventually injected into the charge storage layer in the non-selected memory cell C2 due to a voltage difference occurring between the non-selected first bit line L1c and the non-selected second bit line L2c and the P-type memory wells W503b to W503d. Thus, a phenomenon where a charge storage state of the charge storage layer varies (hereinafter referred to as disturbance) may occur.

In the non-volatile semiconductor memory device 501, the writing inhibition voltage of 12[V] is applied to the non-selected first bit line L1c and the non-selected second bit line L2c arranged in the non-selected byte. Thus, a voltage difference increases in the fourth area AR504 where the non-selected common word line 516 to which the writing inhibition gate voltage of 0[V] is applied in the non-selected row and the non-selected first bit line L1c and the non-selected second bit line L2c to which the writing inhibition voltage of 12[V] is applied intersect each other. As a result, disturbance may also occur in each of the non-selected memory cells C2 in the fourth area AR504.

In the non-volatile semiconductor memory device 501, disturbance also occurs in each of the non-selected memory cells C2 not only in the third area AR503 but also in the fourth area AR504. As the number of common word lines 502a to 502f increases and the number of memory cells C into which data can be written in the selected byte increases, the number of times of data writing into the selected memory cell C1 in the selected byte increases. Accordingly, disturbance further frequently occurs in the non-selected memory cell in which data is not rewritten in the non-selected byte.

In the non-volatile semiconductor memory device 501, when such disturbance repeatedly occurs in the non-selected byte, a weak writing operation and a weak erasure operation occur. As a result, a threshold voltage of each of the non-selected memory cells in the non-selected byte varies so that data may finally disappear. Thus, particularly in the non-volatile semiconductor memory device 501 that is operated as an EEPROM (Electrically Erasable and Programmable Read Only Memory) in which a rewriting unit is as small as one byte, it is desired that occurrence of disturbance in the non-selected memory cell C2 during data writing can be suppressed.

As a non-volatile semiconductor memory device for solving such a problem of disturbance, it may be considered that a row-direction address decoder, which applies a gate voltage to a word line, for example, is individually provided for each of the selected byte and the non-selected byte, is independently operated, to apply an optimum gate voltage for each of the bytes, and completely separates the selected byte and the non-selected byte from each other.

In this non-volatile semiconductor memory device, a low writing inhibition gate voltage can be applied to each of the non-selected word lines in the non-selected byte without being constrained by a row-direction address decoder, which applies a writing gate voltage of 12[V] to the selected word line in the selected byte, by another row-direction address decoder. In the non-volatile semiconductor memory device, a value of the writing inhibition voltage applied to the non-selected first bit line and the non-selected second bit line and a value of the voltage applied to the P-type memory well can also be selected as the same voltage value as that of the low writing inhibition gate voltage. Thus, disturbance in the non-selected memory cell in the non-selected byte can be suppressed.

However, this non-volatile semiconductor memory device cannot be easily miniaturized because the independent row-direction address decoders need to be respectively provided for the selected byte and the non-selected byte, and accordingly a circuit configuration is further complicated.

The present invention has been made in view of the foregoing points, and is directed to proposing a non-volatile semiconductor memory device that can suppress occurrence of disturbance more greatly than in the conventional technique while being miniaturized.

Solution to Problem

To solve such an issue, a first aspect of the present invention is directed to a non-volatile semiconductor memory device including a plurality of word lines formed in a matrix to which either one of a charge storage gate voltage and a charge storage inhibition gate voltage is applied, a plurality of memory cells connected to the respective word lines, and a bit line that applies a selective voltage to the plurality of memory cells, a charge being stored in selected one of the plurality of memory cells due to a voltage difference between the charge storage gate voltage applied to the word line and the voltage applied to the bit line, further including power supply units respectively provided for word line columns, and common wirings respectively provided for word line rows, each of the common wirings applying a predetermined common voltage to the power supply units on a word-line-row basis, each of the power supply units including switching mechanisms that are respectively provided for the word lines and respectively connect the word lines to the common wirings, and a unit wiring that uniformly applies different unit voltages to the switching mechanisms in the power supply unit depending on whether or not the selected memory cell exists in the word line column, wherein the switching mechanisms in each of the power supply units are turned on or off based on a voltage difference between the unit voltage applied to each of the power supply units and the common voltage, to individually apply the charge storage gate voltage or the charge storage inhibition gate voltage to each of the word lines via the power supply unit.

In a first embodiment (FIG. 1), a second embodiment (FIG. 2), a third embodiment (FIG. 4), a fourth embodiment (FIG. 6), a fifth embodiment (FIG. 7), a sixth embodiment (FIG. 8), and a seventh embodiment (FIG. 9) according to the present invention, in the selected power supply unit to which the selected word line having the selected memory cell thereon is connected among the power supply units, the NMOS switch is turned off and the PMOS switch having its source to which the charge storage gate voltage is applied is turned on so that the charge storage gate voltage is applied to the selected word line from a drain of the PMOS switch.

In the first embodiment (FIG. 1), the second embodiment (FIG. 2), the third embodiment (FIG. 4), the fourth embodiment (FIG. 6), the fifth embodiment (FIG. 7), and the sixth embodiment (FIG. 8), the charge storage gate voltage is applied to the source of the PMOS switch from the unit wiring. On the other hand, in the seventh embodiment (FIG. 9), the charge storage gate voltage is applied to the source of the PMOS switch from the common wiring.

In the first embodiment (FIG. 1), the second embodiment (FIG. 2), the third embodiment (FIG. 4), the fourth embodiment (FIG. 6), the fifth embodiment (FIG. 7), the sixth embodiment (FIG. 8), and the seventh embodiment (FIG. 9) according to the present invention, in the selected power supply unit to which the selected word line having the selected memory cell thereon is connected among the power supply units, when the charge storage inhibition gate voltage is applied to the non-selected word line on which only the non-selected memory cell exists, the PMOS switch is turned off and the NMOS switch having its source to which the charge storage inhibition gate voltage is applied is turned on so that the charge storage inhibition gate voltage is applied to the non-selected word line from a drain of the NMOS switch.

In the first embodiment (FIG. 1), the second embodiment (FIG. 2), the third embodiment (FIG. 4), the fourth embodiment (FIG. 6), the fifth embodiment (FIG. 7), and the sixth embodiment (FIG. 8), the charge storage inhibition gate voltage is applied to the source of the NMOS switch from the unit wiring. On the other hand, in the seventh embodiment (FIG. 9), the charge storage inhibition gate voltage is applied to the NMOS switch from the common wiring.

Furthermore, in the third embodiment (FIG. 4), the fourth embodiment (FIG. 6), the fifth embodiment (FIG. 7), the sixth embodiment (FIG. 8), and the seventh embodiment (FIG. 9) according to the present invention, in the non-selected power supply unit having only the non-selected word line on which only the non-selected memory cells are arranged among the power supply units, an auxiliary switch having its source to which the charge storage inhibition gate voltage is applied is turned on so that the charge storage inhibition gate voltage is applied to the non-selected word line from a drain of the auxiliary switch.

In the third embodiment (FIG. 4), the fifth embodiment (FIG. 7), the sixth embodiment (FIG. 8), and the seventh embodiment (FIG. 9), the auxiliary switch is an auxiliary NMOS switch. On the other hand, in the fourth embodiment (FIG. 6), the auxiliary switch is an auxiliary PMOS switch. In the present embodiment, the charge storage inhibition gate voltage is applied to the auxiliary switch from the unit wiring.

Advantageous Effects of Invention

According to the present invention, the different unit voltages are applied for each of the power supply units depending on whether or not the selected memory cell exists in the word line column, and the switching mechanisms in each of the power supply units are turned on or off by the word line based on the voltage difference between the unit voltage and the common voltage so that the charge storage gate voltage or the charge storage inhibition gate voltage can be individually applied for each of the word lines via the power supply unit. Thus, a value of the charge storage inhibition gate voltage and a value of the voltage applied to the bit line can be respectively freely set, without being constrained by the voltage applied to the one word line column, to voltage values at which occurrence of disturbance can be suppressed, for example, in the other word line column.

According to the present invention, the common wiring connects the plurality of power supply units to one another. The common voltage applied to the common wiring is adjusted to turn on or off the switching mechanisms in each of the power supply units so that selected one of all the word lines can be selectively determined. Thus, independent row-direction address decoders need not be respectively provided for the word line columns so that miniaturization can be achieved like in the conventional technique. In the present invention, the non-volatile semiconductor memory device capable of suppressing occurrence of disturbance more greatly than in the conventional technique while being miniaturized is realized.

BRIEF DESCRIPTION OF DRAWINGS

FIG. 12 is a schematic view illustrating respective configurations of a conventional mixed chip and a mixed chip using the non-volatile semiconductor memory device according to the present invention.

DESCRIPTION OF EMBODIMENTS

Embodiments of the present invention will be described in detail with reference to the drawings.

Figure 1:
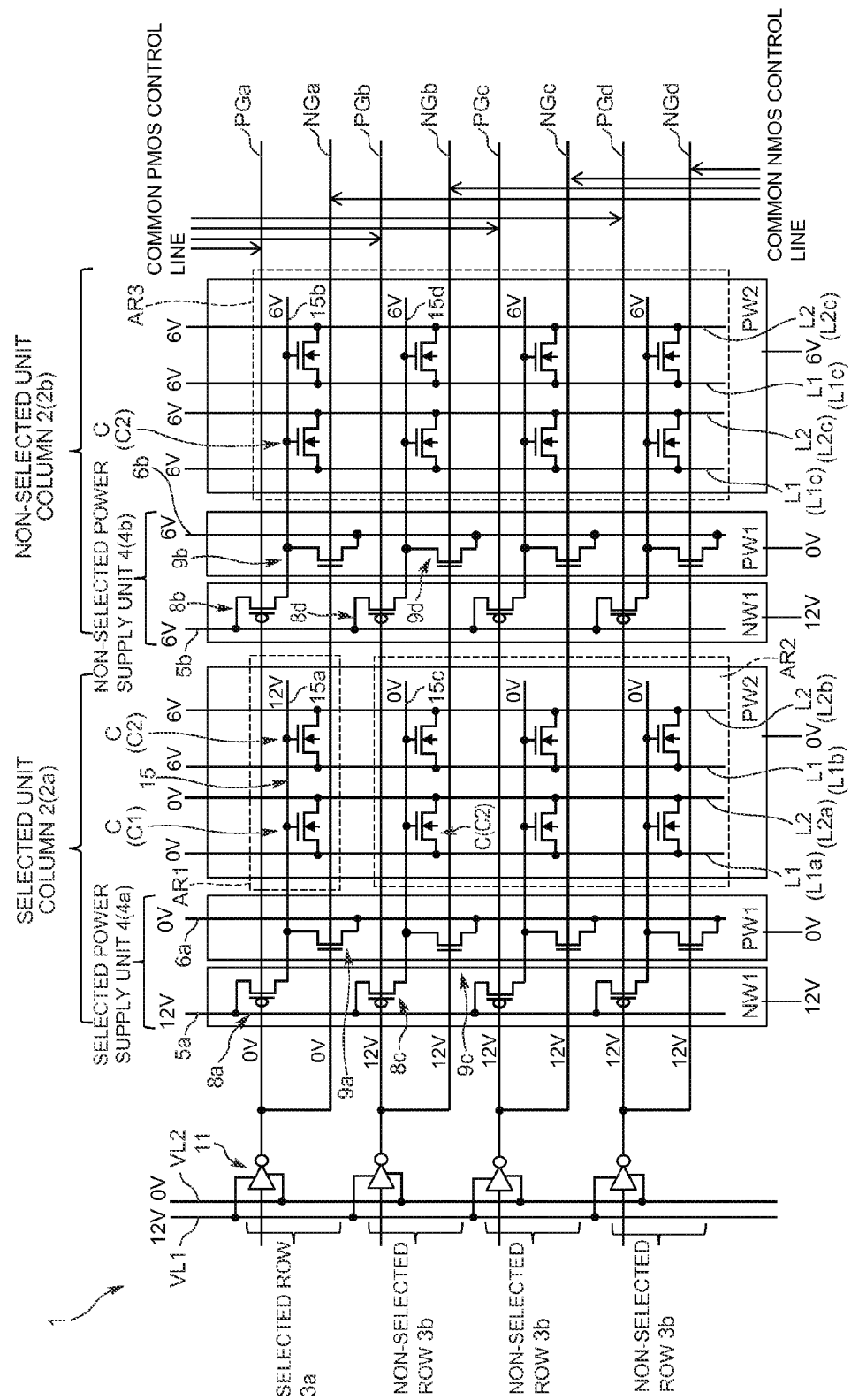
FIG. 1 is a circuit diagram illustrating a circuit configuration of a non-volatile semiconductor memory device according to a first embodiment and respective values of voltages applied to portions during data writing.
Figure 13:
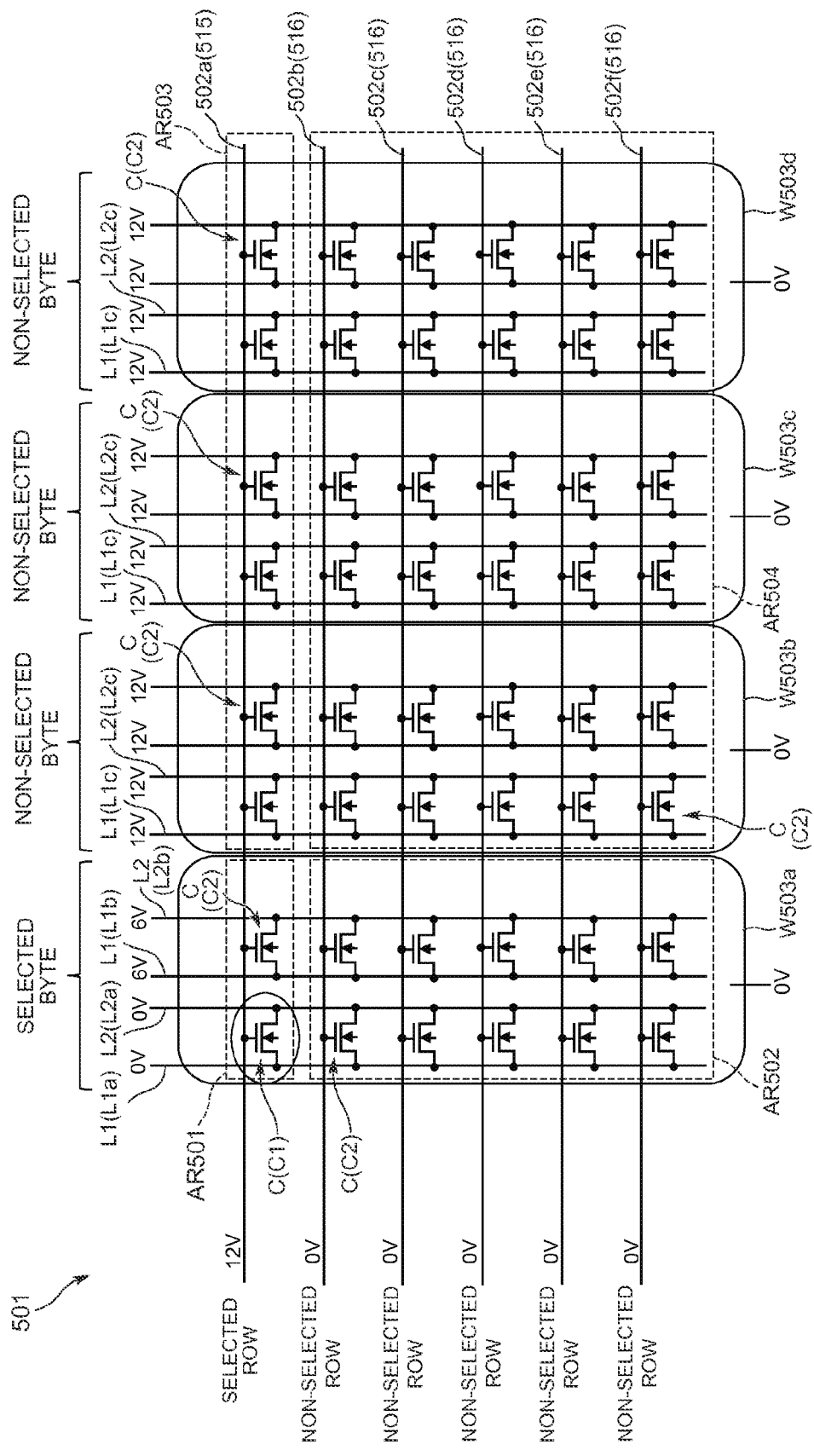
FIG. 13 is a circuit diagram illustrating a circuit configuration of a conventional non-volatile semiconductor memory device and respective values of voltages applied to portions during data writing.

(1) First Embodiment (1-1) Overall Configuration of Non-Volatile Semiconductor Memory Device In FIG. 1 illustrating portions corresponding to those illustrated in FIG. 13 with the same symbols respectively assigned thereto, reference numeral 1 denotes a non-volatile semiconductor memory device according to the present invention, which has a configuration in which a plurality of unit columns 2 having the same configuration are arranged in a row direction (horizontal direction). All the plurality of unit columns 2 have the same configuration. Thus, description is made below by paying attention to the first unit column 2. In this case, in the unit column 2, an N-type well NW1, a p-type well PW1, and a P-type memory well PW2 are arranged in this order, a power supply unit 4 is formed in the N-type well NW1 and the P-type well PW1, and a plurality of memory cells C are formed in a matrix in the P-type memory well PW2 serving as a memory well.

In the power supply unit 4, a first power supply line 5a extending in a column direction (vertical direction) is formed in the N-type well NW1, and a plurality of PMOS switches 8a, 8c, . . . are provided along the first power supply line 5a with predetermined spacing in the column direction. The PMOS switches 8a, 8c, . . . have their respective sources connected to the first power supply line 5a and have their respective drains connected to word lines 15, described below, and are turned on so that a writing gate voltage, a writing inhibition gate voltage, or the like applied to the sources from the first power supply line 5a can be applied to the word lines 15 from the drains.

In the power supply unit 4, a second power supply line 6a similarly extending in the column direction is formed in the P-type well PW1, and NMOS switches 9a, 9c, . . . respectively paired with the PMOS switches 8a, 8c, ... are provided along the second power supply line 6a with predetermined spacing in the column direction. The NMOS switches 9a, 9c, ... have their respective sources connected to the second power supply line 6a and have their respective drains connected to the word lines 15, described below, and are turned on so that a writing inhibition gate voltage or the like applied to the sources from the second power supply line 6a can be applied to the word lines 15 from the drains.

In the P-type memory wells PW2 in the unit column 2, the plurality of word lines 15 are provided to correspond to pairs of the PMOS switches 8a, 8c, ... and the NMOS switches 9a, 9c, ..., and a plurality of (two in this case) memory cells C are formed along each of the word lines 15. In practice, in the P-type memory wells PW2, the plurality of word lines 15 extending in the row direction (horizontal direction) are arranged with predetermined spacing in the column direction. The drains of the PMOS switch 8a (8c, ...) and the NMOS switch 9a (9c, ...) in the same row arranged in the power supply unit 4 and control gates of the memory cells C in the same row arranged in the P-type memory well are connected to the word line 15. Thus, each of the word lines 15 is adapted so that the predetermined gate voltage (writing gate voltage or writing inhibition gate voltage) applied from either one of the PMOS switches 8a, 8c, ... and the NMOS switches 9a, 9c, ... can be uniformly applied to all the plurality of memory cells C arranged in the same row within the unit column 2.

In the P-type memory well PW2, a plurality of first bit lines L1 extending in the column direction and a plurality of second bit lines L2 similarly extending in the column direction are provided. In practice, the P-type memory well PW2 has a configuration in which the one first bit line L1 and the second bit line L2 adjacent to the first bit line L1 are paired with each other and the plurality of memory cells C are arranged in parallel between the first bit line L1 and the second bit line L2 running parallel to each other. The first bit line L1 is connected to one end of each of the memory cells C, and the second bit line L2 is connected to the other end thereof so that a writing voltage or a writing inhibition voltage can be applied, for example, to the one end and the other end from the first bit line L1 and the second bit line L2.

The memory cells C have the same configuration, and each of the memory cells C is of an N-channel type in which a semiconductor substrate is the P-type memory well PW2 and has a configuration in which a charge storage layer, an interlayer insulating layer, and a control gate are sequentially stacked on a channel region between the one end and the other end formed with predetermined spacing with a tunnel insulating layer interposed therebetween in the P-type memory well PW2 (semiconductor substrate). Thus, in the memory cells C, a charge is injected into the charge storage layer due to a voltage difference between a voltage applied between the one end and the other end and a voltage applied to the control gate so that data can be written, or the charge stored in the charge storage layer is extracted so that data can be erased.

In addition to this, in the non-volatile semiconductor memory device 1, a first MOS power supply line VL1 and a second MOS power supply line VL2 are provided to run parallel to each other in the column direction, and a first control voltage of 12[V] is applied to the first MOS power supply line VL1 while a second control voltage of 0[V] is applied to the second MOS power supply line VL2. A plurality of inverter circuits 11 are provided with predetermined spacing in the column direction on the first MOS power supply line VL1 and the second MOS power supply line VL2. A common PMOS control line PGa (PGb, PGc, PGd) extending in the row direction and a common NMOS control line NGa (NGb, NGc, NGd) paired with the common PMOS control line PGa (PGb, PGc, PGd) and similarly extending in the row direction are connected to an output portion of each of the inverter circuits 11.

The common PMOS control line PGa (PGb, PGc, PGd) extends to intersect all the unit columns 2, and is connected to each of the gates of the PMOS switches 8a and 8b (8c and 8d, ...) arranged in the same row in the unit columns 2 so that an output from the inverter circuit 11 can be uniformly applied to the gates of all the PMOS switches 8a and 8b (8c and 8d, ...) arranged in the same row. Thus, the PMOS switches 8a and 8b connected to the common PMOS control line PGa, for example, are turned on or off, respectively, due to voltage differences between the common PMOS control line PGa and the first power supply lines 5a and 5b so that the first power supply lines 5a and 5b and the word line 15 can be electrically connected to each other during an ON operation.

On the other hand, the common NMOS control line NGa (NGb, NGc, NGd) also extends to intersect all the unit columns 2, and is connected to respective gates of the NMOS switches 9a and 9b (9c and 9d, ...) arranged in the same row in the unit columns 2 so that the output from the inverter circuit 11 can be uniformly applied to the gates of all the NMOS switches 9a and 9b (9c and 9d, ...) arranged in the same row. Thus, the NMOS switches 9a and 9b connected to the common NMOS control line NGa, for example, are turned on or off, respectively, due to voltage differences between the common NMOS control line NGa and the second power supply lines 6a and 6b so that the second power supply lines 6a and 6b and the word line 15 can be electrically connected to each other during an ON operation.

That is, in the non-volatile semiconductor memory device 1, the PMOS switches 8a, 8b, 8c, and 8d and the NMOS switches 9a, 9b, 9c, and 9d are turned on or off so that values of the voltages applied to the memory cells C can be adjusted by applying outputs of the first power supply lines 5a and 5b and the second power supply lines 6a and 6b to the predetermined word line 15. By such adjustment, in the non-volatile semiconductor memory device 1, data can be written by storing, among the plurality of memory cells C arranged in a matrix in each of the P-type memory wells PW2, a charge only in the charge storage layer in the selected memory cell C1 in the P-type memory well PW2 in the first column, for example.

In the embodiment of the present invention, a state where the charge is stored in the charge storage layer in the selected memory cell C1 is a state where data is written, and a state where the charge is not stored in the charge storage layer is a state where data is erased. However, the present invention is not limited to this. A state where the charge is not stored in the charge storage layer in the selected memory cell C1 may be a state where data is written, and a state where the charge is stored in the charge storage layer may be a state where data is erased.

(1-2) Data Writing Operation

FIG. 1 illustrates respective values of the voltages applied to portions in the non-volatile semiconductor memory device 1 when the memory cell C arranged in the first row and the first column in the first unit column 2 among the plurality of unit columns 2 is taken as the selected memory cell C1 into which data is written and the memory cells C in all the other unit columns 2 are taken as the non-selected memory cells C2. For convenience of illustration, the unit column 2 in which the selected memory cell C1 is arranged is referred to as a selected unit column 2a, and the unit column 2 in which only the non-selected memory cells C2 are arranged is referred to as a non-selected unit column 2b. The power supply unit 4 in the selected unit column 2a is referred to as a selected power supply unit 4a, and the power supply unit 4 in the non-selected unit column 2b is referred to as a non-selected power supply unit 4b.

Furthermore, for the row in which a pair of the common PMOS control line PGa (PGb, PGc, PGd) and the common NMOS control line NGa (NGb, NGc, NGd) is arranged as a common wiring, the row in which the selected memory cell C1 is arranged is referred to as a selected row 3a, while the row in which only the non-selected memory cells C2 are arranged is referred to as a non-selected row 3b. After description is made by paying attention to a first area AR1 where the selected unit column 2a and the selected row 3a intersect each other, description is made by paying attention to a second area AR2 where the selected unit column 2a and the non-selected rows 3b intersect each other and a third area AR3 where the non-selected unit column 2b and the selected row 3a and the non-selected rows 3b intersect each other in this order.

(1-2-1) As to First Area

In this case, in the selected row 3a, the inverter circuit 11 applies the second control voltage of 0[V] on the second MOS power supply line VL2 as a common voltage to the common PMOS control line PGa and the common NMOS control line NGa. In the selected power supply unit 4a, a writing gate voltage (charge storage gate voltage) of 12[V] is applied as a unit voltage to the first power supply line 5a, while a writing inhibition gate voltage (charge storage inhibition gate voltage) of 0[V] is applied as a unit voltage to the second power supply line 6a. In the selected unit column 2a, 12[V], which is the same as a value of the voltage applied to the first power supply line 5a, is applied to the N-type well NW1 in which the first power supply line 5a is formed, while 0[V], which is the same as a value of the voltage applied to the second power supply line 6a, is applied to the P-type well PW1 in which the second power supply line 6a is formed.

Thus, the PMOS switch 8a arranged in the selected row 3a in the selected unit column 2a is turned on when the second control voltage of 0[V] is applied to the gate from the common PMOS control line PGa and the writing gate voltage of 12[V] is applied to the source from the first power supply line 5a so that the writing gate voltage of 12[V] can be applied from the drain to the selected word line (the word line 15a to which the selected memory cell C1 is connected).

On the other hand, in the selected row 3a in the selected unit column 2a, the NMOS switch 9a paired with the PMOS switch 8a is turned off when the second control voltage of 0[V] is applied to the gate from the common NMOS control line NGa and the writing inhibition gate voltage of 0[V] is applied to the source from the second power supply line 6a so that the writing inhibition gate voltage of 0[V] can be interrupted. Thus, the writing gate voltage of 12[V] can be applied to the selected word line 15a in the first area AR1 via the PMOS switch 8a.

In the selected unit column 2a, 0[V] is applied to the P-type memory well PW2 and a writing voltage of 0[V] is applied to the selected first bit line L1a and the selected second bit line L2a. Thus, to the selected memory cell C1 connected to the selected first bit line L1a and the selected second bit line L2a, the writing gate voltage of 12[V] can be applied to the control gate from the PMOS switch 8a via the selected word line 15a, and the writing voltage of 0[V] can be applied to the one end and the other end from the selected first bit line L1a and the selected second bit line L2a. Thus, in the selected memory cell C1, a value of the voltage applied to the control gate becomes significantly larger than a value of the voltage applied to the channel region. As a result, a quantum tunnel effect is produced so that a charge can be injected into the charge storage layer from the channel region.

On the other hand, in the non-selected memory cell C2 in the first area AR1, the writing gate voltage of 12[V] is applied to the control gate from the PMOS switch 8a via the selected word line 15a while a writing inhibition voltage of 6[V] is applied to the one end and the other end from the non-selected first bit line L1b and the non-selected second bit line L2b. Thus, a voltage difference occurring between the control gate and the channel region becomes small. As a result, a quantum tunnel effect is not produced so that no charge can be injected into the charge storage layer from the channel region. Thus, in the first area AR1, the PMOS switch 8a is turned on, to apply a high writing gate voltage to the selected word line 15a so that a charge can be injected into the charge storage layer in the selected memory cell C1 connected to the selected word line 15a.

(1-2-2) As to Second Area

Description is made below by paying attention to the second area AR2 where the selected unit column 2a and the non-selected rows 3b intersect each other. In the non-selected row 3b in which only the non-selected memory cells C2 are arranged, the inverter circuit 11 applies the first control voltage of 12[V] on the first MOS power supply line VL1 as a common voltage to the common PMOS control line PGb (PGc, PGd) and the common NMOS control line NGb (NGc, NGd). Thus, the PMOS switch 8c arranged in the non-selected row 3b in the selected unit column 2a, for example, is turned off when the first control voltage of 12[V] is applied to the gate from the common PMOS control line PGb and the writing gate voltage of 12[V] is applied to the source from the first power supply line 5a so that the writing gate voltage of 12[V] can be interrupted.

On the other hand, the NMOS switch 9c paired with the PMOS switch 8c in the non-selected row 3b in the selected unit column 2a is turned on when the first control voltage of 12[V] is applied to the gate from the common NMOS control line NGb and the writing inhibition gate voltage of 0[V] is applied to the source from the second power supply line 6a so that the writing inhibition gate voltage of 0[V] can be applied to the non-selected word line (the word line 15 to which only the non-selected memory cells C2 are connected) 15c in the second area AR2. Thus, the writing inhibition gate voltage of 0[V] can be applied to the non-selected word line 15c in the second area AR2 via the NMOS switch 9c.

Thus, in the second area AR2, in the non-selected memory cell C2 connected to the selected first bit line L1a and the selected second bit line L2a, a writing voltage of 0[V] is applied to the one end and the other end from the selected first bit line L1a and the selected second bit line L2a while a writing inhibition gate voltage of 0[V] is applied to the control gate from the non-selected word line 15c via the NMOS switch 9c. Thus, the control gate and the channel region have the same voltage. As a result, a quantum tunnel effect is not produced so that no charge can be injected into the charge storage layer from the channel region.

In the second area AR2, even in the non-selected memory cell C2 connected to the non-selected first bit line L1b and the non-selected second bit line L2b, the writing inhibition gate voltage of 0[V] is applied to the control gate from the non-selected word line 15c via the NMOS switch 9c, and the writing inhibition voltage of 6[V] is applied to the one end and the other end from the non-selected first bit line L1b and the non-selected second bit line L2b. Thus, a voltage difference occurring between the control gate and a channel region becomes small. As a result, a quantum tunnel effect is not produced so that no charge can be injected into a charge storage layer from the channel region. Thus, in the second area AR2, the NMOS switch 9c is turned on, to apply a low writing inhibition gate voltage to the non-selected word line 15c so that no charge is injected into the charge storage layer in the non-selected memory cell C2 connected to the non-selected word line 15c.

(1-2-3) As to Third Area

Next, description is made below by paying attention to the third area AR3 in the non-selected unit column 2b. In this case, in the non-selected power supply unit 4b, a writing inhibition gate voltage (charge storage inhibition gate voltage) of 6[V] is applied to the first power supply line 5b and the second power supply line 6b. In this non-selected unit column 2b, 12[V] is applied to an N-type well NW1 in which the first power supply line 5b is formed, while 0[V] is applied to a P-type well PW1 in which the second power supply line 6b is formed. In the selected row 3a in the non-selected unit column 2b, the inverter circuit 11 applies the second control voltage of 0[V] on the second MOS power supply line VL2 to the common PMOS control line PGa and the common NMOS control line NGa.

Thus, the PMOS switch 8b in the selected row 3a in the non-selected unit column 2b is turned on when the second control voltage of 0[V] is applied to the gate from the common PMOS control line PGa and the writing inhibition gate voltage of 6[V] is applied to the source from the first power supply line 5b so that the writing inhibition gate voltage of 6[V] can be applied from the drain to the non-selected word line 15b.

On the other hand, in the selected row 3a in the non-selected unit column 2b, the NMOS switch 9b paired with the PMOS switch 8b is turned off when the second control voltage of 0[V] is applied to the gate from the common NMOS control line NGa and the writing inhibition gate voltage of 6[V] is applied to the source from the second power supply line 6b so that the writing inhibition gate voltage of 6[V] can be interrupted. Thus, the writing inhibition gate voltage of 6[V] can be applied to the non-selected word line 15b arranged in the selected row 3a in the third area AR3 via the PMOS switch 8b.

In the non-selected unit column 2b, a writing inhibition voltage of 6[V] is applied to a non-selected first bit line L1c and a non-selected second bit line L2c. Thus, the non-selected memory cell C2 arranged in the selected row 3a in the third area AR3 has its control gate to which the writing inhibition gate voltage of 6[V] is applied from a non-selected word line 15b via the PMOS switch 8b, and has its one end and the other end to which the writing inhibition voltage of 6[V] is also applied from the non-selected first bit line L1c and the non-selected second bit line L2c. Thus, the control gate and a channel region have the same voltage. As a result, a quantum tunnel effect is not produced so that no charge can be injected into a charge storage layer from the channel region.

The non-selected row 3b in the third area AR3 will then be paid attention to. In this case, in the non-selected row 3b, the inverter circuit 11 applies the first control voltage of 12[V] on the first MOS power supply line VL1 to the common PMOS control line PGb and the common NMOS control line NGb. Thus, the PMOS switch 8d in the non-selected row 3b in the non-selected unit column 2b is turned off when the first control voltage of 12[V] is applied to the gate from the common PMOS control line PGb and the writing inhibition gate voltage of 6[V] is applied to the source from the first power supply line 5b so that the writing inhibition gate voltage of 6[V] can be interrupted.

On the other hand, in the non-selected row 3b in the non-selected unit column 2b, the NMOS switch 9d paired with the PMOS switch 8d is turned on when the first control voltage of 12[V] is applied to the gate from the common NMOS control line NGb and the writing inhibition gate voltage of 6[V] is applied to the source from the second power supply line 6b so that the writing inhibition gate voltage of 6[V] can be applied from the drain to a non-selected word line 15d. Thus, the writing inhibition gate voltage of 6[V] can be applied to the non-selected word line 15d arranged in the non-selected row 3b in the third area AR3 via the NMOS switch 9d.

Thus, in the non-selected memory cell C2 arranged in the non-selected row 3b in the third area AR3, the wiring inhibition gate voltage of 6[V] is applied to the control gate from the NMOS switch 9d via the non-selected word line 15d, and a wiring inhibition voltage of 6[V] is applied to the one end and the other end from the non-selected first bit line L1c and the non-selected second bit line L2c. Thus, the control gate and the channel region have the same voltage. As a result, a quantum tunnel effect is not produced so that no charge can be injected into the charge storage layer from the channel region.

Thus, in the non-selected power supply unit 4b, the first power supply line 5b and the second power supply line 6b, which are independent of the first power supply line 5a and the second power supply line 6a provided in the selected power supply unit 4a, are provided, and the writing inhibition gate voltage of 6[V] can be applied to the non-selected word lines 15b and 15d in the selected row 3a and the non-selected row 3b in the third area AR3 separately from the writing gate voltage of 12[V] applied to the adjacent first area AR1. Thus, in the third area AR3, without being constrained by the selected unit column 2a, all the writing inhibition gate voltage applied to the non-selected word lines 15b and 15d, the writing inhibition voltage applied to the non-selected first bit line L1c and the non-selected second bit line L2c, and a voltage applied to the P-type memory well PW2 can be set to the same voltage of 6[V].

(1-3) Operation and Effect

In the above-mentioned configuration, the non-volatile semiconductor memory device 1 includes the plurality of word lines 15 formed in a matrix, the plurality of memory cells C connected to the respective word lines 15, the first bit lines L1 and the second bit lines L2 each capable of applying a selective voltage to the plurality of memory cells C, and the plurality of power supply units 4 provided to respectively correspond to word line columns. The pair of the PMOS switch 8a (8b, 8c, 8d, . . . ) and the NMOS switch 9a (9b, 9c, 9d, . . . ) is provided for each of the word lines 15 in each of the power supply units 4.

In the non-volatile semiconductor memory device 1, the common PMOS control lines PGa to PGd and the common NMOS control lines NGa to NGd are provided in units of word line rows, the first PMOS control voltage or the second PMOS control voltage is applied to the PMOS switches 8a and 8b (8c and 8d) in the same row via the common PMOS control line PGa (PGb), and the first NMOS control voltage or the second NMOS control voltage is applied to the NMOS switches 9a and 9b (9c and 9d) in the same row via the common NMOS control line NGa (NGb).

Furthermore, in the non-volatile semiconductor memory device 1, the first power supply lines 5a and 5b to which the writing gate voltage or the writing inhibition gate voltage is applied and the second power supply lines 6a and 6b to which the writing inhibition gate voltage is applied are respectively provided for the power supply units 4, the first power supply lines 5a and 5b are connected to the word lines 15, respectively, via the PMOS switches 8a, 8c, . . . (8b, 8d, . . . ), and the second power supply lines 6a and 6b are connected to the word lines 15, respectively, via the NMOS switches 9a, 9c, . . . (9b, 9d, . . . ).

In the non-volatile semiconductor memory device 1, the PMOS switches 8a, 8c, . . . (8b, 8d, . . . ) are respectively turned on or off due to voltage differences between the common PMOS control lines PGa to PGd and the first power supply line 5a (5b) for each of the power supply units 4 during data writing while the NMOS switches 9a, 9c, . . . (9b, 9d, . . . ) are respectively turned on or off due to voltage differences between the common NMOS control lines NGa to NGd and the second power supply line 6a (6b), to individually apply a writing gate voltage or a writing inhibition gate voltage for each of the P-type memory wells PW2. Thus, in the non-volatile semiconductor memory device 1, without being constrained by a voltage applied to the one word line column, a value of the wiring inhibition gate voltage, a value of the voltage applied to the P-type memory well PW2 at that time, and values of the voltages applied to the non-selected first bit line L1c and the non-selected second bit line L2c can be respectively freely set to voltage values at which occurrence of disturbance can be suppressed in the non-selected memory cell C2, for example, in the other word line column.

To summarize an operation of a switching mechanism below, in the selected power supply unit 4a to which the selected word line 15a on which the selected memory cell C1 exists is connected among the power supply units 4, the NMOS switch 9a having the source to which a writing inhibition gate voltage (charge storage inhibition gate voltage) is applied from the second power supply line 6a is turned off and the PMOS switch 8a having the source to which a writing gate voltage (charge storage gate voltage) is applied from the first power supply line 5a is turned on, to apply a writing gate voltage (charge storage gate voltage) to the selected word line 15a from the drain of the PMOS switch 8a.

In the selected power supply unit 4a to which the selected word line 15a on which the selected memory cell C1 exists is connected among the power supply units 4, when a writing inhibition gate voltage (charge storage inhibition gate voltage) is applied to the non-selected word line 15c on which only the non-selected memory cells C2 are arranged, the PMOS switch 8c having the source to which a writing gate voltage (charge v gate voltage) is applied from the first power supply line 5a is turned off and the NMOS switch 9c having the source to which a writing inhibition gate voltage (charge storage inhibition gate voltage) is applied from the second power supply line 6a is turned on, to apply a writing inhibition gate voltage (charge storage inhibition gate voltage) to the non-selected word line 15c from the drain of the NMOS switch 9c.

In the non-selected power supply unit 4b having only the non-selected word line on which only the non-selected memory cells C2 are arranged among the power supply units 4, when the PMOS switch 8b, sharing the common PMOS control line PGa with the PMOS switch 8a, which applies a writing gate voltage (charge storage gate voltage) to the selected word line 15a in the power supply unit 4 in the other column, exists, the PMOS switch 8b is turned on, and the NMOS switch 9b paired with the PMOS switch 8b is turned off, to apply a writing inhibition gate voltage (charge storage inhibition gate voltage), which has been applied to the source of the PMOS switch 8b from the first power supply line 5b, to the non-selected word line 15b from the drain of the PMOS switch 8b.

In the non-selected power supply unit 4b having only the non-selected word line on which only the non-selected memory cells C2 are arranged among the power supply units 4, when the NMOS switch 9d, sharing the common NMOS control line NGb with the NMOS switch 9c, which applies a writing inhibition gate voltage (charge storage inhibition gate voltage) to the non-selected word line 15c in the power supply unit 4 in the other column, exists, the NMOS switch 9d is turned on, and the PMOS switch 8d paired with the NMOS switch 9d is turned off, to apply a writing inhibition gate voltage (charge storage inhibition gate voltage), which has been applied to the source of the NMOS switch 9d from the second power supply line 6b, to the non-selected word line 15d from the drain of the NMOS switch 9d. Thus, in the non-volatile semiconductor memory device 1, a charge can be stored in only the memory cell C at a predetermined position.

In the present embodiment, in the non-selected power supply unit 4b, the writing inhibition gate voltage applied to each of the non-selected word lines 15b and 15d in the non-selected unit column 2b can be set to a low voltage of 6[V] without being constrained by the writing gate voltage of 12[V] applied to the selected word line 15a in the selected unit column 2a, for example, and all the value of the voltage applied to the P-type memory well PW2 and the values of the voltages applied to the non-selected first bit line L1c and the non-selected second bit line L2c can further be set to the same voltage of 6[V] in the non-selected unit column 2b. Even if an operation for writing data into the selected memory cell C1 in the selected unit column 2a is repeated, therefore, occurrence of disturbance can be suppressed without affecting each of the non-selected memory cells C2 in the non-selected unit column 2b.

In the non-volatile semiconductor memory device 1, the first power supply lines 5a and 5b and the second power supply lines 6a and 6b are individually provided as a unit wiring, respectively, for the power supply units 4. However, the power supply units 4 are connected to each other via the common PMOS control lines PGa to PGd and the common NMOS control lines NGa to NGd. The voltage values applied to the common PMOS control lines PGa to PGd and the common NMOS control lines NGa to NGd are adjusted to turn on or off the PMOS switches 8a, 8c, . . . (8b, 8d, . . . ) and the NMOS switches 9a, 9c, . . . (9b, 9d, . . . ) so that the selected word line 15a can be selectively determined from among all the word lines 15. Thus, the non-volatile semiconductor memory device 1 can be miniaturized, like in the conventional technique, because independent row-direction address decoders need not be respectively provided for the word line columns (for the P-type memory wells PW2).

Figure 2:
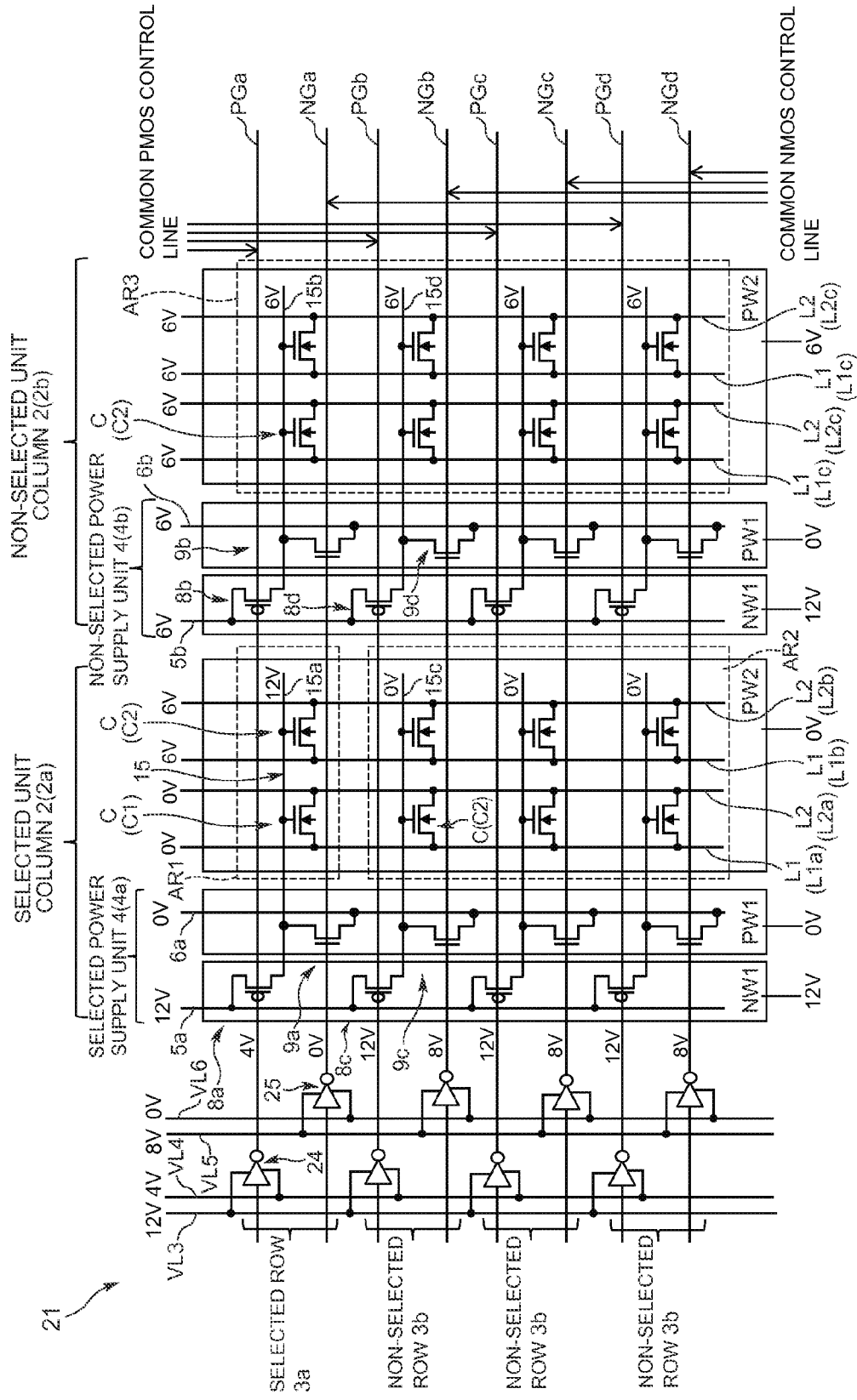
FIG. 2 is a circuit diagram illustrating a circuit configuration of a non-volatile semiconductor memory device according to a second embodiment and respective values of voltages applied to portions during data writing.

(2) Second Embodiment
(2-1) Data Writing Operation
In FIG. 2 illustrating portions corresponding to those illustrated in FIG. 1 with the same symbols respectively assigned thereto, reference numeral 21 denotes a non-volatile semiconductor memory device according to a second embodiment, which differs from the above-mentioned non-volatile semiconductor memory device 1 according to the first embodiment in that a first PMOS power supply line VL3 and a second PMOS power supply line VL4 and a first NMOS power supply line VL5 and a second NMOS power supply line VL6 are provided instead of the first MOS power supply line VL1 and the second MOS power supply line VL2 illustrated in FIG. 1. In practice, the non-volatile semiconductor memory device 21 has a configuration in which the first PMOS power supply line VL3 and the second PMOS power supply line VL4 extend in a column direction and the first NMOS power supply line VL5 and the second NMOS power supply line VL6 also extend in the column direction to run parallel to the first PMOS power supply line VL3 and the second PMOS power supply line VL4.

A plurality of first inverter circuits 24 are connected to the first PMOS power supply line VL3 and the second PMOS power supply line VL4, and only common PMOS control lines PGa, PGb, PGc, and PGd are respectively connected to output portions of the first inverter circuits 24. The first inverter circuits 24 can each select either one of a first PMOS control voltage applied to the first PMOS power supply line VL3 and a second PMOS control voltage applied to the second PMOS power supply line VL4 for each row and respectively apply the selected control voltage to the common PMOS control lines PGa, PGb, PGc, and PGd.

A plurality of second inverter circuits 25 are also connected to the first NMOS power supply line VL5 and the second NMOS power supply line VL6, and only common NMOS control lines NGa, NGb, NGc, and NGd are respectively connected to output portions of the second inverter circuits 25. The second inverter circuits 25 can each select either one of a first NMOS control voltage applied to the first NMOS power supply line VL5 and a second NMOS control voltage applied to the second NMOS power supply line VL6 for each row and respectively apply the selected control voltage to the common NMOS control lines NGa, NGb, NGc, and NGd.

FIG. 2 illustrates respective values of voltages applied to portions when a memory cell C in the first row and the first column in a first unit column 2 among a plurality of memory cells C is taken as a selected memory cell C1 into which data is written and the memory cells C in all other unit columns 2 are taken as non-selected memory cells C2, like in the above-mentioned first embodiment. In this case, a first PMOS control voltage of 12[V] is applied to the first PMOS power supply line VL3 while a second PMOS control voltage of 4[V] is applied to the second PMOS power supply line VL4. A first NMOS control voltage of 8[V] is applied to the first NMOS power supply line VL5 while a second NMOS control voltage of 0[V] is applied to the second NMOS power supply line VL6.

(2-1-1) As to First Area

After description is first made by paying attention to a first area AR1, a second area AR2 and a third area AR3 will be described in this order. In this case, in a selected power supply unit 4a in a selected unit column 2a, a writing gate voltage of 12[V] is applied as a unit voltage to a first power supply line 5a, and a writing inhibition gate voltage of 0[V] is applied as a unit voltage to the other second power supply line 6a. In this case, in a selected row 3a on which the selected memory cell C1 is arranged, the first inverter circuit 24 connected to the first PMOS power supply line VL3 and the second PMOS power supply line VL4 applies a second PMOS control voltage of 4[V] on the second PMOS power supply line VL4 as a common voltage to the common PMOS control line PGa.

Thus, a PMOS switch 8a arranged in the selected row 3a in the selected unit column 2a is turned on when the second PMOS control voltage of 4[V] is applied to its gate from the common PMOS control line PGa and the writing gate voltage of 12[V] is applied to its source from the first power supply line 5a so that the writing gate voltage of 12[V] can be applied from its drain to a selected word line 15a.

In the selected unit column 2a, a writing voltage of 0[V] is applied to a selected first bit line L1a and a selected second bit line L2a connected to the selected memory cell C1, and a writing inhibition voltage of 6[V] is applied to the non-selected first bit line L1b and the non-selected second bit line L2b to which the non-selected memory cell C2 is connected. Thus, in the first area AR1, the selected memory cell C1 connected to the selected first bit line L1a and the selected second bit line L2a has its one end and the other end to which the writing voltage of 0[V] is applied from the selected first bit line L1a and the selected second bit line L2a and has its control gate to which a writing gate voltage of 12[V] is applied from the selected word line 15a via the PMOS switch 8a. Thus, a voltage difference occurring between the control gate and a channel region becomes large. As a result, a quantum tunnel effect is produced so that a charge can be injected into a charge storage layer from the channel region.

On the other hand, in the first area AR1, the non-selected memory cell C2 connected to the non-selected first bit line L1b and the non-selected second bit line L2b has its control gate to which the writing gate voltage of 12[V] is applied from the selected word line 15a via the PMOS switch 8a while having its one end and the other end to which the writing inhibition voltage of 6[V] is applied from the non-selected first bit line L1b and the non-selected second bit line L2b. Thus, a voltage difference occurring between the control gate and a channel region becomes small. As a result, a quantum tunnel effect is not produced so that no charge can be injected into a charge storage layer from the channel region.

In this case, in the selected row 3a, the second inverter circuit 25 connected to the first NMOS power supply line VL5 and the second NMOS power supply line VL6 applies the second NMOS control voltage of 0[V] on the second NMOS power supply line VL6 as a common voltage to the common NMOS control line NGa. Thus, an NMOS switch 9a arranged in the selected row 3a in the selected unit column 2a is turned off when the second NMOS control voltage of 0[V] is applied to its gate from the common NMOS control line NGa and a writing inhibition gate voltage of 0[V] is applied to its one end from the second power supply line 6a so that the writing inhibition gate voltage can be interrupted. Thus, the writing gate voltage of 12[V] can be applied to the selected word line 15a in the first area AR1 via the PMOS switch 8a, as described above.

Thus, the non-volatile semiconductor memory device 21 according to the second embodiment can set a voltage difference between the second PMOS control voltage (4[V]) applied to the gate and the writing gate voltage (12[V]) applied to the source in the PMOS switch 8a to 8[V] or less, which is lower than that in the first embodiment, when the PMOS switch 8a is turned on in the selected row 3a in the selected unit column 2a.

(2-1-2) As to Second Area

The second area AR2 including non-selected rows 3b in the selected unit column 2a is then paid attention to. In this case, in the non-selected row 3b on which only the non-selected memory cells C2 are arranged, the first inverter circuit 24 applies a first PMOS control voltage of 12[V] on the first PMOS power supply line VL3 as a common voltage to the common PMOS control lines PGb, PGc, and PGd. Thus, a PMOS switch 8c arranged in the non-selected row 3b in the selected unit column 2a is turned off when the first PMOS control voltage of 12[V] is applied to its gate from the common PMOS control line PGb and a writing gate voltage of 12[V] is applied to its source from the first power supply line 5a so that the writing gate voltage can be interrupted.

In this case, in the non-selected row 3b, the second inverter circuit 25 applies a first NMOS control voltage of 8[V] on the first NMOS power supply line VL5 as a common voltage to the common NMOS control lines NGb, NGc, and NGd. Thus, an NMOS switch 9c arranged in the non-selected row 3b in the selected unit column 2a is turned on when the first NMOS control voltage of 8[V] is applied to its gate from the common NMOS control line NGb and a writing inhibition gate voltage of 0[V] is applied to its source from the second power supply line 6a so that the writing inhibition gate voltage of 0[V] can be applied from its drain to a non-selected word line 15c.

Thus, the non-volatile semiconductor memory device 21 according to the second embodiment can set a voltage difference between the first NMOS control voltage (8[V]) applied to the gate and the writing inhibition gate voltage (0[V]) applied to the source in the NMOS switch 9c to 8[V] or less, which is lower than that in the first embodiment, when the NMOS switch 9c is turned on in the non-selected row 3b in the selected unit column 2a.

In the second area AR2, the non-selected memory cell C2 connected to the selected first bit line L1a and the selected second bit line L2a has its one end and the other end to which the writing voltage of 0[V] is applied from the selected first bit line L1a and the selected second bit line L2a while having its control gate to which the writing inhibition gate voltage of 0[V] is also applied from the non-selected word line 15c via the NMOS switch 9c. Thus, the control gate and a channel region have the same voltage. As a result, a quantum tunnel effect is not produced so that no charge can be injected into a charge storage layer from the channel region.

In the second area AR2, the non-selected memory cell C2 connected to the non-selected first bit line L1b and the non-selected second bit line L2b has its one end and the other end to which the writing inhibition voltage of 6[V] is also applied from the non-selected first bit line L1b and the non-selected second bit line L2b and has its control gate to which the writing inhibition gate voltage of 0[V] is applied from the non-selected word line 15c via the NMOS switch 9c. Thus, a voltage difference occurring between the control gate and a channel region becomes small. As a result, a quantum tunnel effect is not produced so that no charge can be injected into a charge storage layer from the channel region.

(2-1-3) As to Third Area

The third area AR3 in a non-selected unit column 2b is then paid attention to. In this case, in a non-selected power supply unit 4b in the non-selected unit column 2b, a writing inhibition gate voltage of 6[V] is applied to a first power supply line 5b and a second power supply line 6b. In the selected row 3a, the first inverter circuit 24 applies the second PMOS control voltage of 4[V] on the second PMOS power supply line VL4 to the common PMOS control line PGa. Thus, a PMOS switch 8b arranged in the selected row 3a in the non-selected unit column 2b is turned on when the second PMOS control voltage of 4[V] is applied to its gate from the common PMOS control line PGa and the writing inhibition gate voltage of 6[V] is applied to its source from the first power supply line 5b so that the writing inhibition gate voltage can be applied from its drain to a non-selected word line 15b.

In the non-selected unit column 2b, a writing inhibition voltage of 6[V] is applied to a non-selected first bit line L1c and a non-selected second bit line L2c. Thus, a non-selected memory cell C2 arranged in the selected row 3a in the third area AR3 has its one end and the other end to which the writing voltage of 6[V] is applied from the non-selected first bit line L1c and the non-selected second bit line L2c and has its control gate to which a writing inhibition gate voltage of 6[V] is applied from the non-selected word line 15b via the PMOS switch 8b. Thus, the control gate and a channel region have the same voltage. As a result, a quantum tunnel effect is not produced so that no charge can be injected into a charge storage layer from the channel region.

An NMOS switch 9b arranged in the selected row 3a in the non-selected unit column 2b is turned off when the second NMOS control voltage of 0[V] is applied to its gate from the common NMOS control line NGa and the writing inhibition gate voltage of 6[V] is applied to its source from the second power supply line 6b so that the writing inhibition gate voltage can be interrupted. Thus, the writing inhibition gate voltage of 6[V] can be applied to the non-selected word line 15b arranged in the selected row 3a in the third area AR3 via the PMOS switch 8b.

On the other hand, in the non-selected rows 3b, the first inverter circuits 24 respectively apply the first PMOS control voltage of 12[V] on the first PMOS power supply line VL3 to the common PMOS control lines PGb, PGc, and PGd. Thus, a PMOS switch 8d arranged in the non-selected row 3b in the non-selected unit column 2b is turned off when the first PMOS control voltage of 12[V] is applied to its gate from the common PMOS control line PGb (PGc, PGd) and the writing inhibition gate voltage of 6[V] is applied to its source from the first power supply line 5b so that the writing inhibition gate voltage can be interrupted.

In this case, in the non-selected rows 3b, the second inverter circuits 25 respectively apply the first NMOS control voltage of 8[V] on the first NMOS power supply line VL5 to the common NMOS control lines NGb, NGc, and NGd. Thus, an NMOS switch 9d arranged in the non-selected row 3b in the non-selected unit column 2b is turned on when the first NMOS control voltage of 8[V] is applied to its gate from the common NMOS control line NGb (NGc, NGd) and the writing inhibition gate voltage of 6[V] is applied to its source from the second power supply line 6b so that the writing inhibition gate voltage can be applied to a non-selected word line 15d. Thus, the writing inhibition gate voltage of 6[V] can be applied to the non-selected word line 15d arranged in the non-selected row 3b in the third area AR3 via the NMOS switch 9d.

Thus, the non-selected memory cell C2 arranged in the non-selected row 3b in the third area AR3 has its one end and the other end to which a writing inhibition voltage of 6[V] is applied from the non-selected first bit line L1c and the non-selected second bit line L2c and has its control gate to which a writing inhibition gate voltage of 6[V] is applied from the non-selected word line 15d via the NMOS switch 9d. Thus, the control gate and a channel region have the same voltage. As a result, a quantum tunnel effect is not produced so that no charge can be injected into a charge storage layer from the channel region.

Thus, the non-volatile semiconductor memory device 21 according to the second embodiment can be brought into a state where data is written into only the selected memory cell C1 in the first selected unit column 2a among the plurality of memory cells C and data is not written into all the non-selected memory cells C2 in the other non-selected unit columns 2b.

An operation of a switching mechanism in the present embodiment is the same as that in the above-mentioned "(1) First Embodiment", and hence description thereof is not repeated.

(2-2) Data Erasure Operation

Figure 3:
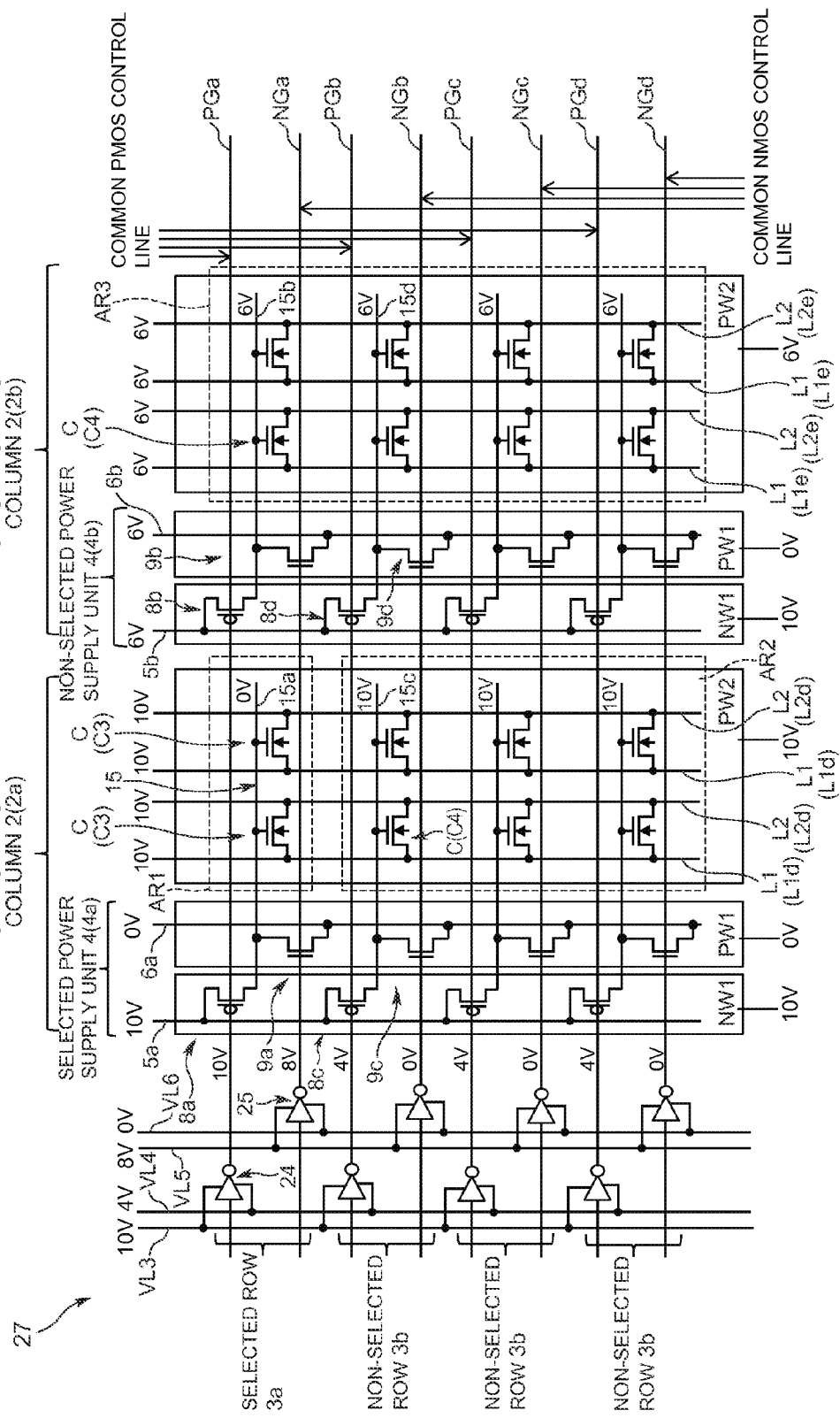
FIG. 3 is a circuit diagram illustrating a circuit configuration of a non-volatile semiconductor memory device according to the second embodiment and respective values of voltages applied to portions during a data erasure operation.

In this non-volatile semiconductor memory device 21, voltage application performed when data in the memory cell C is erased will be described below. FIG. 3 illustrating portions corresponding to those illustrated in FIG. 2 with the same symbols respectively assigned thereto illustrates a non-volatile semiconductor memory device 27 according to the second embodiment, which performs a data erasure operation, and illustrates respective values of the voltages applied to the portions when data in all memory cells C in a first area AR1 among a plurality of memory cells C are erased and data are not erased for all the other memory cells C. In this case, a first PMOS control voltage of 10[V], which differs from that during data writing, is applied to a first PMOS power supply line VL3 while the same second PMOS control voltage of 4[V] as that during data writing is applied to a second PMOS power supply line VL4. The same first NMOS control voltage of 8[V] as that during data writing is applied to a first NMOS power supply line VL5 while the same second NMOS control voltage of 0[V] as that during data writing is also applied to a second NMOS power supply line VL6.

(2-2-1) As to First Area

After description is first made by paying attention to the first area AR1, a second area AR2 and a third area AR3 will be described in this order. In this case, in a selected power supply unit 4a in a selected unit column 2a in which memory cells for which data is erased (hereinafter referred to as erasure memory cells) C3 are arranged, a non-erasure gate voltage of 10[V] is applied to a first power supply line 5a, and an erasure gate voltage of 0[V] is applied to the other second power supply line 6a. In this case, in a selected row 3a, a first inverter circuit 24 connected to the first PMOS power supply line VL3 and the second PMOS power supply line VL4 applies the first PMOS control voltage of 10[V] on the first PMOS power supply line VL3 to the common PMOS control line PGa. Thus, a PMOS switch 8a arranged in the selected row 3a in the selected unit column 2a is turned off when the first PMOS control voltage of 10[V] is applied to its gate from the common PMOS control line PGa and the non-erasure gate voltage of 10[V] is applied to its source from the first power supply line 5a so that the non-erasure gate voltage can be interrupted.

In the selected row 3a, a second inverter circuit 25 connected to the first NMOS power supply line VL5 and the second NMOS power supply line VL6 applies the first NMOS control voltage of 8[V] on the first NMOS power supply line VL5 to a common NMOS control line NGa. Thus, an NMOS switch 9a arranged in the selected row 3a in the selected unit column 2a is turned on when the first NMOS control voltage of 8[V] is applied to its gate from the common NMOS control line NGa and the erasure gate voltage of 0[V] is applied to its source from the second power supply line 6a so that the erasure gate voltage can be applied from its drain to a selected word line 15a. Thus, the erasure gate voltage of 0[V] can be applied to the selected word line 15a in the first area AR1 via the NMOS switch 9a during data erasure.

In the selected unit column 2a, 10[V] is applied to a P-type memory well PW2 in which the plurality of memory cells C are formed while an erasure voltage of 10[V] is applied to a selected first bit line L1d and a selected second bit line L2d. Thus, each of the erasure memory cells C3 in the first area AR1 has its control gate to which the erasure gate voltage of 0[V] can be applied from the selected word line 15a and has its one end and the other end to which the erasure voltage of 10[V] can be applied from the selected first bit line L1d and the selected second bit line L2d. Thus, each of the erasure memory cells C3 can erase data when a value of the voltage applied to the side of a channel region is significantly larger than a value of the voltage applied to the side of its control gate and a charge stored in a charge storage layer is drawn into the channel region having a high voltage and is extracted from the charge storage layer.

(2-2-2) As to Second Area

The second area AR2 including non-selected rows 3b in the selected unit column 2a is then paid attention to. In this case, in the non-selected rows 3b in which memory cells for which data is not erased (hereinafter referred to as non-erasure memory cells) C4 are arranged, the first inverter circuits 24 respectively apply the second PMOS control voltage of 4[V] on the second PMOS power supply line VL4 to common PMOS control lines PGb, PGc, and PGd. Thus, a PMOS switch 8c arranged in the non-selected row 3b in the selected unit column 2a is turned on when the second PMOS control voltage of 4[V] is applied to its gate from the common PMOS control line PGb and the non-erasure gate voltage of 10[V] is applied to its source from the first power supply line 5a so that the non-erasure gate voltage can be applied from its drain to the non-selected word line 15c.

Thus, the non-erasure memory cell C4 arranged in the second area AR2, to which the erasure voltage of 10 [V] is applied from the selected first bit line L1d and the selected second bit line L2d, has its control gate to which the non-erasure gate voltage of 10[V] is applied from the non-selected word line 15c via the PMOS switch 8c. Thus, the control gate and a channel region have the same voltage. As a result, no charge is extracted from a charge storage layer, and a charge state within the charge storage layer can be maintained.

In this case, in the non-selected rows 3b, the second inverter circuits 25 respectively apply the second NMOS control voltage of 0[V] on the second NMOS power supply line VL6 to the common NMOS control lines NGb, NGc, and NGd. Thus, each of NMOS switches 9c arranged in the non-selected rows 3b in the selected unit column 2a is turned off when the second NMOS control voltage of 0[V] is applied to its gate from the common NMOS control line NGb and the erasure gate voltage of 0[V] is applied to its source from the second power supply line 6a so that the erasure gate voltage of 0[V] can be interrupted. Thus, the non-erasure gate voltage of 10[V] can be applied to the non-selected word line 15c in the second area AR2 via the PMOS switch 8c during data erasure.

(2-2-3) As to Third Area

The third area AR3 in a non-selected unit column 2b is then paid attention to. In this case, in a non-selected power supply unit 4b in the non-selected unit column 2b, a non-erasure gate voltage of 6[V] is applied to each of the first power supply line 5b and the second power supply line 6b. In the selected row 3a, the first inverter circuit 24 applies the first PMOS control voltage of 10[V] on the first PMOS power supply line VL3 to the common PMOS control line PGa. Thus, a PMOS switch 8b arranged in the selected row 3a in the non-selected unit column 2b is turned off when the first PMOS control voltage of 10[V] is applied to its gate from the common PMOS control line PGa and the non-erasure gate voltage of 6[V] is applied to its source from the first power supply line 5a so that the non-erasure gate voltage can be interrupted.

At this time, in the selected row 3a, the second inverter circuit 25 applies the first PMOS control voltage of 8[V] on the first NMOS power supply line VL5 to the common NMOS control line NGa. Thus, an NMOS switch 9b arranged in the selected row 3a in the non-selected unit column 2b is turned on when the first NMOS control voltage of 8[V] is applied to its gate from the common NMOS control line NGa and the non-erasure gate voltage of 6[V] is applied to its source from the second power supply line 6b so that the non-erasure gate voltage can be applied from its drain to a non-selected word line 15b. Thus, the non-erasure gate voltage of 6[V] can be applied to the non-selected word line 15b arranged in the selected row 3a in the third area AR3 via the NMOS switch 9b during data erasure.

In the non-selected unit column 2b, a non-erasure voltage of 6[V] is applied to each of a non-selected first bit line L1e and a non-selected second bit line L2e. Thus, a non-erasure memory cell C4 arranged in the selected row 3a in the third area AR3 has its one end and the other end to which the non-erasure voltage of 6[V] can be applied from the non-selected first bit line L1e and the non-selected second bit line L2e and has its control gate to which a non-erasure gate voltage of 6[V] can be applied from the non-selected word line 15b via the NMOS switch 9b. Thus, in the non-erasure memory cell C4 arranged in the selected row 3a in the third area AR3, the control gate and a channel region have the same voltage. As a result, no charge is extracted from a charge storage layer, and a charge state within the charge storage layer can be maintained.

In this case, in the non-selected rows 3b, the first inverter circuits 24 respectively apply the second PMOS control voltage of 4[V] on the second PMOS power supply line VL4 to the common PMOS control lines PGb, PGc, and PGd. Thus, a PMOS switch 8d arranged in the non-selected row 3b in the non-selected unit column 2b is turned on when the second PMOS control voltage of 4[V] is applied to its gate from the common PMOS control line PGb and the non-erasure gate voltage of 6[V] is applied to its source from the first power supply line 5b so that the non-erasure gate voltage can be applied from its drain to a non-selected word line 15d.

Thus, the non-erasure memory cell C4 arranged in the non-selected row 3b in the third area AR3 has its one end and the other end to which the non-erasure voltage of 6[V] can be applied from the non-selected first bit line L1e and the non-selected second bit line L2e and has its control gate to which the non-erasure gate voltage of 6[V] can be applied from the non-selected word line 15d via the PMOS switch 8d. Thus, in the non-erasure memory cell C4 in the non-selected row 3b in the third area AR3, the control gate and a channel region have the same voltage. As a result, no charge is extracted from a charge storage layer, and a charge state within the charge storage layer can be maintained.

In this case, in the non-selected row 3b, the second inverter circuits 25 respectively apply the second NMOS control voltage of 0[V] on the second NMOS power supply line VL6 to the common NMOS control lines NGb, NGc, and NGd. Thus, each of NMOS switches 9d arranged in the non-selected rows 3b in the non-selected unit column 2b is turned off when the second NMOS control voltage of 0[V] is applied to its gate from the common NMOS control line NGb and the erasure gate voltage of 6[V] is applied to its source from the second power supply line 6b so that the erasure gate voltage can be interrupted. Thus, a non-erasure gate voltage of 6[V] can be applied to the non-selected word line 15d arranged in the non-selected row 3b in the third area AR3 via the PMOS switch 8d during data erasure. Thus, the non-volatile semiconductor memory device 27 can collectively erase only data in the erasure memory cells C3 arranged in the selected row 3a in the selected unit column 2a by adjusting respective values of the voltages applied to the portions.

(2-3) Operation and Effect

In the above-mentioned configuration, in the non-volatile semiconductor memory device 21, a similar effect to that in the above-mentioned first embodiment can also be obtained. That is, in the non-volatile semiconductor memory device 21, the writing inhibition gate voltage applied to the non-selected word lines 15b and 15d in the non-selected unit column 2b can also be set to 6[V] without being constrained by the writing gate voltage of 12[V] applied to the selected word line 15a in the selected unit column 2a, for example. Further, all a value of the voltage applied to the p-type memory well PW2 and values of the voltages applied to the non-selected first bit line L1c and the non-selected second bit line L2c can be set to the same voltage. Hence, even if an operation for writing data into the selected memory cell C1 in the selected unit column 2a is repeated, occurrence of disturbance in each of the non-selected memory cells C2 in the non-selected unit column 2b can be suppressed.

In the non-volatile semiconductor memory device 21, the first power supply lines 5a and 5b and the second power supply lines 6a and 6b are respectively individually provided for the power supply units 4. However, the common PMOS control lines PGa to PGd and the common NMOS control lines NGa to NGd connect the power supply units 4 to each other, and values of the voltages applied to the common PMOS control lines PGa to PGd and the common NMOS control lines NGa to NGd are adjusted, to turn on or off the PMOS switches 8a, 8c, . . . and 8b, 8d, . . . and the NMOS switches 9a, 9c, . . . and 9b, 9d, . . . in the power supply units 4 so that the selected word line 15a can be selectively determined from among the plurality of word lines 15. Thus, the non-volatile semiconductor memory device 21 can also be miniaturized, like in the conventional technique, because independent row-direction address decoders need not respectively be provided for the word line columns (P-type memory wells PW2).

In addition thereto, in the non-volatile semiconductor memory device 21 according to the second embodiment, the control voltage (first PMOS control voltage or second PMOS control voltage) applied to either one of the first PMOS control line VL3 and the second PMOS power supply line VL4 is applied to the PMOS switches 8a and 8b, 8c and 8d, . . . , respectively, via the common PMOS control lines PGa to PGd. Aside from this, the control voltage (first NMOS control voltage or second NMOS control voltage) applied to either one of the first NMOS power supply line VL5 and the second NMOS power supply line VL6 is applied to the NMOS switches 9a and 9b, 9c and 9d, . . . , respectively, via the common NMOS control lines NGa to NGd.

Thus, in the non-volatile semiconductor memory device 21, a control voltage required to turn or off the NMOS switches 9a, 9b, 9c, 9d, . . . can be freely set without being constrained by a control voltage required to turn on or off the PMOS switches 8a, 8b, 8c, 8d, . . . during data writing by separating power supply systems applied to the PMOS switches 8a, 8b, 8c, 8d, . . . and the NMOS switches 9a, 9b, 9c, 9d, . . . . Thus, a maximum voltage difference between the control voltages respectively required to turn on or off the PMOS switches 8a, 8b, 8c, 8d, . . . and the NMOS switches 9a, 9b, 9c, 9d can be set to 8[V] or less that is smaller than that in the first embodiment.

In the non-volatile semiconductor memory device 1 according to the first embodiment illustrated in FIG. 1, there is a voltage difference of 12[V](12[V]/0[V]) with a full amplitude between the common PMOS control lines PGa to PGd and the common NMOS control lines NGa to NGd during data writing and during data erasure, for example. Thus, in the PMOS switches 8a, 8b, 8c, 8d, . . . and the NMOS switches 9a, 9b, 9c, 9d, . . . , a breakdown voltage structure for the voltage difference of 12[V] is also required. More specifically, the PMOS switches 8a, 8b, 8c, 8d, . . . and the NMOS switches 9a, 9b, 9c, 9d, . . . each having a gate insulating film the film thickness of which is set to 18[nm] or more need to also be used when an allowable electric field of the gate insulating film is set to 7[MV/cm], for example.

On the other hand, in the non-volatile semiconductor memory device 21 illustrated in FIG. 2, a maximum voltage difference occurring when the PMOS switches 8a, 8b, 8c, 8d, . . . and the NMOS switches 9a, 9b, 9c, 9d, . . . are respectively turned on or off during data writing and data erasure can be set to 8[V] or less. Thus, the PMOS switches 8a, 8b, 8c, 8d, . . . and the NMOS switches 9a, 9b, 9c, 9d, . . . each having a gate insulating film the thickness of which is decreased to 12[nm] can be used.

At the same time, the non-volatile semiconductor memory device 21 can have a transistor structure in which a voltage difference between voltages respectively applied to a circuit for driving the first PMOS power supply line VL3 and the second PMOS power supply line VL4 and a circuit for driving the first NMOS power supply line VL5 and the second NMOS power supply line VL6 becomes 8[V] or less and the film thickness of a gate insulating film is also decreased for a peripheral circuit, like for the PMOS switches 8a, 8b, 8c, 8d, . . . and the NMOS switches 9a, 9b, 9c, 9d, . . . .

On the other hand, in each of the NMOS switches 9a, 9b, 9c, 9d, . . . , the drain connected to the word line 15 having a maximum voltage amplitude of 12[V](writing gate voltage 12[V]−minimum writing inhibition gate voltage 0[V]=maximum voltage amplitude 12[V]) requires a breakdown voltage structure of 12[V], although an electric field between the control gate and the channel region is suppressed. Thus, in each of the NMOS switches 9a, 9b, 9c, 9d, . . . , a transistor, having its drain to which the word line 15 is connected, provided with a high breakdown voltage structure, is used, although a thin film transistor can be adopted (this will be described later in "(11) As to Breakdown Voltage Structure of NMOS switch").

In the non-selected power supply unit 4b, 12[V] is applied to an N-type well NW1 in which the PMOS switches 8b, 8d, . . . are formed during data writing. However, a voltage difference occurring between the drains of the PMOS switches 8b, 8d, . . . and the N-type well NW1 is set to a relatively small value of 6[V] by applying a slightly higher writing inhibition gate voltage of 6[V] to each of the non-selected word lines 15b, 15d, . . . connected to the drains of the PMOS switches 8b, 8d, . . . . Accordingly, voltage loads on the PMOS switches 8b, 8d, . . . are further reduced so that reliabilities of the PMOS switches 8b, 8d, . . . can be improved.

(3) Third Embodiment (3-1) Data Writing Operation

Figure 4:
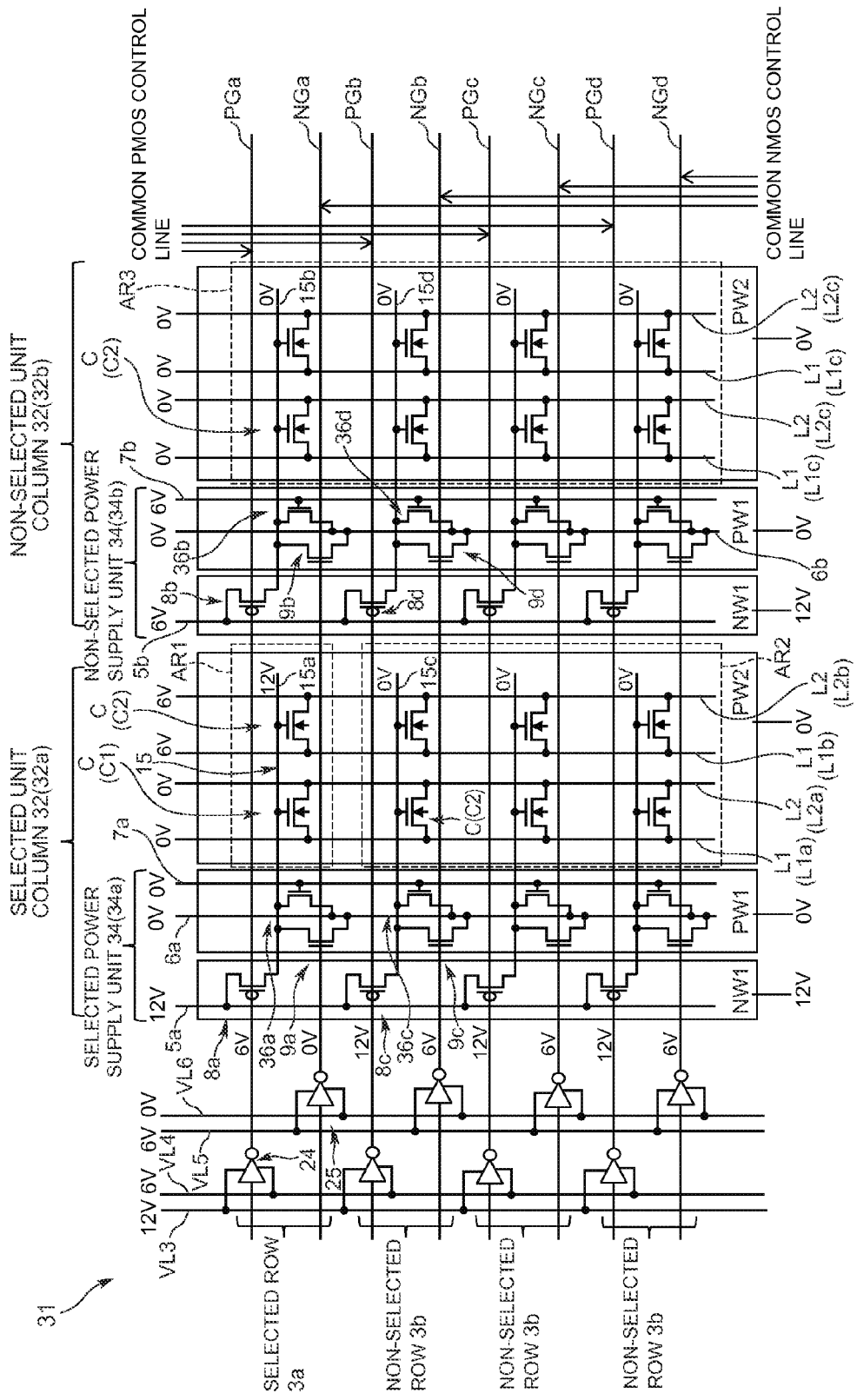
FIG. 4 is a circuit diagram illustrating a circuit configuration of a non-volatile semiconductor memory device according to a third embodiment and respective values of voltages applied to portions during data writing.

In FIG. 4 illustrating portions corresponding to those illustrated in FIG. 2 with the same symbols respectively assigned thereto, reference numeral 31 denotes a non-volatile semiconductor memory device according to a third embodiment, which differs from the non-volatile semiconductor memory device 21 according to the above-mentioned second embodiment in that auxiliary NMOS switches 36a, 36c, . . . (36b, 36d, . . . ) are provided for each row in each of power supply units 34 in addition to PMOS switches 8a, 8c, . . . (8b, 8d, . . . ) and NMOS switches 9a, 9c, . . . (9b, 9d, . . . ), and the auxiliary NMOS switches 36b, 36d, . . . respectively apply a writing inhibition gate voltage of 0[V] to non-selected word lines 15b, 15d, . . . in a non-selected unit column 32b during data writing.

The non-volatile semiconductor memory device 31 according to the third embodiment has such a configuration so that a maximum voltage difference between control voltages respectively required to turn on or off the PMOS switches 8a, 8c, . . . (8b, 8d, . . . ) and the NMOS switches 9a, 9c, . . . (9b, 9d, . . . ) can be set to 6[V] or less that is much lower than that in the second embodiment.

FIG. 4 illustrates respective values of voltages applied to portions when a memory cell C in the first row and the first column in a first unit column 32 among a plurality of memory cells C is taken as a selected memory cell C1 into which data is written and memory cells C in all other unit columns 32 are taken as non-selected memory cells C2 like in the above-mentioned non-volatile semiconductor memory device 21 according to the second embodiment. In this case, a first PMOS control voltage of 12[V] is applied, like in the above-mentioned second embodiment, to a first PMOS power supply line VL3 while a second PMOS control voltage of 6[V], which is higher than that in the above-mentioned second embodiment, is applied to a second PMOS power supply line VL4. A voltage difference between the first PMOS control voltage and the second PMOS control voltage is 6[V] that is smaller than that in the above-mentioned second embodiment.

Thus, to common PMOS control lines PGa to PGd each connected to the first PMOS power supply line VL3 and the second PMOS power supply line VL4 via a first inverter circuit 24, the first PMOS control voltage of 12[V] is applied by the first inverter circuit 24 in non-selected rows 3b while the second PMOS control voltage of 6[V] is applied by the first inverter circuit 24 in a selected row 3a. Thus, a voltage amplitude between the voltage applied to the common PMOS control line PGa in the selected row 3a and the voltages applied to the common PMOS control lines PGb to PGd in the non-selected rows 3b is set to 6[V](i.e., 12[V]−6[V]) so that the voltage amplitude can be reduced. Thus, the voltage amplitude between the voltages at gates of the PMOS switches 8a, 8c, . . . (8b, 8d, . . . ) respectively connected to the common PMOS control lines PGa to PGd in the selected row 3a and the non-selected rows 3b can be reduced. Accordingly, a gate insulating film can further be thinned.

On the other hand, a second NMOS control voltage of 0[V] is applied, like in the above-mentioned second embodiment, to a second NMOS power supply line VL6 while a first NMOS control voltage of 6[V], which is lower than that in the above-mentioned second embodiment, is applied to a first NMOS power supply line VL5. A voltage difference between the first NMOS control voltage and the second NMOS control voltage is 6[V] that is smaller than that in the above-mentioned second embodiment.

Thus, to common NMOS control lines NGa to NGd each connected to the first NMOS power supply line VL5 and the second NMOS power supply line VL6 via a second inverter circuit 25, the first NMOS control voltage of 6[V] is applied by the second inverter circuits 25 in the non-selected rows 3b while the second NMOS control voltage of 0[V] is applied by the second inverter circuit 25 in the selected row 3a. Thus, a voltage amplitude between the voltage applied to the common NMOS control line NGa in the selected row 3a and the voltages applied to the common NMOS control lines NGb to NGd in the non-selected rows 3b can be set to 6[V](i.e., 6[V]−0[V]) so that the voltage amplitude can be reduced. Thus, the voltage amplitude between the voltages at gates of the NMOS switches 9a, 9c, . . . (9b, 9d, . . . ) respectively connected to the common NMOS control lines NGa to NGd in the selected row 3a and the non-selected rows 3b can be reduced. Accordingly, a gate insulating film can further be thinned.

In addition to such a configuration, in a P-type well PW1 in which the NMOS switches 9a, 9c, . . . (9b, 9d, . . . ) are formed, the auxiliary NMOS switches 36a, 36c, . . . (36b, 36d, . . . ) having a transistor configuration are formed to correspond to the NMOS switches 9a, 9c, . . . (9b, 9d, . . . ). In the P-type well PW1, in addition to a second power supply line 6a (6b) extending in a column direction, an auxiliary MOS power supply line 7a (7b) similarly extending in the column direction is provided to run parallel to the second power supply line 6a (6b). The auxiliary MOS power supply line 7a (7b) is connected to control gates of the auxiliary NMOS switches 36a, 36c, . . . (36b, 36d, . . . ) arranged within the power supply unit 34 so that a predetermined auxiliary control voltage can be uniformly applied to the auxiliary NMOS switches 36a, 36c, . . . (36b, 36d, . . . ) within the power supply unit 34.

In practice, each of the auxiliary NMOS switches 36a, 36c, . . . arranged in the selected unit column 32a has its gate to which an auxiliary control voltage of 0[V] can be applied from the auxiliary MOS power supply line 7a. On the other hand, each of the auxiliary NMOS switches 36b, 36d, . . .

arranged in the non-selected unit column 32b has its gate to which an auxiliary control voltage of 6[V] can be applied from the auxiliary MOS power supply line 7b. Each of the auxiliary NMOS switches 36a, 36c, . . . (36b, 36d, . . . ) has its source connected to a second power supply line 6a (6b) while having its drain connected to the word line 15. A writing voltage or a writing inhibition voltage is applied to the source from the second power supply line 6a (6b).

(3-1-1) As to First Area

When a first area AR1 is first paid attention to, in a selected power supply unit 34a in the selected unit column 32a, a writing gate voltage of 12[V] is applied to a first power supply line 5a, and a writing inhibition gate voltage of 0[V] is applied to the other second power supply line 6a. In this case, in the selected row 3a, the first inverter circuit 24 applies the second PMOS control voltage of 6[V] on the second PMOS power supply line VL4 as a common voltage to the common PMOS control line PGa.

Thus, the PMOS switch 8a arranged in the selected row 3a in the selected unit column 32a is turned on when the second PMOS control voltage of 6[V] is applied to its gate from the common PMOS control line PGa and the writing gate voltage of 12[V] is applied to its source from the first power supply line 5a so that the writing gate voltage of 12[V] can be applied from its drain to a selected word line 15a. Thus, in the first area AR1, the selected memory cell C1 connected to a selected first bit line L1a and a selected second bit line L2a has its one end and the other end to which a writing voltage of 0[V] is applied from the selected first bit line L1a and the selected second bit line L2a and has its control gate to which the writing gate voltage of 12[V] is applied from the selected word line 15a. Thus, a voltage difference occurring between the control gate and a channel region becomes large. As a result, a quantum tunnel effect is produced so that a charge can be injected into a charge storage layer from the channel region.

Thus, the non-volatile semiconductor memory device 31 according to the third embodiment can set, when the PMOS switch 8a is turned on in the selected row 3a in the selected unit column 32a, a voltage difference between the second PMOS control voltage (6[V]) applied to the gate of the PMOS switch 8a and the writing gate voltage (12[V]) applied to the source thereof to 6[V] or less that is much lower than that in the second embodiment.

The other non-selected memory cell C2 in the first area AR1 has its one end and the other end to which a writing inhibition voltage of 6[V] is applied from a non-selected bit line L1b and a non-selected second bit line L2b, like in the above-mentioned first embodiment. Even if the writing gate voltage of 12[V] is applied to a control gate of the other non-selected memory cell C2 from the selected word line 15a, therefore, a voltage difference occurring between the control gate and a channel region is small. As a result, a quantum tunnel effect is not produced so that no charge can be injected into a charge storage layer from the channel region.

In this case, in the selected row 3a, the second inverter circuit 25 applies the second NMOS control voltage of 0[V] on the second NMOS power supply line VL6 to the common NMOS control line NGa. Thus, the NMOS switch 9a arranged in the selected row 3a in the selected unit column 32a is turned off when the second NMOS control voltage of 0[V] is applied to its gate from the common NMOS control line NGa and the writing inhibition gate voltage of 0[V] is applied to its source from the second power supply line 6a so that the writing inhibition gate voltage can be interrupted.

In this case, in the selected unit column 32a, the auxiliary control voltage of 0[V] is applied to the auxiliary MOS power supply line 7a. Thus, the auxiliary NMOS switch 36a arranged in the selected row 3a in the selected unit column 32a is turned off when the auxiliary control voltage of 0[V] is applied to the gate from the auxiliary MOS power supply line 7a and the writing inhibition gate voltage of 0[V] is applied to the source from the second power supply line 6a so that the writing inhibition gate voltage can be interrupted. Thus, the writing gate voltage of 12[V] can be applied to the selected word line 15a in the first area AR1 via the PMOS switch 8a.

(3-1-2) As to Second Area

A second area AR2 including non-selected rows 3b in the selected unit column 32a is then paid attention to. In this case, in the non-selected rows 3b, the first inverter circuits 24 select the first PMOS control voltage of 12[V] applied to the first PMOS power supply line VL3, and respectively apply the first PMOS control voltage to the common PMOS control lines PGb, PGc, and PGd. Thus, the PMOS switch 8c arranged in the non-selected row 3b in the selected unit column 32a is turned off when the first PMOS control voltage of 12[V] is applied to its gate from the common PMOS control line PGb and the writing gate voltage of 12[V] is applied to its source from the first power supply line 5a so that the writing gate voltage can be interrupted.

In this case, in the non-selected rows 3b, the second inverter circuits 25 respectively apply the first NMOS control voltage of 6[V] on the first NMOS power supply line VL5 to the common NMOS control lines NGb, NGc, and NGd. Thus, the NMOS switch 9c arranged in the non-selected row 3b in the selected unit column 32a is turned on when the first NMOS control voltage of 6[V] is applied to its gate from the common PMOS control line NGb and the writing inhibition gate voltage of 0[V] is applied to its source from the second power supply line 6a so that the writing inhibition gate voltage of 0[V] can be applied from its drain to a non-selected word line 15c.

Thus, in the second area AR2, the non-selected memory cell C2 connected to the selected first bit line L1a and the selected second bit line L2a has its one end and the other end to which the writing voltage of 0[V] is applied from the selected first bit line L1a and the selected second bit line L2a while having its control gate to which the writing inhibition gate voltage of 0[V] is similarly applied from the non-selected word line 15c. Thus, the control gate and a channel region have the same voltage. As a result, a quantum tunnel effect is not produced so that no charge can be injected into a charge storage layer from the channel region.

The non-selected memory cell C2 connected to the non-selected first bit line L1b and the non-selected second bit line L2b has its one end and the other end to which the writing inhibition voltage of 6[V] is applied from the non-selected first bit line L1b and the non-selected second bit line L2b and has its control gate to which the writing inhibition gate voltage of 0[V] is similarly applied from the non-selected word line 15c. Thus, the non-selected memory cell C2 can enter a state where data cannot be written thereto because a voltage difference occurring between the control gate and a channel region becomes small and as a result, a quantum tunnel effect is not produced so that no charge is injected into a charge storage layer from the channel region.

The non-volatile semiconductor memory device 31 according to the third embodiment can set, when the NMOS switch 9c is turned on in the non-selected row 3b in the selected unit column 32a, a voltage difference between the first NMOS control voltage (6[V]) applied to the gate of the NMOS switch 9c and the writing inhibition gate voltage (0[V]) applied to the source thereof to 6[V] that is much smaller than that in the second embodiment.

The auxiliary NMOS switch 36c arranged in the non-selected row 3b in the selected unit column 32a is turned off when the auxiliary control voltage of 0[V] is applied to its gate from the auxiliary MOS power supply line 7a and the writing inhibition gate voltage of 0[V] is applied to its source from the second power supply line 6a so that the writing inhibition gate voltage can be interrupted. Thus, the writing inhibition gate voltage of 0[V] can be applied to the non-selected word line 15c in the second area AR2 via the NMOS switch 9c.

(3-1-3) As to Third Area

A third area AR3 in the non-selected unit column 32b is then paid attention to. In this case, in a non-selected power supply unit 34b in the non-selected unit column 32b, an off voltage of 6[V] is applied to a first power supply line 5b and a writing inhibition gate voltage of 0[V] is applied to the other second power supply line 6b. In this case, in the selected row 3a, the first inverter circuit 24 applies the second PMOS control voltage of 6[V] on the second PMOS power supply line VL4 to the common PMOS control line PGa. Thus, the PMOS switch 8b arranged in the selected row 3a in the non-selected unit column 32b is turned off when the second PMOS control voltage of 6[V] is applied to its gate from the common PMOS control line PGa and the off voltage of 6[V] is applied to its source from the first power supply line 5b so that the off voltage can be interrupted.

In this case, in the selected row 3a, the second inverter circuit 25 applies the second NMOS control voltage of 0[V] on the second NMOS power supply line VL6 to the common NMOS control line NGa. Thus, the NMOS switch 9b arranged in the selected row 3a in the non-selected unit column 32b is turned off when the second NMOS control voltage of 0[V] is applied to its gate from the common NMOS control line NGa and the writing inhibition gate voltage of 0[V] is applied to its source from the second power supply line 6b so that the writing inhibition gate voltage can be interrupted.

In the non-selected unit column 32b, the auxiliary control voltage of 6[V] is applied to the auxiliary MOS power supply line 7b. Thus, the auxiliary NMOS switch 36b arranged in the selected row 3a in the non-selected unit column 32b is turned on when the auxiliary control voltage of 6[V] is applied to its gate from the auxiliary MOS power supply line 7b and the writing inhibition gate voltage of 0[V] is applied to its source from the second power supply line 6b so that the writing inhibition gate voltage can be applied from the drain to the non-selected word line 15b. Thus, to the non-selected word line 15b in the selected row 3a in the third area AR3, the writing inhibition gate voltage of 0[V] can be applied via the auxiliary NMOS switch 36b.

In this case, in the present embodiment, in the non-selected unit column 32b, a writing inhibition voltage of 0[V] is applied to a non-selected first bit line L1c and a non-selected second bit line L2c, and 0 [V] is also applied to a P-type memory well PW2 to match this. Thus, the non-selected memory cell C2 arranged in the selected row 3a in the third area AR3 has its one end and the other end to which the writing inhibition voltage of 0[V] is applied from the non-selected first bit line L1c and the non-selected second bit line L2c and has its control gate to which the writing inhibition gate voltage of 0[V] is applied from the non-selected word line 15b. Thus, the control gate and a channel region have the same voltage. As a result, a quantum tunnel effect is not produced so that no charge can be injected into a charge storage layer from the channel region.

On the other hand, in the non-selected rows 3b, the first inverter circuits 24 respectively apply the first PMOS control voltage of 12[V] on the first PMOS power supply line VL3 to the common PMOS control lines PGb, PGc, and PGd. Thus, the PMOS switch 8d arranged in the non-selected row 3b in the non-selected unit column 32b is turned off when the first PMOS control voltage of 12[V] is applied to its gate from the common PMOS control line PGb and the off voltage of 6[V] is applied to its source from the first power supply line 5b so that the off voltage can be interrupted.

In this case, in the non-selected rows 3b, the second inverter circuits 25 respectively apply the first NMOS control voltage of 6[V] on the first NMOS power supply line VL5 to the common NMOS control lines NGb, NGc, and NGd. Thus, the NMOS switch 9d arranged in the non-selected row 3b in the non-selected unit column 32b is turned on when the first NMOS control voltage of 6[V] is applied to its gate from the common NMOS control line NGb and the writing inhibition gate voltage of 0[V] is applied to its source from the second power supply line 6b so that the writing inhibition gate voltage can be applied from its drain to the non-selected word line 15d.

Furthermore, the auxiliary NMOS switch 36d arranged in the non-selected row 3b in the non-selected unit column 32b is turned on when the auxiliary control voltage of 6[V] is applied to its gate from the auxiliary MOS power supply line 7b and the writing inhibition gate voltage of 0[V] is applied to its source from the second power supply line 6b so that the writing inhibition gate voltage can be applied from its drain to the non-selected word line 15d. Thus, the writing inhibition gate voltage of 0[V] can be applied to the non-selected word line 15d in the non-selected row 3b in the third area AR3 via the NMOS switch 9d and the auxiliary NMOS switch 36d.

Thus, the non-selected memory cell C2 arranged in the non-selected row 3b in the third area AR3 has its one end and the other end to which the writing inhibition voltage of 0[V] is applied from the non-selected first bit line L1c and the non-selected second bit line L2c and has its control gate to which the writing inhibition gate voltage of 0[V] is applied from the non-selected word line 15d via the NMOS switch 9d and the auxiliary NMOS switch 36d. Thus, the control gate and a channel region have the same voltage. As a result, a quantum tunnel effect is not produced so that no charge can be injected into a charge storage layer from the channel region.

Thus, the non-volatile semiconductor memory device 31 according to the third embodiment can set, when the NMOS switches 9d, . . . are turned on in the non-selected rows 3b in the non-selected unit column 32b, a voltage difference between the first NMOS control voltage (6[V]) applied to the gates of the NMOS switch 9d, . . . and the writing inhibition gate voltage (0[V]) applied to the sources thereof to 6[V] that is much lower than that in the second embodiment. Further, the non-volatile semiconductor memory device 31 can set, when the auxiliary NMOS switches 36b, 36d, . . . are turned on in the non-selected unit column 32b, a voltage difference between the auxiliary control voltage (6[V]) applied to the gates of the auxiliary NMOS switches 36b, 36d, . . . and the writing inhibition gate voltage (0[V]) applied to the sources thereof to 6[V].

To summarize an operation of a switching mechanism below, in the selected power supply unit 34a, to which the selected word line 15a on which the selected memory cell C1 exists is connected, among the power supply units 34, the NMOS switch 9a and the auxiliary NMOS switch 36a respectively having the sources to which a writing inhibition gate voltage (charge storage inhibition gate voltage) is applied from the second power supply line 6a are turned off and the PMOS switch 8a having the source to which a writing gate voltage (charge storage gate voltage) is applied from the first power supply line 5a is turned on, to apply a writing gate voltage (charge storage gate voltage) to the selected word line 15a from the drain of the PMOS switch 8a.

In the selected power supply unit 34a, to which the selected word line 15a on which the selected memory cell C1 exists is connected, among the power supply units 34, when a writing inhibition gate voltage (charge storage inhibition gate voltage) is applied to the non-selected word line 15c on which only the non-selected memory cells C2 are arranged, the PMOS switch 8c having the source to which a writing gate voltage (charge storage gate voltage) is applied from the first power supply line 5a and the auxiliary NMOS switch 36c having the source to which a writing inhibition gate voltage (charge storage inhibition gate voltage) is applied from the second power supply line 6a are turned off and the NMOS switch 9c having the source to which a writing inhibition gate voltage (charge storage inhibition gate voltage) is applied from the second power supply line 6a is turned on, to apply a writing inhibition gate voltage (charge storage inhibition gate voltage) to the non-selected word line 15c from the drain of the NMOS switch 9c.

In the non-selected power supply unit 34b having only the non-selected word line on which only the non-selected memory cells C2 are arranged among the power supply units 34, when the PMOS switch 8b, sharing the common PMOS control line PGa with the PMOS switch 8a, which applies a writing gate voltage (charge storage gate voltage) to the selected word line 15a in the power supply unit 34 in the other column, exists, the PMOS switch 8b and the NMOS switch 9b are turned off, and the auxiliary NMOS switch 36b paired therewith is turned on, to apply a writing inhibition gate voltage (charge storage inhibition gate voltage), which has been applied to the source of the auxiliary NMOS switch 36b from the second power supply line 6b, to the non-selected word line 15b from the drain of the auxiliary NMOS switch 36b.

In the non-selected power supply unit 34b having only the non-selected word line on which only the non-selected memory cells C2 are arranged among the power supply units 34, when the NMOS switch 9d, sharing the common NMOS control line NGb with the NMOS switch 9c, which applies a writing inhibition gate voltage (charge storage inhibition gate voltage) to the non-selected word line 15c in the power supply unit 34 in the other column, exists, the NMOS switch 9d and the auxiliary NMOS switch 36d are turned on, and the PMOS switch 8d paired therewith is turned off, to apply a writing inhibition gate voltage (charge storage inhibition gate voltage), which has been applied to the sources of the NMOS switch 9d and the auxiliary NMOS switch 36d from the second power supply line 6b, to the non-selected word line 15d from the drains of the NMOS switch 9d and the auxiliary NMOS switch 36d. Thus, in the non-volatile semiconductor memory device 31, a charge can be stored in only the memory cell C at a predetermined position.

(3-2) Data Erasure Operation

Figure 5:
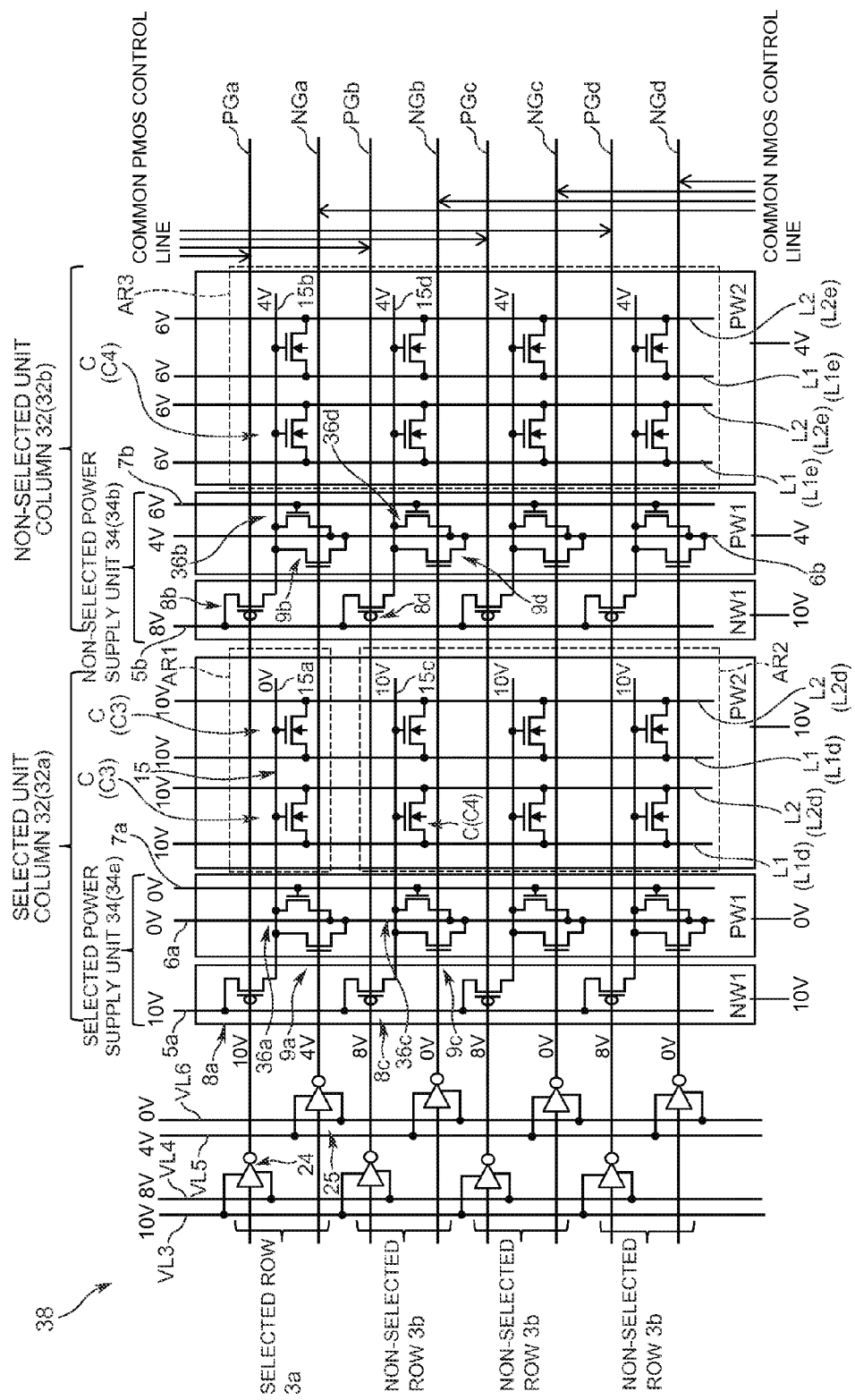
FIG. 5 is a circuit diagram illustrating a circuit configuration of a non-volatile semiconductor memory device according to the third embodiment and respective values of voltages applied to portions during a data erasure operation.

Then, in this non-volatile semiconductor memory device 31, a case where data in the memory cell C is erased will be described below. FIG. 5 illustrating portions corresponding to those illustrated in FIG. 4 with the same symbols respectively assigned thereto illustrates a non-volatile semiconductor memory device 38 according to the third embodiment when performing a data erasure operation, and illustrates respective values of voltages applied to portions when data in all memory cells C in a first area AR1 among a plurality of memory cells C are erased and data in all the other memory cells C are not erased. In this case, a first PMOS control voltage of 10[V] is applied to a first PMOS power supply line VL3, and a second PMOS control voltage of 8[V] is applied to a second PMOS power supply line VL4. A first NMOS control voltage of 4[V] is applied to a first NMOS power supply line VL5, and a second NMOS control voltage of 0[V] is applied to a second NMOS power supply line VL6.

(3-2-1) As to First Area

After description is first made by paying attention to the first area AR1, a second area AR2 and a third area AR3 will be described in this order. In this case, in a selected power supply unit 34a in a selected unit column 32a in which erasure memory cells C3 are arranged, a non-erasure gate voltage of 10[V] is applied to a first power supply line 5a, and an erasure gate voltage of 0[V] is applied to the other second power supply line 6a. In this case, in a selected row 3a, a first inverter circuit 24 connected to the first PMOS power supply line VL3 and the second PMOS power supply line VL4 applies the first PMOS control voltage of 10[V] on the first PMOS power supply line VL3 to a common PMOS control line PGa.

Thus, a PMOS switch 8a arranged in the selected row 3a in the selected unit column 32a is turned off when the first PMOS control voltage of 10[V] is applied to its gate from the common PMOS control line PGa and the non-erasure gate voltage of 10[V] is applied to its source from the first power supply line 5a so that the non-erasure gate voltage can be interrupted.

In this case, in the selected row 3a, the second inverter circuit 25 applies the first NMOS control voltage of 4[V] on the first NMOS power supply line VL5 to a common NMOS control line NGa. Thus, an NMOS switch 9a arranged in the selected row 3a in the selected unit column 32a is turned on when the first NMOS control voltage of 4[V] is applied to its gate from the common NMOS control line NGa and the erasure gate voltage of 0[V] is applied to its source from the second power supply line 6a so that the erasure gate voltage of 0[V] can be applied from its drain to the selected word line 15a.

In the selected unit column 32a, 10[V] is applied to a P-type memory well PW2 in which the plurality of memory cells C are formed while 10[V] is applied as an erasure voltage to a selected first bit line L1d and a selected second bit line L2d. Thus, each of the erasure memory cells C3 in the first area AR1 has its control gate to which an erasure gate voltage of 0[V] can be applied from a selected word line 15a and has its one end and the other end to which an erasure voltage of 10[V] can be applied from a selected first bit line L1d and a selected second bit line L2d. Thus, each of the erasure memory cells C3 can erase data when a voltage value on the side of a channel region becomes higher than a voltage on the side of the control gate and a charge stored in a charge storage layer is drawn into the channel region having a high voltage and is extracted from the charge storage layer.

In this case, in the selected unit column 32a, an auxiliary control voltage of 0[V] is applied to an auxiliary MOS power supply line 7a. Thus, an auxiliary NMOS switch 36a arranged in the selected row 3a in the selected unit column 32a is turned off when the auxiliary control voltage of 0[V] is applied to its gate from the auxiliary MOS power supply line 7a and the erasure gate voltage of 0[V] is applied to its source from the second power supply line 6a so that the erasure gate voltage can be interrupted. Thus, the erasure gate voltage of 0[V] can be applied to the selected word line 15a in the first area AR1 via the NMOS switch 9a.

(3-2-2) As to Second Area

The second area AR2 including non-selected rows 3b in the selected unit column 32a is then paid attention to. In this case, in the non-selected rows 3b, the first inverter circuits 24 respectively apply the second PMOS control voltage of 8[V] on the second PMOS power supply line VL4 to the common PMOS control lines PGb, PGc, and PGd. Thus, a PMOS switch 8*c* arranged in the non-selected row 3*b* in the selected unit column 32*a* is turned off when the second PMOS control voltage of 8[V] is applied to its gate from the common PMOS control line PGb and the non-erasure gate voltage of 0[V] is applied to its source from the first power supply line 5*a* so that the non-erasure gate voltage can be applied from its drain to a non-selected word line 15*c*.

Thus, a non-erasure memory cell C4 arranged in the non-selected row 3*b* in the selected unit column 32*a*, to which the erasure voltage of 10[V] is applied from the selected first bit line L1*d* and the selected second bit line L2*d*, has its control gate to which the non-erasure gate voltage of 10[V] is applied from a non-selected word line 15*d* via the PMOS switch 8*c*. Thus, the control gate and a channel region have the same voltage. As a result, no charge is extracted from a charge storage layer, and a charge state within the charge storage layer can be maintained.

In this case, in the non-selected rows 3*b*, second inverter circuits 25 respectively apply the second NMOS control voltage of 0[V] on the second NMOS power supply line VL6 to common NMOS control lines NGb, NGc, and NGd. Thus, an NMOS switch 9*c* arranged in the non-selected row 3*b* in the selected unit column 32*a* is turned off when the second NMOS control voltage of 0[V] is applied to its gate from the common NMOS control line NGb and the erasure gate voltage of 0[V] is applied to its source from the second power supply line 6*a* so that the erasure gate voltage can be interrupted.

An auxiliary NMOS switch 36*c* arranged in the non-selected row 3*b* in the selected unit column 32*a* is turned off when, as described above, the auxiliary control voltage of 0[V] is applied to its gate from the auxiliary MOS power supply line 7*a* and the erasure gate voltage of 0[V] is applied to its source from the second power supply line 6*a* so that the erasure gate voltage can be interrupted. Thus, the non-erasure gate voltage of 10[V] can be applied to the non-selected word line 15*c* in the second area AR2 via the PMOS switch 8*c*.

(3-2-3) As to Third Area

The third area AR3 in a non-selected unit column 32*b* is then paid attention to. In this case, in a non-selected power supply unit 34*b* in the non-selected unit column 32*b*, an off voltage of 8[V] is applied to a first power supply line 5*b* and a non-erasure gate voltage of 4[V] is applied to a second power supply line 6*b*. In the selected row 3*a*, the first inverter circuit 24 applies the first PMOS control voltage of 10[V] on the first PMOS power supply line VL3 to the common PMOS control line PGa. Thus, a PMOS switch 8*b* arranged in the selected row 3*a* in the non-selected unit column 32*b* is turned off when the first PMOS control voltage of 10[V] is applied to its gate from the common PMOS control line PGa and the off voltage of 8[V] is applied to its source from the first power supply line 5*b* so that the off voltage can be interrupted.

In this case, in the selected row 3*a*, the second inverter circuit 25 applies the first NMOS control voltage of 4[V] on the first NMOS power supply line VL5 to the common NMOS control line NGa. Thus, an NMOS switch 9*b* arranged in the selected row 3*a* in the non-selected unit column 32*b* is turned off when the first NMOS control voltage of 4[V] is applied to its gate from the common NMOS control line NGa and the non-erasure gate voltage of 4[V] is applied to its source from the second power supply line 6*b* so that the non-erasure gate voltage can be interrupted.

In addition thereto, in this case, in the non-selected unit column 32*b*, an auxiliary control voltage of 6[V] is applied to the auxiliary MOS power supply line 7*b*. Thus, an auxiliary NMOS switch 36*b* arranged in the selected row 3*a* in the non-selected unit column 32*b* is turned on when the auxiliary control voltage of 6[V] is applied to its gate from the auxiliary MOS power supply line 7*b* and the non-erasure gate voltage of 4[V] is applied to its source from the second power supply line 6*b* so that the non-erasure gate voltage can be applied from its drain to a non-selected word line 15*b*. Thus, the non-erasure gate voltage of 4[V] can be applied to the non-selected word line 15*b* arranged in the selected row 3*a* in the third area AR3 via the auxiliary NMOS switch 36*b*.

In the non-selected unit column 32*b*, 4[V] is applied to the P-type memory well PW2 while a non-erasure voltage of 6[V] is applied to a non-selected first bit line L1*e* and a non-selected second bit line L2*e*. Thus, the non-erasure memory cell C4 arranged in the selected row 3*a* in the third area AR3 has its one end and the other end to which a non-erasure voltage of 6[V] can be applied from a non-selected first bit line L1*e* and a non-selected second bit line L2*e* and has its control gate to which the non-erasure gate voltage of 4[V] can be applied from the non-selected word line 15*b* via the auxiliary NMOS switch 36*b*. Thus, in the non-erasure memory cell C4 arranged in the selected row 3*a* in the third area AR3, a voltage difference occurring between the control gate and a channel region is small. Thus, no charge is extracted from a charge storage layer, and a charge state within the charge storage layer can be maintained.

On the other hand, in the non-selected rows 3*b*, the first inverter circuits 24 respectively apply the second PMOS control voltage of 8[V] on the second PMOS power supply line VL4 to the common PMOS control lines PGb, PGc, and PGd. Thus, a PMOS switch 8*d* arranged in the non-selected row 3*b* in the non-selected unit column 32*b* is turned off when the second PMOS control voltage of 8[V] is applied to its gate from the common PMOS control line PGb and the off voltage of 8[V] is applied to its source from the first power supply line 5*b* so that the off voltage can be interrupted.

In this case, in the non-selected rows 3*b* in the non-selected unit column 32*b*, the second inverter circuits 25 respectively apply the second NMOS control voltage of 0[V] on the second NMOS power supply line VL6 to the common NMOS control lines NGb, NGc, and NGd. Thus, an NMOS switch 9*d* arranged in the non-selected row 3*b* in the non-selected unit column 32*b* is turned off when the second NMOS control voltage of 0[V] is applied to its gate from the common NMOS control line NGb and the non-erasure gate voltage of 4[V] is applied to its source from the second power supply line 6*b* so that the non-erasure gate voltage can be interrupted.

On the other hand, an auxiliary NMOS switch 36*d* arranged in the non-selected row 3*b* in the non-selected unit column 32*b* is turned on when the auxiliary control voltage of 6[V] is applied to its gate from the auxiliary MOS power supply line 7*b* and the non-erasure gate voltage of 4[V] is applied to its source from the second power supply line 6*b* so that the non-erasure gate voltage can be applied from its drain to the non-selected word line 15*d*. Thus, the non-erasure gate voltage of 4[V] can be applied to the non-selected word line 15*d* arranged in the non-selected row 3*b* in the third area AR3 via the auxiliary NMOS switch 36*d*.

Thus, a non-erasure memory cell C4 arranged in the non-selected row 3*b* in the third area AR3 has its one end and the other end to which the non-erasure voltage of 6 [V] can be applied from the non-selected first bit line L1*e* and the non-selected second bit line L2*e* and has its control gate to which the non-erasure gate voltage of 4 [V] can be applied from the non-selected word line 15*d* via the auxiliary NMOS switch 36*d*. Thus, in the non-erasure memory cell C4 arranged in the non-selected row 3*b* in the third area AR3, a voltage difference occurring between the control gate and a channel region is small. Thus, no charge is extracted from a charge storage layer, and a charge state in the charge storage layer can be maintained.

Thus, the non-volatile semiconductor memory device 38 can erase data for only the erasure memory cell C3 arranged in the selected row 3a in the selected unit column 32a, for example, by adjusting respective values of the voltages applied to the portions such as the first PMOS power supply line VL3, the second PMOS power supply line VL4, the first NMOS power supply line VL5, the second NMOS power supply line VL6, the first power supply lines 5a and 5b, the second power supply lines 6a and 6b, the auxiliary MOS power supply lines 7a and 7b, the first bit line L1, and the second bit line L2.

(4) Fourth Embodiment (4-1) Data Writing Operation

Figure 6:
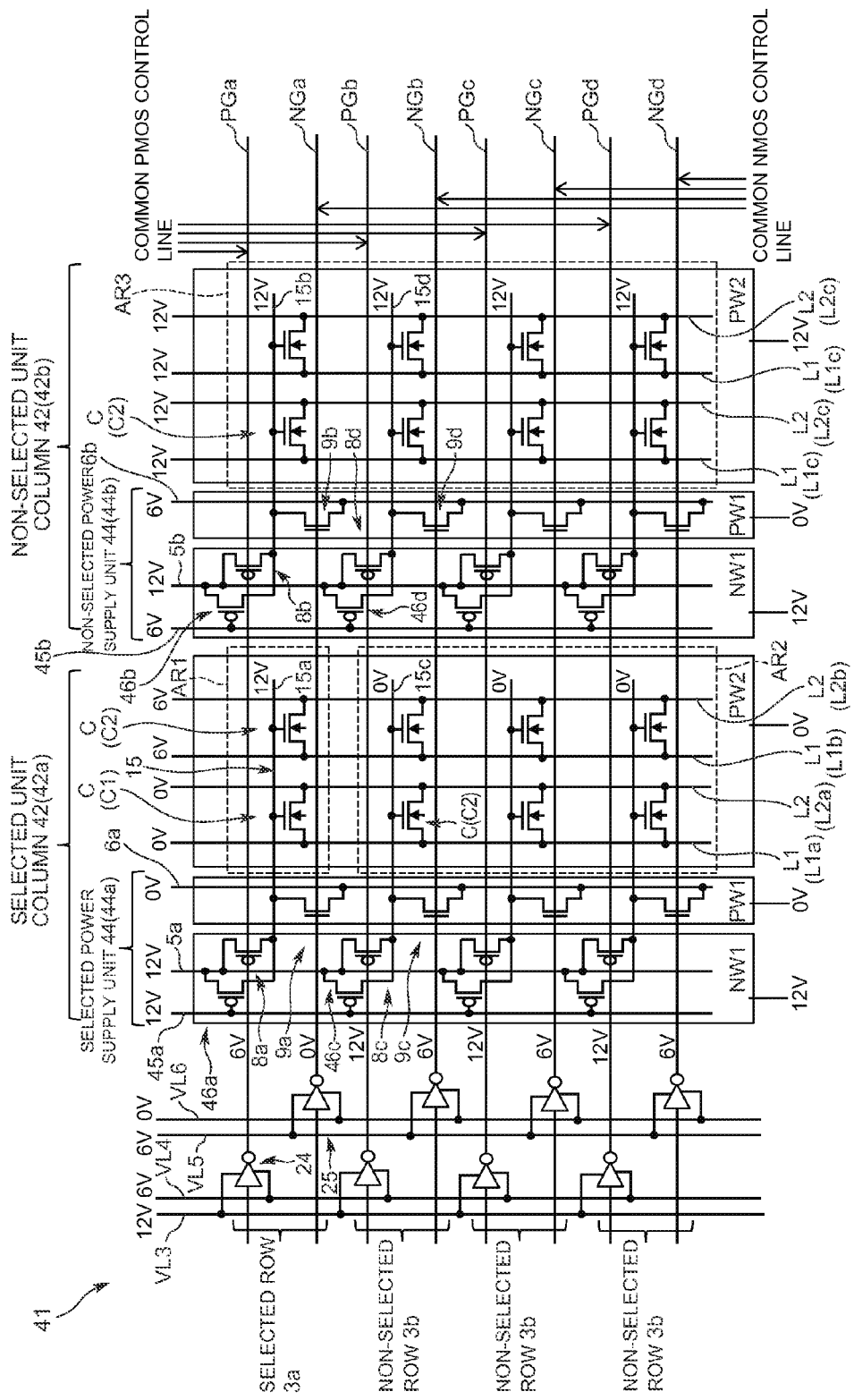
FIG. 6 is a circuit diagram illustrating a circuit configuration of a non-volatile semiconductor memory device according to a fourth embodiment and respective values of voltages applied to portions during data writing.

In FIG. 6 illustrating portions corresponding to those illustrated in FIG. 4 with the same symbols respectively assigned thereto, reference numeral 41 denotes a non-volatile semiconductor memory device according to a fourth embodiment, which differs from the above-mentioned non-volatile semiconductor memory device 31 according to the third embodiment in that auxiliary PMOS switches 46a, 46c, . . . (46b, 46d, . . . ) are provided instead of the above-mentioned auxiliary NMOS switches 36a, 36c, . . . (36b, 36d, . . . ) (FIG. 4), and a writing inhibition gate voltage of 12[V] is applied to non-selected word lines 15b, 15d, . . . , respectively, via the auxiliary PMOS switches 46b, 46d, . . . in a non-selected unit column 42b during data writing. FIG. 6 illustrates respective values of voltages applied to portions when a memory cell C in the first row and the first column in a first unit column 42 among a plurality of memory cells C is taken as a selected memory cell C1 into which data is written and all the other memory cells C are taken as non-selected memory cells C2.

In this case, in an N-type well NW1 in a power supply unit 44, the auxiliary PMOS switches 46a, 46c, . . . (46b, 46d, . . . ) having a transistor configuration are formed to correspond to PMOS switches 8a, 8c, . . . (8b, 8d, . . . ). In the N-type well NW1, in addition to a first power supply line 5a (5b) extending in a column direction, an auxiliary MOS power supply line 45a (45b) similarly extending in the column direction is provided to run parallel to the first power supply line 5a (5b). The plurality of auxiliary PMOS switches 46a, 46c, . . . (46b, 46d, . . . ) within the power supply unit 44 have their respective gates connected to the auxiliary MOS power supply line 45a (45b), and an auxiliary control voltage of 12[V] can be applied thereto in the selected unit column 42a while an auxiliary control voltage of 6[V] can be applied in the non-selected unit column 42b.

Each of the auxiliary PMOS switches 46a, 46c, . . . (46b, 46d, . . . ) has its source connected to the first power supply line 5a (5b) and has its drain connected to a word line 15, and can be turned on or off due to a voltage difference between an auxiliary control voltage applied to the gate from the auxiliary MOS power supply line 45a (45b) and a writing voltage or a writing inhibition voltage applied to the source from the first power supply line 5a (5b).

(4-1-1) As to First Area

When a first area AR1 is first paid attention to, in a selected power supply unit 44a in the selected unit column 42a, a writing gate voltage of 12[V] is applied to the first power supply line 5a, and a writing inhibition gate voltage of 0[V] is applied to the other second power supply line 6a. In this case, in a selected row 3a in which the selected memory cell C1 is arranged, a first inverter circuit 24 applies a second PMOS control voltage of 6[V] on a second PMOS power supply line VL4 to a common PMOS control line PGa.

Thus, the PMOS switch 8a arranged in the selected row 3a in the selected unit column 42a is turned on when the second PMOS control voltage of 6[V] is applied to its gate from the common PMOS control line PGa and the writing gate voltage of 12[V] is applied to its source from the first power supply line 5a so that the writing gate voltage of 12[V] can be applied from its drain to a selected word line 15a. Thus, in the first area AR1, the selected memory cell C1 connected to a selected first bit line L1a and a selected second bit line L2a has its one end and the other end to which a writing voltage of 0[V] is applied from the selected first bit line L1a and the selected second bit line L2a and has its control gate to which the writing gate voltage of 12[V] is applied from the selected word line 15a via the PMOS switch 8a. Thus, a voltage difference occurring between the control gate and a channel region becomes large. As a result, a quantum tunnel effect is produced so that a charge can be injected into a charge storage layer from the channel region.

The non-volatile semiconductor memory device 41 according to the fourth embodiment can also set, when the PMOS switch 8a is turned on in the selected row 3a in the selected unit column 42a, a voltage difference between the second PMOS control voltage (6[V]) applied to the gate of the PMOS switch 8a and the writing gate voltage (12[V]) applied to the source thereof to 6[V] or less that is much smaller than that in the second embodiment.

In the first area AR1, the non-selected memory cell C2 connected to a non-selected first bit line L1b and a non-selected second bit line L2b has its control gate to which the writing gate voltage of 12[V] is applied from the selected word line 15a while having its one end and the other end to which a writing inhibition voltage of 6[V] is applied from the non-selected first bit line L1b and the non-selected second bit line L2b. Thus, a voltage difference occurring between the control gate and a channel region becomes small. As a result, a quantum tunnel effect is not produced so that no charge can be injected into a charge storage layer from the channel region.

In this case, in the selected row 3a, a second inverter circuit 25 applies a second NMOS control voltage of 0[V] on a second NMOS power supply line VL6 to a common NMOS control line NGa. Thus, an NMOS switch 9a arranged in the selected row 3a in the selected unit column 42a is turned off when the second NMOS control voltage of 0[V] is applied to its gate from the common NMOS control line NGa and the writing inhibition gate voltage of 0[V] is applied to its source from the second power supply line 6a so that the writing inhibition gate voltage can be interrupted.

Furthermore, in this case, in the selected unit column 42a, the auxiliary control voltage of 12[V] is applied to the auxiliary MOS power supply line 45a. Thus, the auxiliary PMOS switch 46a arranged in the selected row 3a in the selected unit column 42a is turned off when the auxiliary control voltage of 12[V] is applied to its gate from the auxiliary MOS power supply line 45a and the writing gate voltage of 12[V] is applied to its source from the first power supply line 5a so that the writing gate voltage can be interrupted. Thus, the writing gate voltage of 12[V] can be applied to the selected word line 15a in the first area AR1 via the PMOS switch 8a.

(4-1-2) As to Second Area

A second area AR2 including non-selected rows 3b in the selected unit column 42a is then paid attention to. In this case, in the non-selected rows 3b in which only the non-selected memory cells C2 are arranged, first inverter circuits 24 respectively apply a first PMOS control voltage of 12[V] on a first PMOS power supply line VL3 to common PMOS control lines PGb, PGc, and PGd. Thus, the PMOS switch 8c arranged in the non-selected row 3b in the selected unit column 42a is turned off when the first PMOS control voltage of 12[V] is applied to its gate from the common PMOS control line PGb and the writing gate voltage of 12[V] is applied to its source from the first power supply line 5a so that the writing gate voltage can be interrupted.

In this case, in the non-selected rows 3b, second inverter circuits 25 respectively apply a first NMOS control voltage of 6[V] on a first NMOS power supply line VL5 to common NMOS control lines NGb, NGc, and NGd. Thus, an NMOS switch 9c arranged in the non-selected row 3b in the selected unit column 42a is turned on when the first NMOS control voltage of 6[V] is applied to its gate from the common NMOS control line NGb and the writing inhibition gate voltage of 0[V] is applied to its source from the second power supply line 6a so that the writing inhibition gate voltage of 0[V] can be applied from its drain to a non-selected word line 15c.

In this case, the non-volatile semiconductor memory device 41 according to the fourth embodiment can also set, when the NMOS switch 9c is turned on in the non-selected row 3b in the selected unit column 42a, a voltage difference between the first NMOS control voltage (6[V]) applied to the gate of the NMOS switch 9c and the writing inhibition gate voltage (0[V]) applied to the source thereof to 6[V] that is much smaller than that in the second embodiment.

Thus, in the second area AR2, the non-selected memory cell C2 connected to the selected first bit line L1a and the selected second bit line L2a has its one end and the other end to which the writing voltage of 0[V] is applied from the selected first bit line L1a and the selected second bit line L2a while having its control gate to which the writing inhibition gate voltage of 0[V] is similarly applied from the non-selected word line 15c via the NMOS switch 9c. Thus, the control gate and a channel region have the same voltage. As a result, a quantum tunnel effect is not produced so that no charge can be injected into a charge storage layer from the channel region.

In the second area AR2, the non-selected memory cell C2 connected to the non-selected first bit line L1b and the non-selected second bit line L2b has its one end and the other end to which the writing inhibition voltage of 6[V] is also applied from the non-selected first bit line L1b and the non-selected second bit line L2b and has its control gate to which the writing inhibition gate voltage of 0[V] is applied from the non-selected word line 15c via the NMOS switch 9c. As a result, a quantum tunnel effect is not produced so that no charge can be injected into a charge storage layer from the channel region.

The auxiliary NMOS switch 46c arranged in the non-selected row 3b in the selected unit column 42a is turned off when the auxiliary control voltage of 12[V] is applied to its gate from the auxiliary MOS power supply line 45a and the writing gate voltage of 12[V] is applied to its source from the first power supply line 5a so that the writing gate voltage can be interrupted. Thus, the writing inhibition gate voltage of 0[V] can be applied to the non-selected word line 15c in the second area AR2 via the NMOS switch 9c.

(4-1-3) As to Third Area

A third area AR3 in the non-selected unit column 42b is then paid attention to. In this case, in a non-selected power supply unit 44b in the non-selected unit column 42b, a wiring inhibition gate voltage of 12[V] is applied to the first power supply line 5b and an off voltage of 6[V] is applied to the other second power supply line 6b. In this case, in the selected row 3a, the first inverter circuit 24 applies the second PMOS control voltage of 6[V] on the second PMOS power supply line VL4 to the common PMOS control line PGa. Thus, the PMOS switch 8b arranged in the selected row 3a in the non-selected unit column 42b is turned on when the second PMOS control voltage of 6[V] is applied to its gate from the common PMOS control line PGa and the writing inhibition gate voltage of 12[V] is applied to its source from the first power supply line 5b so that the writing inhibition gate voltage of 12[V] can be applied from its drain to the non-selected word line 15b.

In this case, in the non-selected unit column 42b, the auxiliary control voltage of 6[V] is applied to the auxiliary MOS power supply line 45b. Thus, the auxiliary PMOS switch 46b arranged in the selected row 3a in the non-selected unit column 42b is turned on when the auxiliary control voltage of 6[V] is applied to its gate from the auxiliary MOS power supply line 45b and the writing inhibition gate voltage of 12[V] is applied to its source from the first power supply line 5b so that the writing inhibition gate voltage of 12[V] can be applied from its drain to the non-selected word line 15b.

In this case, in the selected row 3a, the second inverter circuit 25 applies the second NMOS control voltage of 0[V] on the second NMOS power supply line VL6 to the common NMOS control line NGa. Thus, the NMOS switch 9b arranged in the selected row 3a in the non-selected unit column 42b is turned off when the second NMOS control voltage of 0[V] is applied to its gate from the common NMOS control line NGa and the off voltage of 6[V] is applied to its source from the second power supply line 6b so that the off voltage can be interrupted. Thus, a writing inhibition gate voltage of 12[V] can be applied to the non-selected word line 15b in the selected row 3a in the third area AR3 via the auxiliary PMOS switch 46b and the PMOS switch 8b.

In the present embodiment, in the non-selected unit column 42b, a writing inhibition voltage of 12[V] is applied to a non-selected first bit line L1c and a non-selected second bit line L2c, and 12[V] is applied to a P-type memory well PW2. Thus, the non-selected memory cell C2 arranged in the selected row 3a in the third area AR3 has its one end and the other end to which the writing inhibition voltage of 12[V] is applied from the non-selected first bit line L1c and the non-selected second bit line L2c and has its control gate to which the writing inhibition gate voltage of 12[V] is applied from the non-selected word line 15b. Further, the P-type memory well PW2 is set to a high voltage of 12[V]. Thus, the control gate and a channel region have the same voltage. As a result, a quantum tunnel effect is not produced so that no charge can be injected into a charge storage layer from the channel region.

On the other hand, in the non-selected row 3b, the first inverter circuits 24 respectively apply the first PMOS control voltage of 12[V] on the first PMOS power supply line VL3 to the common PMOS control lines PGb, PGc, and PGd. Thus, the PMOS switch 8d arranged in the non-selected row 3b in the non-selected unit column 42b is turned off when the first PMOS control voltage of 12[V] is applied to its gate from the common PMOS control line PGb and the writing inhibition gate voltage of 12[V] is applied to its source from the first power supply line 5b so that the writing inhibition gate voltage can be interrupted.

In this case, in the non-selected rows 3b, the second inverter circuits 25 respectively apply the first NMOS control voltage of 6[V] on the first NMOS power supply line VL5 to the common NMOS control lines NGb, NGc, and NGd. Thus, an NMOS switch 9d arranged in the non-selected row 3b in the non-selected unit column 42b is turned off when the first NMOS control voltage of 6[V] is applied to its gate from the common NMOS control line NGb and the off voltage of 6[V]

is applied to its source from the second power supply line 6b so that the off voltage can be interrupted.

On the other hand, the auxiliary PMOS switch 46d arranged in the non-selected row 3b in the non-selected unit column 42b is turned on because the auxiliary control voltage of 6[V] is applied to its gate from the auxiliary MOS power supply line 45b and the writing inhibition gate voltage of 12[V] is applied to its source from the first power supply line 5b so that the writing inhibition gate voltage can be applied from its drain to the non-selected word line 15d. Thus, the writing inhibition gate voltage of 12[V] can be applied to the non-selected word line 15d arranged in the non-selected row 3b in the third area AR3 via the auxiliary PMOS switch 46d.

Thus, the non-selected memory cell C2 arranged in the non-selected row 3b in the third area AR3 has its one end and the other end to which a writing inhibition voltage of 12[V] is also applied from a non-selected first bit line L1c and a non-selected second bit line L2c and has its control gate to which the writing inhibition gate voltage of 12[V] is applied from the non-selected word line 15d via the auxiliary PMOS switch 46d. Further, the P-type memory well PW2 is set to a high voltage of 12[V]. Thus, the control gate and a channel region have the same voltage. As a result, a quantum tunnel effect is not produced so that no charge can be injected into a charge storage layer from the channel region.

(4-2) Operation and Effect

In the above-mentioned configuration, in the non-volatile semiconductor memory device 41, a similar effect to that in the above-mentioned second embodiment can also be obtained. The non-volatile semiconductor memory device 41 according to the fourth embodiment is provided with the auxiliary PMOS switches 46a, 46c, . . . (46b, 46d, . . . ), which are turned on or off depending on an auxiliary control voltage from the auxiliary MOS power supply line 45a (45b) provided for each of power supply units 44 without being constrained by a control voltage required to turn on or off the PMOS switches 8a, 8c, . . . (8b, 8d, . . . ) and the NMOS switches 9a, 9c, . . . (9b, 9d, . . . ).

Thus, in the non-volatile semiconductor memory device 41, the necessity of turning on the PMOS switches 8b, 8d, . . . and NMOS switches 9b, 9d, . . . in the non-selected power supply unit 44b can be eliminated by turning on the auxiliary PMOS switches 46b, 46d, . . . in the non-selected power supply unit 44b, for example, during data writing to apply a writing inhibition gate voltage to non-selected word lines 15b, 15d, . . . . In the non-volatile semiconductor memory device 41, a maximum voltage difference between control voltages respectively required to turn on or off the PMOS switches 8a, 8c, . . . (8b, 8d, . . . ) and NMOS switches 9a, 9c, . . . (9b, 9d, . . . ) can be freely set in ranges in which the PMOS switches 8a, 8c, . . . and NMOS switches 9a, 9c, . . . can be turned on, as needed.

Thus, in this non-volatile semiconductor memory device 41, the maximum voltage difference between the control voltages respectively required to turn on or off the PMOS switches 8a, 8c, . . . and the NMOS switches 9a, 9c, . . . can be set to 6[V] or less that is much lower than that in the second embodiment, for example, and a maximum voltage value of the control voltage required to turn on or off the auxiliary PMOS switches 46a, 46c, . . . (46b, 46d, . . . ) can also be set to 6[V] or less.

Thus, in this non-volatile semiconductor memory device 41, the maximum voltage difference among the control voltages respectively required to turn on or off the PMOS switches 8a, 8c, . . . (8b, 8d, . . . ), the NMOS switches 9a, 9c, . . . (9b, 9d, . . . ), and the auxiliary PMOS switches 46a, 46c, . . . (46b, 46d, . . . ) can be set to 6 [V] or less. Accordingly, the PMOS switches 8a, 8c, . . . (8b, 8d, . . . ), the NMOS switches 9a, 9c, . . . (9b, 9d, . . . ), and the auxiliary PMOS switches 46a, 46c, . . . (46b, 46d, . . . ), each having a gate insulating film the film thickness of which is made much smaller, can be used.

To summarize an operation of a switching mechanism below, in the selected power supply unit 44a to which the selected word line 15a on which the selected memory cell C1 exists is connected among the power supply units 44, the NMOS switch 9a having the source to which a writing inhibition gate voltage (charge storage inhibition gate voltage) is applied from the second power supply line 6a and the auxiliary PMOS switch 46a having the source to which a writing gate voltage (charge storage gate voltage) is applied from the first power supply line 5a are turned off, to apply a writing gate voltage (charge storage gate voltage) to the selected word line 15a from the drain of the PMOS switch 8a when the PMOS switch 8a having the source to which a writing gate voltage (charge storage gate voltage) is applied from the first power supply line 5a is turned on.

In the selected power supply unit 44a to which the selected word line 15a on which the selected memory cell C1 exists is connected among the power supply units 44, when a writing inhibition gate voltage (charge storage inhibition gate voltage) is applied to the non-selected word line 15c on which only the non-selected memory cells C2 are arranged, the PMOS switch 8c and the auxiliary NMOS switch 46c respectively having the sources to which a writing gate voltage (charge storage gate voltage) is applied from the first power supply line 5a are turned off and the NMOS switch 9c having the source to which a writing inhibition gate voltage (charge storage inhibition gate voltage) is applied from the second power supply line 6a is turned on, to apply a writing inhibition gate voltage (charge storage inhibition gate voltage) to the non-selected word line 15c from the drain of the NMOS switch 9c.

In the non-selected power supply unit 44b having only the non-selected word line on which only the non-selected memory cells C2 are arranged among the power supply units 44, when the PMOS switch 8b, sharing the common PMOS control line PGa with the PMOS switch 8a, which applies a writing gate voltage (charge storage gate voltage) to the selected word line 15a in the power supply unit 44 in the other column, exists, the PMOS switch 8b and the auxiliary PMOS switch 46b are turned on, and the NMOS switch 9b paired therewith is turned off, to apply a writing inhibition gate voltage (charge storage inhibition gate voltage), which is applied to the sources of the PMOS switch 8b and the auxiliary PMOS switch 46b from the first power supply line 5b, to the non-selected word line 15b from the drains of the PMOS switch 8b and the auxiliary PMOS switch 46b.

In the non-selected power supply unit 44b having only the non-selected word line on which only the non-selected memory cells C2 are arranged among the power supply units 44, when the NMOS switch 9d, sharing the common NMOS control line NGb with the NMOS switch 9c, which applies a writing inhibition gate voltage (charge storage inhibition gate voltage) to the non-selected word line 15c in the power supply unit 44 in the other column, exists, the NMOS switch 9d and the PMOS switch 8d are turned off, and the auxiliary PMOS switch 46d paired therewith is turned on, to apply a writing inhibition gate voltage (charge storage inhibition gate voltage), which is applied to the source of the auxiliary PMOS switch 46d from the first power supply line 5b, to the non-selected word line 15d from the drain of the auxiliary PMOS switch 46d. Thus, in the non-volatile semiconductor memory device 41, a charge can be stored in only the memory cell C at a predetermined position.

(5) Fifth Embodiment (5-1) Data Writing Operation

Figure 7:
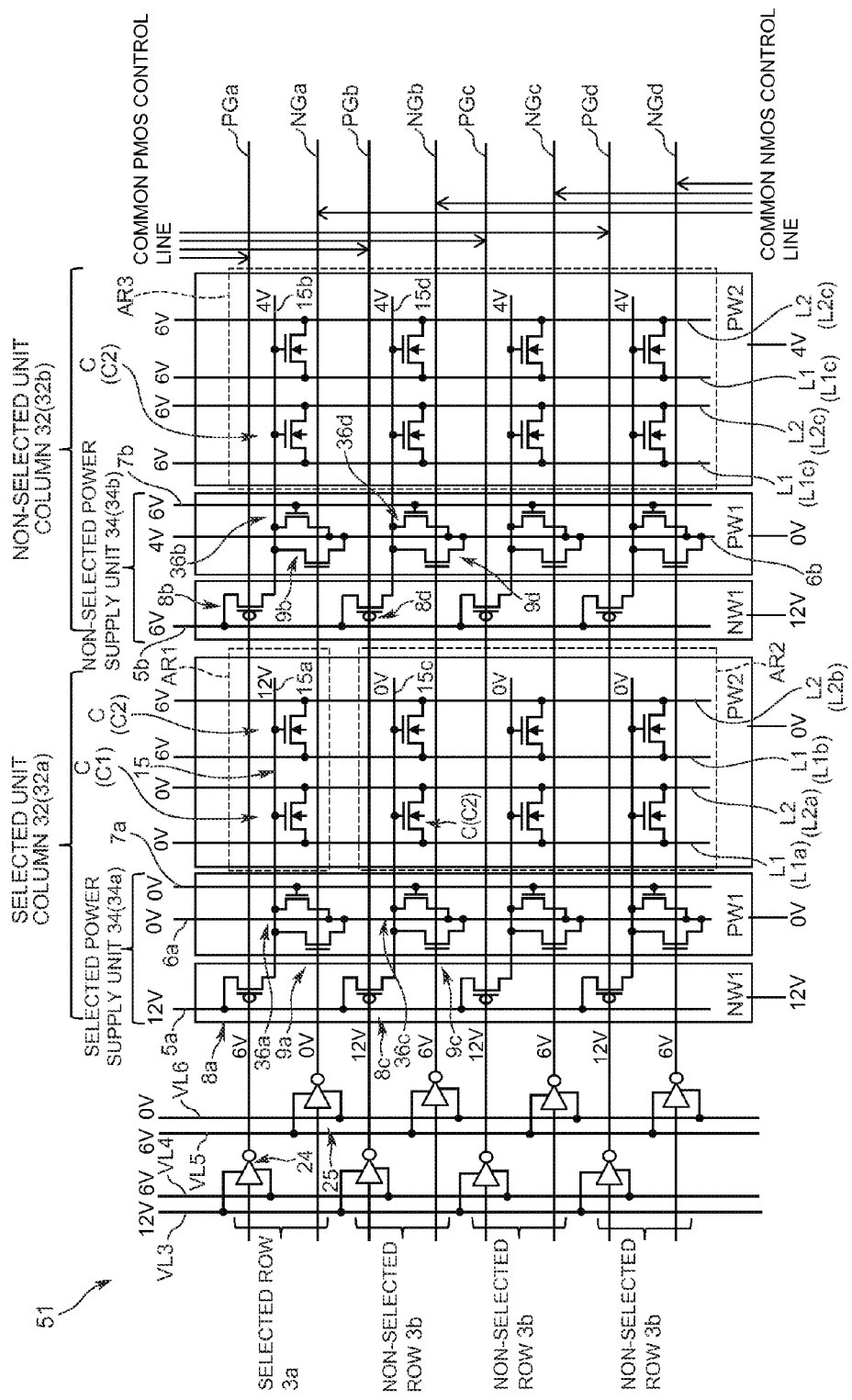
FIG. 7 is a circuit diagram illustrating a circuit configuration of a non-volatile semiconductor memory device according to a fifth embodiment and respective values of voltages applied to portions during data writing.

In FIG. 7 illustrating portions corresponding to those illustrated in FIG. 4 with the same symbols respectively assigned thereto, reference numeral 51 denotes a non-volatile semiconductor memory device according to a fifth embodiment, which is the same as the non-volatile semiconductor memory device according to the above-mentioned third embodiment in that auxiliary NMOS switches 36a, 36c, . . . (36b, 36d, . . . ) are provided but differs from the non-volatile semiconductor memory device according to the above-mentioned third embodiment in that 4[V] is applied to a P-type memory well PW2 and a writing inhibition gate voltage of 4[V] is applied to non-selected word lines 15b and 15d, respectively, via the auxiliary NMOS switches 36b, 36d, . . . in a non-selected unit column 32b during data writing.

FIG. 7 illustrates respective values of voltages applied to portions when a memory cell C in the first row and the first column in a first unit column 32 among a plurality of memory cells C is taken as a selected memory cell C1 into which data is written and all the other memory cells C are taken as non-selected memory cells C2 like in the above-mentioned third embodiment. The non-volatile semiconductor memory device 51 according to the fifth embodiment is the same as the non-volatile semiconductor memory device 31 according to the third embodiment in terms of the voltage values, on/off operations of PMOS switches 8a, 8c, . . . , NMOS switches 9a, 9c, . . . , and the auxiliary NMOS switches 36a, 36c, . . . , and the like in a selected unit column 32a, and hence description thereof is not repeated, and description is made below by paying attention to only the non-selected unit column 32b.

In this case, a PMOS switch 8b in a selected row 3a in the non-selected unit column 32b is turned off when a second PMOS control voltage of 6[V] is applied to its gate from a common PMOS control line PGa and an off voltage of 6[V] is applied to its source from a first power supply line 5b so that the off voltage can be interrupted, like in the above-mentioned third embodiment. On the other hand, in the non-selected unit column 32b in the fifth embodiment, a writing inhibition gate voltage of 4[V] is applied as a common voltage to a second power supply line 6b. Thus, an NMOS switch 9b arranged in the selected row 3a in the non-selected unit column 32b is turned off when a second NMOS control voltage of 0[V] is applied to its gate from a common NMOS control line NGa and the writing inhibition gate voltage of 4[V] is applied to its source from the second power supply line 6b so that the writing inhibition gate voltage can be interrupted.

On the other hand, the auxiliary NMOS switch 36b arranged in the selected row 3a in the non-selected unit column 32b is turned on because an auxiliary control voltage of 6[V] is applied to its gate from an auxiliary MOS power supply line 7b and the writing inhibition gate voltage of 4[V] is applied to its source from the second power supply line 6b so that the writing inhibition gate voltage can be applied from its drain to the non-selected word line 15b. Thus, the writing inhibition gate voltage of 4[V] can be applied to the non-selected word line 15b in the selected row 3a in a third area AR3 via the auxiliary NMOS switch 36b.

In the fifth embodiment, in the non-selected unit column 32b, a writing inhibition voltage of 6[V] is applied to a non-selected first bit line L1c and a non-selected second bit line L2c, and 4[V] is applied to the P-type memory well PW2.

Thus, the non-selected memory cell C2 arranged in the selected row 3a in the third area AR3 has its one end and the other end to which the writing inhibition voltage of 6[V] is applied from the non-selected first bit line L1c and the non-selected second bit line L2c and has its control gate to which the writing inhibition gate voltage of 4[V] is applied from the non-selected word line 15b via the auxiliary NMOS switch 36b. Thus, a voltage difference occurring between the control gate and a channel region becomes small. As a result, a quantum tunnel effect is not produced so that no charge can be injected into a charge storage layer from the channel region.

On the other hand, a PMOS switch 8d arranged in a non-selected row 3b in a lower stage of the non-selected unit column 32b is turned off because a first PMOS control voltage of 12[V] is applied to its gate from a common PMOS control line PGb and the off voltage of 6[V] is applied to its source from the first power supply line 5b so that the off voltage can be interrupted, like in the above-mentioned third embodiment. On the other hand, an NMOS switch 9d arranged in the non-selected row 3b in the non-selected unit column 32b is turned on when a first NMOS control voltage of 6[V] is applied to its gate from a common NMOS control line NGb and the writing inhibition gate voltage of 4[V] is applied to its source from the second power supply line 6b so that the writing inhibition gate voltage can be applied from its drain to the non-selected word line 15d.

In this case, the auxiliary NMOS switch 36d arranged in the non-selected row 3b in the non-selected unit column 32b is turned on when the auxiliary control voltage of 6[V] is applied to its gate from the auxiliary MOS power supply line 7b and the writing inhibition gate voltage of 4[V] is applied to its source from the second power supply line 6b so that the writing inhibition gate voltage can be applied from its drain to the non-selected word line 15d. Thus, the writing inhibition gate voltage of 4[V] can be applied to the non-selected word line 15d arranged in the non-selected row 3b in the third area AR3 via the NMOS switch 9d and the auxiliary NMOS switch 36d.

Thus, the non-selected memory cell C2 arranged in the non-selected row 3b in the third area AR3 has its one end and the other end to which the writing inhibition voltage of 6[V] is also applied from the non-selected first bit line L1c and the non-selected second bit line L2c and has its control gate to which the writing inhibition gate voltage of 4[V] is applied from the non-selected word line 15d via the NMOS switch 9d and the auxiliary NMOS switch 36d. Thus, a voltage difference occurring between the control gate and a channel region becomes small. As a result, a quantum tunnel effect is not produced so that no charge can be injected into a charge storage layer from the channel region.

(5-2) Operation and Effect

In the above-mentioned configuration, in the non-volatile semiconductor memory device 51, a similar effect to that in the above-mentioned third embodiment can also be obtained. In the non-volatile semiconductor memory device 51, 0[V] is applied to a P-type well PW1 in the non-selected unit column 32b, and a writing inhibition gate voltage of 4[V] is applied to each of the non-selected word lines 15b, 15d, . . . in the non-selected unit column 32b by respectively turning on the auxiliary NMOS switches 36b, 36d, . . . during data writing.

In the non-selected unit column 32b, 12[V] is applied to an N-type well NW1 in which the PMOS switches 8b, 8d, . . . are formed during data writing. However, a voltage difference occurring between the drains of the PMOS switches 8b, 8d, . . . and the N-type well NW1 is set to a relatively small value of 8[V] by applying a slightly higher writing inhibition gate voltage of 4[V] to each of the non-selected word lines 15b, 15d, . . . connected to the drains of the PMOS switches 8b, 8d, . . . . Accordingly, voltage loads on the PMOS switches 8b, 8d, . . . are further reduced so that reliabilities of the PMOS switches 8b, 8d, . . . can be improved.

An operation of a switching mechanism in the present embodiment is the same as that in the above-mentioned "(3) Third Embodiment", and hence description thereof is not repeated.

(6) Sixth Embodiment (6-1) Data Writing Operation

Figure 8:
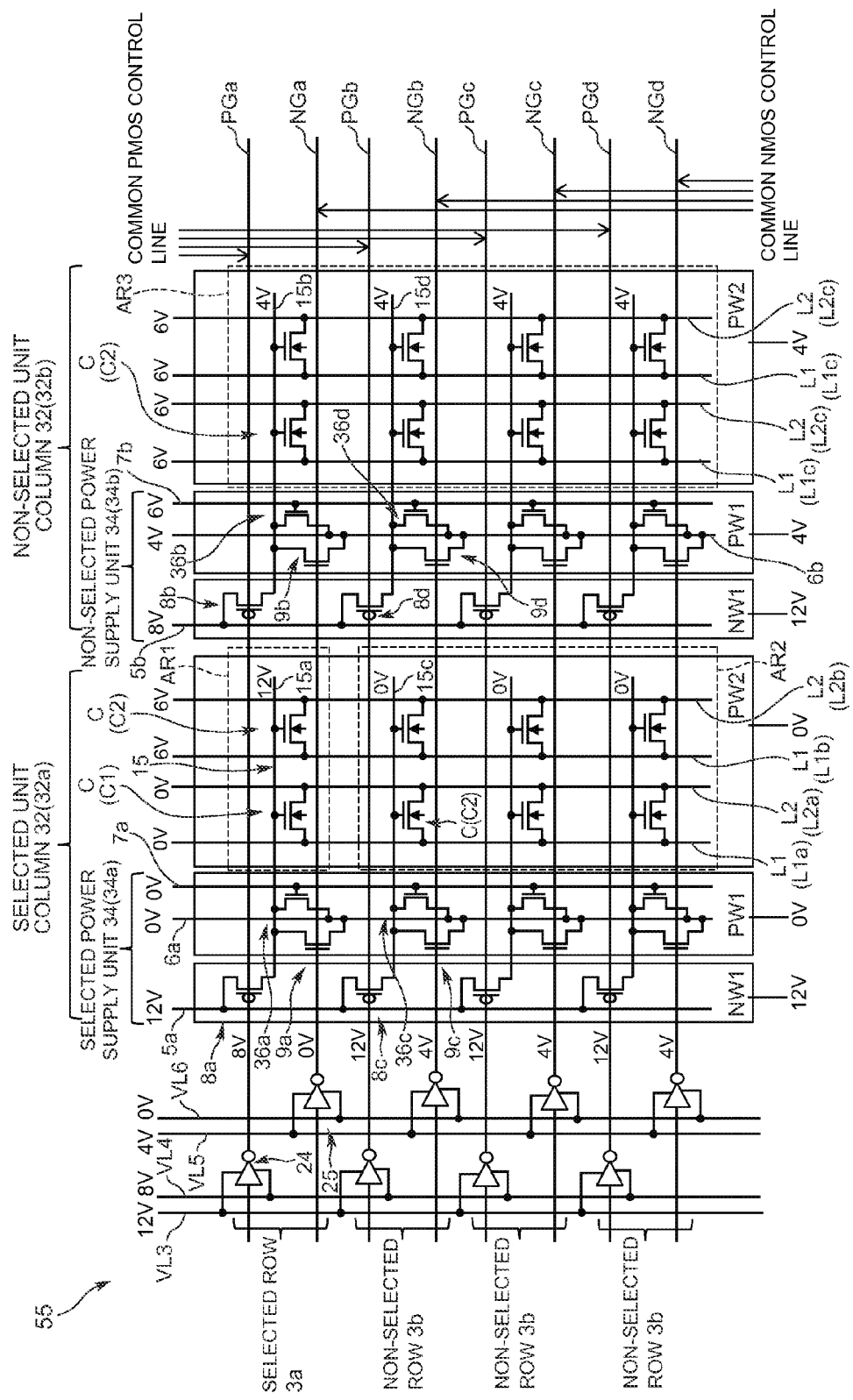
FIG. 8 is a circuit diagram illustrating a circuit configuration of a non-volatile semiconductor memory device according to a sixth embodiment and respective values of voltages applied to portions during data writing.

In FIG. 8 illustrating portions corresponding to those illustrated in FIG. 7 with the same symbols respectively assigned thereto, reference numeral 55 denotes a non-volatile semiconductor memory device according to a sixth embodiment, which has the same circuit configuration as that in the above-mentioned fifth embodiment but differs from the non-volatile semiconductor memory device 51 according to the above-mentioned fifth embodiment in terms of a value of a voltage applied to each of gates of PMOS switches 8a, 8c, . . . (8b, 8d, . . . ) and NMOS switches 9a, 9c, . . . (9b, 9d, . . . ) and each of values of voltages in a non-selected unit column 32b during data writing.

FIG. 8 illustrates respective values of voltages applied to portions when a memory cell C in the first row and the first column in a first unit column 32 among a plurality of memory cells C is taken as a selected memory cell C1 into which data is written and all the other memory cells C are taken as non-selected memory cells C2 like in the above-mentioned fifth embodiment. In this case, a first PMOS control voltage of 12[V] is applied to a first PMOS power supply line VL3, like in the above-mentioned fifth embodiment, while a second PMOS control voltage of 8[V], which is higher than that in the above-mentioned fifth embodiment, is applied to a second PMOS power supply line VL4. A voltage difference between the first PMOS control voltage and the second PMOS control voltage is set to 4[V] that is smaller than that in the above-mentioned fifth embodiment.

Thus, to common PMOS control lines PGa to PGd each connected to the first PMOS power supply line VL3 and the second PMOS power supply line VL4 via a first inverter circuit 24, the first PMOS control voltage of 12 [V] is applied by the first inverter circuits 24 in non-selected rows 3b and the second PMOS control voltage of 8 [V] is applied by the first inverter circuit 24 in a selected row 3a. Thus, a voltage amplitude between the voltage applied to the common PMOS control line PGa in the selected row 3a and the voltage applied to the common PMOS control line PGb to PGd in the non-selected rows 3b is set to 4 [V](i.e., 12 [V]–8 [V]) so that the voltage amplitude can be reduced. Thus, the voltage amplitude between the voltages at the gates of the PMOS switches 8a, 8c, . . . (8b, 8d, . . . ) respectively connected to the common PMOS control lines PGa to PGd in the selected row 3a and the non-selected rows 3b can be reduced. Accordingly, a gate insulating film can further be thinned.

On the other hand, a second NMOS control voltage of 0 [V] is applied, like in the above-mentioned fifth embodiment, to a second NMOS power supply line VL6 while a first NMOS control voltage of 4 [V], which is lower than that in the above-mentioned fifth embodiment, is applied to a first NMOS power supply line VL5. A voltage difference between the first NMOS control voltage and the second NMOS control voltage is set to 4 [V] that is smaller than that in the above-mentioned fifth embodiment.

Thus, to common NMOS control lines NGa to NGd each connected to the first NMOS power supply line VL5 and the second NMOS power supply line VL6 via a second inverter circuit 25, the first NMOS control voltage of 4 [V] is applied by the second inverter circuits 25 in the non-selected rows 3b while the second NMOS control voltage of 0 [V] is applied by the second inverter circuit 25 in the selected row 3a. Thus, a voltage amplitude between the voltage applied to the common NMOS control line NGa in the selected row 3a and the voltage applied to the common NMOS control lines NGb to NGd in the non-selected rows 3b can be set to 4 [V](i.e., 4 [V]–0 [V]) so that the voltage amplitude can be reduced. Thus, the voltage amplitude at the gates of the NMOS switches 9a, 9c (9b, 9d) respectively connected to the common NMOS control lines NGa to NGd in the selected row 3a and the non-selected rows 3b can be reduced. Accordingly, a gate insulating film can further be thinned.

(6-1-1) As to First Area

When a first area AR1 is first paid attention to, in a selected power supply unit 34a in a selected unit column 32a, a writing gate voltage of 12[V] is applied to a first power supply line 5a, and a writing inhibition gate voltage of 0[V] is applied to the other second power supply line 6a, like in the above-mentioned fifth embodiment. In this case, in the selected row 3a in which the selected memory cell C1 is arranged, the first inverter circuit 24 applies the second PMOS control voltage of 8[V] on the second PMOS power supply line VL4 to the common PMOS control line PGa.

Thus, the PMOS switch 8a arranged in the selected row 3a in the selected unit column 32a is turned on when the second PMOS control voltage of 8[V] is applied to its gate from the common PMOS control line PGa and the writing gate voltage of 12[V] is applied to its source from the first power supply line 5a so that the writing gate voltage of 12[V] can be applied from its drain to a selected word line 15a. Thus, in the first area AR1, the selected memory cell C1 connected to a selected first bit line L1a and a selected second bit line L2a has its one end and the other end to which a writing voltage of 0[V] is applied from the selected first bit line L1a and the selected second bit line L2a and has its control gate to which the writing gate voltage of 12[V] is applied from the selected word line 15a via the PMOS switch 8a. Thus, a voltage difference occurring between the control gate and a channel region becomes large. As a result, a quantum tunnel effect is produced so that a charge can be injected into a charge storage layer from the channel region.

Thus, the non-volatile semiconductor memory device 55 according to the sixth embodiment can set, when the PMOS switch 8a is turned on in the selected row 3a in the selected unit column 32a, a voltage difference between the second PMOS control voltage (8[V]) applied to the gate of the PMOS switch 8a and the writing gate voltage (12[V]) applied to the source thereof to 4[V] that is much smaller than that in the fifth embodiment.

The non-selected memory cell C2 connected to a non-selected first bit line L1b and a non-selected second bit line L2b in the first area AR1 has its one end and the other end to which a writing inhibition voltage of 6[V] is applied from the non-selected first bit line L1b and the non-selected second bit line L2b, like in the above-mentioned fifth embodiment. Even if the writing gate voltage of 12[V] is applied to a control gate of the non-selected memory cell C2 from the selected word line 15a, therefore, a voltage difference occurring between the control gate and a channel region becomes small. As a result, a quantum tunnel effect is not produced so that no charge can be injected into a charge storage layer from the channel region.

In this case, in the selected row 3a, the second inverter circuit 25 applies the second NMOS control voltage of 0[V] on the second NMOS power supply line VL6 to the common NMOS control line NGa. Thus, the NMOS switch 9a arranged in the selected row 3a in the selected unit column 32a is turned off when the second NMOS control voltage of 0[V] is applied to its gate from the common NMOS control line NGa and the writing inhibition gate voltage of 0[V] is applied to its source from the second power supply line 6a so that the writing inhibition gate voltage can be interrupted.

An auxiliary NMOS switch 36a arranged in the selected row 3a in the selected unit column 32a is turned off because an auxiliary control voltage of 0[V] is applied to its gate from an auxiliary MOS power supply line 7a and a writing inhibition gate voltage of 0[V] is applied to its source from the second power supply line 6a so that the writing inhibition gate voltage can be interrupted, like in the above-mentioned fifth embodiment. Thus, the writing gate voltage of 12[V] can be applied to the selected word line 15a in the first area AR1 via the PMOS switch 8a.

(6-1-2) As to Second Area

A second area AR2 including non-selected rows 3b in the selected unit column 32a is then paid attention to. In this case, in the non-selected rows 3b in which only the non-selected memory cells C2 are arranged, the first inverter circuits 24 respectively apply the first PMOS control voltage of 12[V] on the first PMOS power supply line VL3 to the common PMOS control lines PGb, PGc, and PGd. Thus, the PMOS switch 8c arranged in the non-selected row 3b in the selected unit column 32a is turned off when the first PMOS control voltage of 12[V] is applied to its gate from the common PMOS control line PGb and the writing gate voltage of 12[V] is applied to its source from the first power supply line 5a so that the writing gate voltage can be interrupted.

In this case, in the non-selected rows 3b, the second inverter circuits 25 respectively apply the first NMOS control voltage of 4[V] on the first NMOS power supply line VL5 to the common NMOS control lines NGb, NGc, and NGd. Thus, the NMOS switch 9c arranged in the non-selected row 3b in the selected unit column 32a is turned on when the first NMOS control voltage of 4[V] is applied to its gate from the common NMOS control line NGb and the writing inhibition gate voltage of 0[V] is applied to its source from the second power supply line 6a so that the writing inhibition gate voltage of 0[V] can be applied from its drain to a non-selected word line 15c.

Thus, the non-volatile semiconductor memory device 55 according to the sixth embodiment can set, when the NMOS switch 9c is turned on in the non-selected row 3b in the selected unit column 32a, a voltage difference between the first NMOS control voltage (4[V]) applied to the gate of the NMOS switch 9c and the writing inhibition gate voltage (0[V]) applied to the source thereof to 4[V] that is much smaller than that in the fifth embodiment.

Thus, in the second area AR2, the non-selected memory cell C2 connected to the selected first bit line L1a and the selected second bit line L2a has its one end and the other end to which the writing voltage of 0[V] is applied from the selected first bit line L1a and the selected second bit line L2a while having its control gate to which the writing inhibition gate voltage of 0[V] is similarly applied from the non-selected word line 15c via the NMOS switch 9c. Thus, the control gate and a channel region have the same voltage. As a result, a quantum tunnel effect is not produced so that no charge can be injected into a charge storage layer from the channel region.

In the second area AR2, the non-selected memory cell C2 connected to the non-selected first bit line L1b and the non-selected second bit line L2b has its one end and the other end to which the writing inhibition voltage of 6[V] is also applied from the non-selected first bit line L1b and the non-selected second bit line L2b and has its control gate to which the writing inhibition gate voltage of 0[V] is applied from the non-selected word line 15c. As a result, a quantum tunnel effect is not produced so that no charge is injected into a charge storage layer from the channel region.

The auxiliary NMOS switch 36c arranged in the non-selected row 3b in the selected unit column 32a is turned off because the auxiliary control voltage of 0[V] is applied to its gate from the auxiliary MOS power supply line 7a and the writing inhibition gate voltage of 0[V] is applied to its source from the second power supply line 6a so that the writing voltage can be interrupted. Thus, the writing inhibition gate voltage of 0[V] can be applied to the non-selected word line 15c in the second area AR2 via the NMOS switch 9c.

(6-1-3) As to Third Area

A third area AR3 in the non-selected unit column 32b is then paid attention to. In this case, in a non-selected power supply unit 34b in the non-selected unit column 32b, an off voltage of 8[V] is applied to a first power supply line 5b and a wiring inhibition gate voltage of 4[V] is applied to the other second power supply line 6b. In this case, in the selected row 3a, the first inverter circuit 24 applies the second PMOS control voltage of 8[V] on the second PMOS power supply line VL4 to the common PMOS control line PGa. Thus, the PMOS switch 8b arranged in the selected row 3a in the non-selected unit column 32b is turned off when the second PMOS control voltage of 8[V] is applied to its gate from the common PMOS control line PGa and the off voltage of 8[V] is applied to its source from the first power supply line 5b so that the off voltage can be interrupted.

In this case, in the selected row 3a, the second inverter circuit 25 applies the second NMOS control voltage of 0[V] on the second NMOS power supply line VL6 to the common NMOS control line NGa. Thus, the NMOS switch 9b arranged in the selected row 3a in the non-selected unit column 32b is turned off when the second NMOS control voltage of 0[V] is applied to the gate from the common NMOS control line NGa and the writing inhibition gate voltage of 4[V] is applied to its source from the second power supply line 6b so that the writing inhibition gate voltage can be interrupted.

In this non-selected unit column 32b, 4[V] is applied to a P-type well PW1, and an auxiliary control voltage of 6[V] is applied to an auxiliary MOS power supply line 7b. Thus, an auxiliary NMOS switch 36b arranged in the selected row 3a in the non-selected unit column 32b is turned on when the auxiliary control voltage of 6[V] is applied to its gate from the auxiliary MOS power supply line 7b and the writing inhibition gate voltage of 4[V] is applied to its source from the second power supply line 6b so that the writing inhibition gate voltage can be applied from its drain to a non-selected word line 15b. Thus, the writing inhibition gate voltage of 4[V] can be applied to the non-selected word line 15b arranged in the selected row 3a in the third area AR3 via the auxiliary NMOS switch 36b.

In the present embodiment, in the non-selected unit column 32b, a writing inhibition voltage of 6[V] is applied to a non-selected first bit line L1c and a non-selected second bit line L2c, and 4[V] is applied to a P-type memory well PW2. Thus, the non-selected memory cell C2 arranged in the selected row 3a in the third area AR3 has its one end and the other end to which the writing inhibition voltage of 6[V] is applied from the non-selected first bit line L1c and the non-selected second bit line L2c and has its control gate to which the writing inhibition gate voltage of 4[V] is applied from the auxiliary NMOS switch 36b via the non-selected word line 15b. Thus, a voltage difference occurring between the control gate and a channel region becomes small. As a result, a quantum tunnel effect is not produced so that no charge can be injected into a charge storage layer from the channel region.

On the other hand, in the non-selected rows 3b, the first inverter circuits 24 respectively apply the first PMOS control voltage of 12[V] on the first PMOS power supply line VL3 to the common PMOS control lines PGb, PGc, and PGd. Thus, the PMOS switch 8d arranged in the non-selected row 3b in the non-selected unit column 32b is turned off when the first PMOS control voltage of 12[V] is applied to its gate from the common PMOS control line PGb and the off voltage of 8[V] is applied to its source from the first power supply line 5b so that the off voltage can be interrupted.

In this case, in the non-selected rows 3b, the second inverter circuits 25 respectively apply the first NMOS control voltage of 4[V] on the first NMOS power supply line VL5 to the common NMOS control lines NGb, NGc, and NGd. Thus, the NMOS switch 9d arranged in the non-selected row 3b in the non-selected unit column 32b is turned off when the first NMOS control voltage of 4[V] is applied to its gate from the common NMOS control line NGb and the writing inhibition gate voltage of 4[V] is applied to its source from the second power supply line 6b so that the writing inhibition gate voltage can be interrupted.

On the other hand, an auxiliary NMOS switch 36d arranged in the non-selected row 3b in the non-selected unit column 32b is turned on because the auxiliary control voltage of 6[V] is applied to its gate from the auxiliary MOS power supply line 7b and the writing inhibition gate voltage of 4[V] is applied to its source from the second power supply line 6b so that the writing inhibition gate voltage can be applied from its drain to a non-selected word line 15d. Thus, the writing inhibition gate voltage of 4[V] can be applied to the non-selected word line 15d arranged in the non-selected row 3b in the third area AR3 via the auxiliary NMOS switch 36d.

Thus, in the non-selected row 3b in the third area AR3, the non-selected memory cell C2 connected to the non-selected first bit line L1c and the non-selected second bit line L2c has its one end and the other end to which the writing inhibition voltage of 6[V] is applied from the non-selected first bit line L1c and the non-selected second bit line L2c and has its control gate to which the writing inhibition gate voltage of 4[V] is applied from the auxiliary NMOS switch 36d via the non-selected word line 15d. Thus, a voltage difference occurring between the control gate and a channel region becomes small. As a result, a quantum tunnel effect is not produced so that no charge can be injected into a charge storage layer from the channel region.

Thus, the non-volatile semiconductor memory device 55 according to the sixth embodiment can set, when the auxiliary NMOS switches 36b and 36d are respectively turned on in the selected row 3a and the non-selected row 3b in the non-selected unit column 32b, a voltage difference between the auxiliary control voltage (6[V]) applied to the gates of the auxiliary NMOS switches 36b and 36d and the writing inhibition gate voltage (4[V]) applied to the sources thereof to 4[V] or less that is much smaller than that in the fifth embodiment.

(6-2) Operation and Effect

In the above-mentioned configuration, in the non-volatile semiconductor memory device 55, a similar effect to that of the above-mentioned third embodiment can also be obtained. In the non-volatile semiconductor memory device 55 according to the sixth embodiment, the PMOS switches 8b, 8d, . . . and the NMOS switches 9b, 9d, . . . need not necessarily be turned on in the non-selected unit column 32b. Thus, in the selected unit column 32a, control voltage values respectively required to turn on or off the PMOS switches 8a, 8c, . . . and the NMOS switches 9a and 9c . . . can be freely set. Therefore, a maximum voltage difference between the control voltages respectively required to turn on or off the PMOS switches 8a, 8c, . . . , the NMOS switches 9a, 9c, . . . , and the auxiliary NMOS switches 36a, 36c, . . . (36b, 36d, . . . ) can be set to 4[V] or less that is much lower than that in the third embodiment, for example.

Thus, in the non-volatile semiconductor memory device 55, a voltage difference occurring when the PMOS switches 8a, 8c, . . . (8b, 8d, . . . ), the NMOS switches 9a, 9c, . . . (9b, 9d, . . . ), and the auxiliary NMOS switches 36a, 36c, . . . (36b, 36d, . . . ) are respectively turned on or off can be set to 4 [V] or less. Accordingly, the PMOS switches 8a, 8c, . . . (8b, 8d, . . . ), the NMOS switches 9a, 9c, . . . (9b, 9d, . . . ), and the auxiliary NMOS switches 36a, 36c, . . . (36b, 36d, . . . ) each having a gate insulating film the film thickness of which is further decreased to 8[nm] can be used.

In the non-selected unit column 32b, 12[V] is also applied to an N-type well NW1 in which the PMOS switches 8b, 8d, . . . are formed during data writing. However, a voltage difference occurring between the drains of the PMOS switches 8b, 8d, . . . and the N-type well NW1 is set to a relatively small value of 8[V] by applying a slightly higher writing inhibition gate voltage of 4[V] to each of the non-selected word lines 15b, 15d, . . . connected to the drains of the PMOS switches 8b, 8d, . . . . Accordingly, voltage loads on the PMOS switches 8b, 8d, . . . are further reduced so that reliabilities of the PMOS switches 8b, 8d, . . . can be improved.

An operation of a switching mechanism in the present embodiment is substantially the same as that in the above-mentioned "(3) Third Embodiment". However, in the non-selected power supply unit 34b having only the non-selected word lines on which only the non-selected memory cells C2 are arranged among the power supply units 34, when the NMOS switch 9d, sharing the common NMOS control line NGb with the NMOS switch 9c, which applies a writing inhibition gate voltage (charge storage inhibition gate voltage) to the non-selected word line 15c in the power supply unit 34 in the other column, exists, the NMOS switch 9d and the PMOS switch 8d are turned off, and the auxiliary NMOS switch 36d paired with the NMOS switch 9d is turned on, to apply a writing inhibition gate voltage (charge storage inhibition gate voltage), which has been applied to the source of the auxiliary NMOS switch 36d from the second power supply line 6b, to the non-selected word line 15d from the drain of the auxiliary NMOS switch 36d. Thus, in the non-volatile semiconductor memory device 55, a charge can be stored in only the memory cell C at a predetermined position.

(7) Seventh Embodiment (7-1) Data Writing Operation

Figure 9:
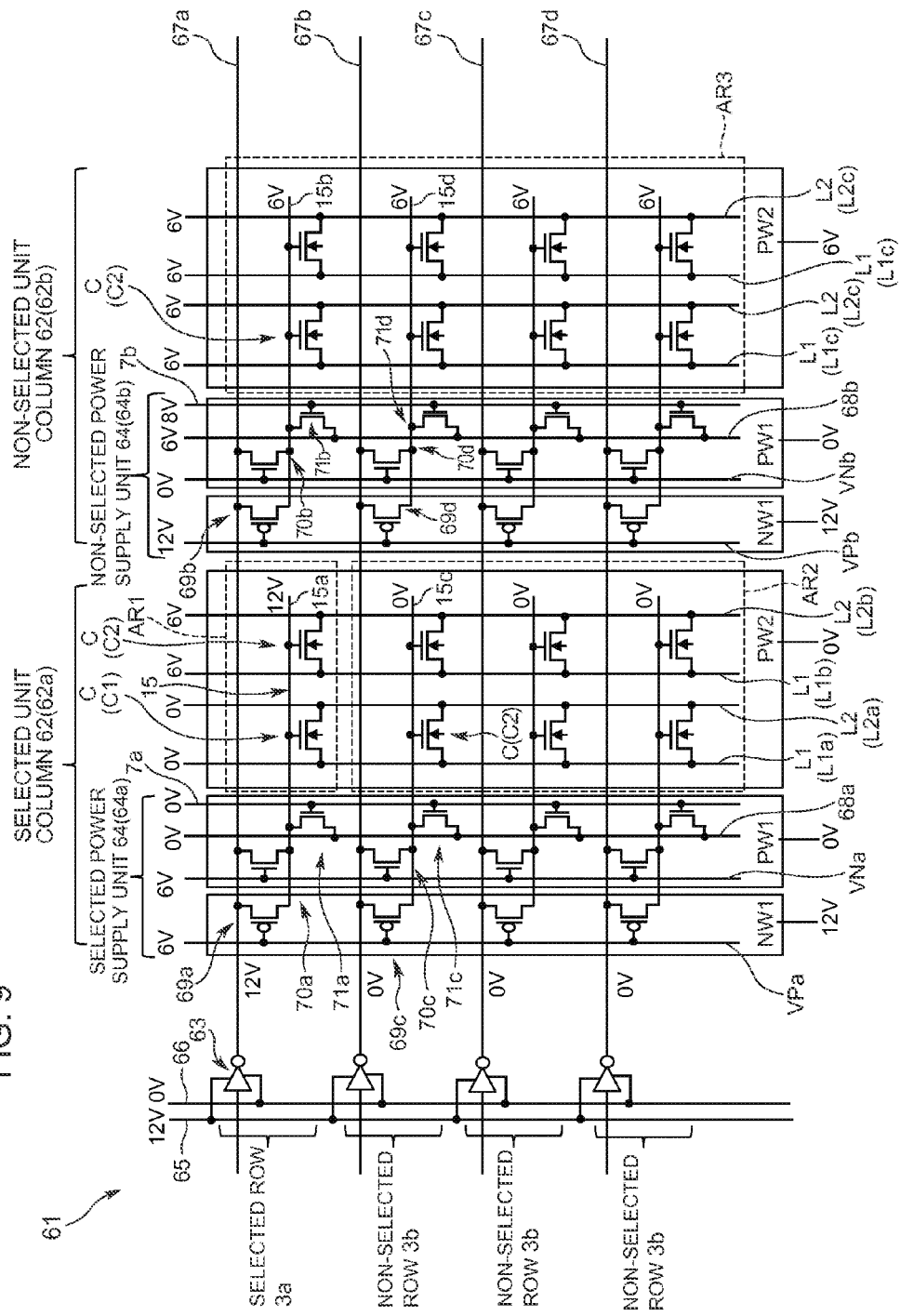
FIG. 9 is a circuit diagram illustrating a circuit configuration of a non-volatile semiconductor memory device according to a seventh embodiment and respective values of voltages applied to portions during data writing.

In FIG. 9 illustrating portions corresponding to those illustrated in FIG. 4 with the same symbols respectively assigned thereto, reference numeral 61 denotes a non-volatile semiconductor memory device according to a seventh embodiment. Besides being characterized in that auxiliary NMOS switches 71a, 71c, . . . (71b, 71d, . . . ) are provided in addition to PMOS switches 69a, 69c, . . . (69b, 69d, . . . ) and NMOS switches 70a, 70c, . . . (70b, 70d, . . . ), the non-volatile semiconductor memory device 61 is characterized in that a PMOS power supply line VPa (VPb) and an NMOS power supply line VNa (VNb) extending in a column direction are provided as a unit wiring for each unit column 62, and in that a plurality of common power supply lines 67a, 67b, 67c, and 67d extending in a row direction are provided as a common wiring and the common power supply lines 67a to 67d connect power supply units 64 to each other. FIG. 9 illustrates respective values of voltages applied to portions when a memory cell C in the first row and the first column in the first unit column 62 among a plurality of memory cells C is taken as a selected memory cell C1 into which data is written and all the other memory cells C are taken as non-selected memory cells C2.

This non-volatile semiconductor memory device 61 is configured so that a first power supply line 65 and a second power supply line 66 are arranged to run parallel to each other and the first power supply line 65 and the second power supply line 66 are common among the plurality of power supply units 64. In practice, a plurality of inverter circuits 63 are common between and connected to the first power supply line 65 and the second power supply line 66, and the common power supply lines 67a to 67d are respectively connected to output portions of the inverter circuits 63. The inverter circuits 63 can each select either one of a writing gate voltage of 12[V] applied to the first power supply line 65 and a writing inhibition gate voltage of 0[V] applied to the second power supply line 66 for each row and respectively apply the selected gate voltage to the common power supply lines 67a to 67d.

In an N-type well NW1 in the power supply unit 64, the PMOS power supply line VPa (VPb) extending in the column direction is formed, and the plurality of PMOS switches 69a, 69c, ... (69b, 69d, ...) are formed along the PMOS power supply line VPa (VPb). In practice, the PMOS switch 69a has its gate connected to the PMOS power supply line VPa and its source connected to the common power supply line 67a. The PMOS switch 69a, for example, has its drain connected to a word line 15, and is turned on so that a writing gate voltage applied to the common power supply line 67a can be applied from the drain to the word line 15.

On the other hand, in a P-type well PW1 in the power supply unit 64, the NMOS power supply line VNa (VNb) extending in the column direction is formed, and the plurality of NMOS switches 70a, 70c, ... (70b, 70d, ...) are formed along the NMOS power supply line VNa (VNb). In practice, the NMOS switch 70a has its gate connected to the NMOS power supply line VNa and its source connected to the common power supply line 67a. The NMOS switch 70c, for example, has its drain connected to a word line 15, and is turned on so that a writing inhibition gate voltage applied to the common power supply line 67b can be applied from the drain to a non-selected word line 15c. During data writing, 12[V] can be applied to the N-type wells NW1 in both the selected unit column 62a and the non-selected unit column 62b.

In the P-type well PW1 in the power supply unit 64, a third power supply line 68a (68b) and an auxiliary MOS power supply line 7a (7b) are formed to run parallel to the NMOS power supply line VNa (VNb), and the plurality of auxiliary NMOS switches 71a, 71c, ... (71b, 71d, ...) are formed along the third power supply line 68a (68b) and the auxiliary MOS power supply line 7a (7b). The auxiliary NMOS switches 71a, 71c, ... (71b, 71d, ...) have their respective gates connected to the auxiliary MOS power supply line 7a (7b) and have their respective sources connected to the third power supply line 68a (68b). Each of the auxiliary NMOS switches 71a, 71c, ... (71b, 71d, ...) has its drain connected to the word line 15. The auxiliary NMOS switches 71b and 71d, for example, are turned on so that a writing inhibition gate voltage applied to the third power supply line 68b can be applied from the drains, respectively, to the non-selected word lines 15b and 15d. During data writing, 0[V] can be applied to the P-type wells PW1 in both the selected unit column 62a and the non-selected unit column 62b.

In a p-type memory wells PW2, a plurality of word lines 15 extending in the row direction are arranged with predetermined spacing in the column direction as described above. The memory cells C in the same row have their respective control gates connected to the respective word lines 15. The P-type memory well PW2 includes first bit lines L1 and second bit lines L2 extending in the column direction, and has a configuration in which the one first bit line L1 and the second bit line L2 adjacent to the first bit line L1 are paired with each other and the plurality of memory cells C are arranged in parallel between the first bit line L1 and the second bit line L2 that run parallel to each other. The first bit line L1 is connected to one end of each of the memory cells C while the second bit line L2 is connected to the other end thereof. A writing voltage or a writing inhibition voltage, for example, can be applied to the one end and the other end, respectively, from the first bit line L1 and the second bit line L2.

(7-1-1) As to First Area

After description is first made by paying attention to a first area AR1, a second area AR2 and a third area AR3 will be described in this order. In this case, in a selected row 3a in which the selected memory cell C1 is arranged, the inverter circuit 63 connected to the first power supply line 65 and the second power supply line 66 applies the writing gate voltage of 12[V] on the first power supply line 65 as a common voltage to the common power supply line 67a. In this case, in the selected unit column 62a, a first PMOS control voltage of 6[V] is applied as a unit voltage to the PMOS power supply line VPa so that the first PMOS control voltage can be applied to each of the gates of the PMOS switches 69a, 69c, ....

Thus, the PMOS switch 69a arranged in the selected row 3a in the selected unit column 62a is turned on when the first PMOS control voltage of 6[V] is applied to the gate from the PMOS power supply line VPa and the writing gate voltage of 12[V] is applied to the source from the common power supply line 67a so that the writing gate voltage of 12[V] can be applied from the drain to a selected word line 15a.

In the selected unit column 62a, a writing voltage of 0[V] is applied to a selected first bit line L1a and a selected second bit line L2a. Thus, in the first area AR1, the selected memory cell C1 connected to the selected first bit line L1a and the selected second bit line L2a has its one end and the other end to which the writing voltage of 0[V] is applied from the selected first bit line L1a and the selected second bit line L2a and has its control gate to which the writing gate voltage of 12[V] is applied from the PMOS switch 69a via the selected word line 15a. Thus, a voltage difference occurring between the control gate and a channel region becomes large. As a result, a quantum tunnel effect is produced so that a charge can be injected into a charge storage layer from the channel region.

In the first area AR1, to the non-selected memory cell C2 connected to the non-selected first bit line L1b and the non-selected second bit line L2b, a writing inhibition voltage of 6[V] is applied from the non-selected first bit line L1b and the non-selected second bit line L2b. Even if the writing gate voltage of 12[V] is applied to a control gate of the non-selected memory cell C2 from the selected word line 15a, therefore, a voltage difference occurring between the control gate and a channel region becomes small. As a result, a quantum tunnel effect is not produced so that no charge can be injected into a charge storage layer from the channel region.

In this case, in the selected unit column 62a, a first NMOS control voltage of 6[V] is applied as a unit voltage to the NMOS power supply line VNa. Thus, the NMOS switch 70a arranged in the selected row 3a in the selected unit column 62a is turned off when the first NMOS control voltage of 6[V] is applied to the gate from the NMOS power supply line VNa and the writing gate voltage of 12[V] is applied to the source from the common power supply line 67a so that the writing gate voltage can be interrupted.

In this case, in the selected unit column 62a, an auxiliary control voltage of 0[V] is applied to the auxiliary MOS power supply line 7a. Thus, the auxiliary NMOS switch 71a arranged in the selected row 3a in the selected unit column 62a is turned off when the auxiliary control voltage of 0[V] is applied to the gate from the auxiliary MOS power supply line 7a and the writing inhibition gate voltage of 0[V] is applied to the source from the third power supply line 68a so that the writing inhibition gate voltage can be interrupted. Thus, the writing gate voltage of 12[V] can be applied to the selected word line 15a in the first area AR1 via the PMOS switch 69a.

(7-1-2) As to Second Area

The second area AR2 including non-selected rows 3b in the selected unit column 62a is then paid attention to. In this case, in the non-selected rows 3b in which only the non-selected memory cells C2 are arranged, the inverter circuits 63 respectively apply the writing inhibition gate voltage of 0[V] on the second power supply line 66 as a common voltage to the common power supply lines 67b, 67c, and 67d. Thus, the PMOS switch 69c arranged in the non-selected row 3b in the selected unit column 62a is turned off when the first PMOS control voltage of 6[V] is applied to its gate from the PMOS power supply line VPa and the writing inhibition gate voltage of 0[V] is applied to its source from the common power supply line 67b so that the writing inhibition gate voltage can be interrupted.

On the other hand, the NMOS switch 70c arranged in the non-selected row 3b in the selected unit column 62a is turned on when the first NMOS control voltage of 6[V] is applied to its gate from the NMOS control line VNa and the writing inhibition gate voltage of 0[V] is applied to its source from the common power supply line 67b so that the writing inhibition gate voltage of 0[V] can be applied from its drain to the non-selected word line 15c.

Thus, in the second area AR2, the non-selected memory cell C2 connected to the selected first bit line L1a and the selected second bit line L2a has its one end and the other end to which the writing voltage of 0[V] is applied from the selected first bit line L1a and the selected second bit line L2a while having its control gate to which the writing inhibition gate voltage of 0[V] is similarly applied from the NMOS switch 70c via the non-selected word line 15c. Thus, the control gate and a channel region have the same voltage. As a result, a quantum tunnel effect is not produced so that no charge can be injected into a charge storage layer from the channel region.

Similarly, in the second area AR2, the non-selected memory cell C2 connected to the non-selected first bit line L1b and the non-selected second bit line L2b has its one end and the other end to which the writing inhibition voltage of 6[V] from the non-selected first bit line L1b and the non-selected second bit line L2b and has its control gate to which the writing inhibition gate voltage of 0[V] is applied from the NMOS switch 70c via the non-selected word line 15c. As a result, a quantum tunnel effect is not produced so that no charge is injected into a charge storage layer from a channel region.

The auxiliary NMOS switch 71c arranged in the non-selected row 3b in the selected unit column 62a is turned off when the auxiliary control voltage of 0[V] is applied to the gate from the auxiliary MOS power supply line 7a and the off voltage of 0[V] is applied to the source from the third power supply line 68a so that the off voltage can be interrupted. Thus, the writing inhibition gate voltage of 0[V] can be applied to the non-selected word line 15c in the second area AR2 via the NMOS switch 70c.

(7-1-3) As to Third Area

The third area AR3 in the non-selected unit column 62b is then paid attention to. In this case, in a non-selected power supply unit 64b in the non-selected unit column 62b, a second PMOS control voltage of 12[V] is applied to the PMOS power supply line VPb. In this case, in the selected row 3a, the inverter circuit 63 applies the writing gate voltage of 12[V] on the first power supply line 65 to the common power supply line 67a. Thus, the PMOS switch 69b arranged in the selected row 3a in the non-selected unit column 62b is turned off when the writing gate voltage of 12[V] is applied to its source from the common power supply line 67a while the second PMOS control voltage of 12[V] is applied to its gate from the PMOS power supply line VPb so that the writing gate voltage can be interrupted.

In this case, in the non-selected unit column 62b, a second NMOS control voltage of 0[V] is applied to the NMOS power supply line VNb. Thus, the NMOS switch 70b arranged in the selected row 3a in the non-selected unit column 62b is turned off when the writing gate voltage of 12[V] is applied to its one end from the common power supply line 67a while the second PMOS control voltage of 0[V] is applied to its gate from the NMOS power supply line VNb so that the writing gate voltage can be interrupted.

In the non-selected unit column 62b, an auxiliary control voltage of 8[V] is applied to the auxiliary MOS power supply line 7b, and a writing inhibition gate voltage of 6[V] is applied to the third power supply line 68b. Thus, the auxiliary NMOS switch 71b arranged in the selected row 3a in the non-selected unit column 62b is turned on when the auxiliary control voltage of 8[V] is applied to the gate from the auxiliary MOS power supply line 7b and the writing inhibition gate voltage of 6[V] is applied to the source from the third power supply line 68b so that the writing inhibition gate voltage can be applied from the drain to the non-selected word line 15b. Thus, the writing inhibition gate voltage of 6[V] can be applied to the non-selected word line 15b arranged in the selected row 3a in the third area AR3 via the auxiliary NMOS switch 71b.

In the present embodiment, in the non-selected unit column 62b, a writing inhibition voltage of 6[V] is applied to the non-selected first bit line L1c and the non-selected second bit line L2c, and 6[V] is also applied to the P-type memory well PW2 to match this. Thus, the non-selected memory cell C2 arranged in the selected row 3a in the third area AR3 has its one end and the other end to which the writing inhibition voltage of 6[V] is applied from the non-selected first bit line L1c and the non-selected second bit line L2c and has its control gate to which the writing inhibition gate voltage of 6[V] is applied from the auxiliary NMOS switch 71b via the non-selected word line 15b. Thus, the control gate and a channel region have the same voltage. As a result, a quantum tunnel effect is not produced so that no charge can be injected into a charge storage layer from the channel region.

On the other hand, the PMOS switch 69d arranged in the non-selected row 3b in a lower stage of the non-selected unit column 62b is turned off because the second PMOS control voltage of 12[V] is applied to its gate from the PMOS power supply line VPb and the writing inhibition gate voltage of 0[V] is applied to its source from the common power supply line 67b so that the writing inhibition gate voltage of 0[V] can be interrupted.

In this case, the NMOS switch 70d arranged in the non-selected row 3b in the non-selected unit column 62b is turned off when the second NMOS control voltage of 0[V] is applied to its gate from the NMOS power supply line VNb and the writing inhibition gate voltage of 0[V] is applied to its source from the common power supply line 67b so that the writing inhibition gate voltage of 0[V] can be interrupted.

On the other hand, the auxiliary NMOS switch 71d arranged in the non-selected row 3b in the non-selected unit column 62b is turned on because the auxiliary control voltage of 8[V] is applied to the gate from the auxiliary MOS power supply line 7b and the writing inhibition gate voltage of 6[V] is applied to the source from the third power supply line 68b so that the writing inhibition gate voltage of 6[V] can be applied from the drain to the non-selected word line 15d. Thus, the writing inhibition gate voltage of 6[V] can also be applied to the non-selected word line 15d arranged in the non-selected row 3b in the third area AR3 via the auxiliary NMOS switch 71d.

Thus, the non-selected memory cell C2 arranged in the non-selected row 3b in the third area AR3 has its one end and the other end to which the writing inhibition voltage of 6[V] is applied from the non-selected first bit line L1c and the non-selected second bit line L2c and has its control gate to which the writing inhibition gate voltage of 6[V] is applied from the auxiliary NMOS switch 71d via the non-selected word line 15d. Thus, the control gate and a channel region have the same voltage. As a result, a quantum tunnel effect is not produced so that no charge can be injected into a charge storage layer from the channel region.

(7-2) Operation and Effect

In the above-mentioned configuration, the non-volatile semiconductor memory device 61 includes the plurality of word lines 15 formed in a matrix, the plurality of memory cells C connected to the respective word lines 15, the first bit lines L1 and the second bit lines L2 each capable of applying a selective voltage to the plurality of memory cells C, and the plurality of power supply units 64 provided to respectively correspond to word line columns. The PMOS switches 69a, 69c, . . . (69b, 69d, . . . ), the NMOS switches 70a, 70c, . . . (70b, 70d, . . . ), and the auxiliary NMOS switches 71a, 71c, . . . (71b, 71d, . . . ) are provided in each of the power supply units 64 to respectively correspond to the word lines 15, and the common power supply lines 67a to 67d respectively connect the sources of the PMOS switches 69a and 69b, 69c and 69d, . . . and the NMOS switches 70a and 70b, 70c and 70d, . . . in the same row in the power supply unit 64.

The power supply unit 64 includes the PMOS power supply line VPa (VPb) connected to the gates of the PMOS switches 69a, 69c, . . . (69b, 69d, . . . ) in the same column and the NMOS power supply line VNa (VNb) connected to the gates of the NMOS switches 70a, 70c, . . . (70b, 70d, . . . ) in the same column, so as to respectively connect the drains of the PMOS switches 69a, 69c, . . . (69b, 69d, . . . ) and the NMOS switch 70a, 70c, . . . (70b, 70d, . . . ) to the word lines 15. Further, each of the power supply units 64 includes the auxiliary MOS power supply line 7a (7b) and the third power supply line 68a (68b) extending in the column direction, and the third power supply line 68a (68b) is connected to the word lines 15, respectively, via the auxiliary NMOS switches 71a, 71c, . . . (71b, 71d, . . . ).

During data writing, in the selected power supply unit 64a, the PMOS switch 69a is turned on due to a voltage difference occurring between the PMOS power supply line VPa and the common power supply line 67a in the selected row 3a, to apply a writing gate voltage to the selected word line 15a while the NMOS switch 70c is turned on due to a voltage difference occurring between the NMOS power supply line VNa and the common power supply line 67b, to apply a writing inhibition gate voltage to the non-selected word line 15c. On the other hand, during data writing, in the non-selected power supply unit 64b, in the selected row 3a and the non-selected row 3b, the auxiliary NMOS switches 71b, 71d, . . . are turned on due to a voltage difference occurring between the auxiliary MOS power supply line 7b and the third power supply line 68b, to apply a writing inhibition gate voltage to all the non-selected word lines 15b, 15d, . . . .

Thus, in the non-selected power supply unit 64b, the auxiliary NMOS switches 71b, 71d, . . . are independently turned on without being constrained by the selected power supply unit 64a so that a writing inhibition gate voltage applied to the third power supply line 68b can be applied to all the non-selected word lines 15b, 15d, . . . separately from the selected power supply unit 64a. Thus, in the non-volatile semiconductor memory device 61, a value of a writing inhibition gate voltage, a value of a voltage applied to the P-type memory well PW2 at that time, and values of voltages applied to the non-selected first bit line L1c and the non-selected second bit line L2c can be respectively freely set, without being constrained by the selected power supply unit 64a in the one word line column, to voltage values at which occurrence of disturbance can be suppressed in the non-selected memory cells C2, for example, in the non-selected power supply unit 64b in the other word line column.

In the present embodiment, in the non-selected power supply unit 64b, a writing inhibition gate voltage applied to the non-selected word lines 15b, 15d, . . . can be set to a low voltage of 6[V], and all a value of a voltage applied to the p-type memory well PW2 and values of voltages applied to the non-selected first bit line L1c and the non-selected second bit line L2c can be set to the same voltage of 6[V]. Even if an operation for writing data into the selected memory cell C1 in the selected unit column 62a is repeated, occurrence of disturbance can be suppressed without affecting each of the non-selected memory cells C2 in the non-selected unit column 62b.

In the non-volatile semiconductor memory device 61, control voltages to be respectively applied to the PMOS power supply line VPa (VPb) and the NMOS power supply line VNa (VNb) can be freely set in a range in which the PMOS switches 69a, 69c, . . . and the NMOS switches 70a, 70c, . . . can be turned on, as needed in the selected power supply unit 64a. Thus, in this non-volatile semiconductor memory device 61, a voltage difference between the control voltages respectively applied to the PMOS power supply line VPa (VPb) and the NMOS power supply line VNa (VNb) in the selected power supply unit 64a and the non-selected power supply unit 64b can be set to a relatively low voltage of 6[V]. Thus, a voltage load on each of the gates of the PMOS switches 69a, 69c, . . . and the NMOS switches 70b, 70c, . . . can be reduced. Accordingly, a gate oxide film can further be thinned.

In the non-volatile semiconductor memory device 61, the PMOS power supply line VPa (VPb) and the NMOS power supply line VNa (VNb) are individually provided, respectively, for each of the power supply units 64. However, the plurality of common power supply lines 67a to 67d connect the power supply units 64 to each other.

Hence, values of voltages applied to the common power supply lines 67a to 67d are adjusted for the rows to turn on or off the PMOS switches 69a, 69c, . . . (69b, 69d, . . . ), the NMOS switches 70a, 70c, . . . (70b, 70d, . . . ), and the auxiliary NMOS switches 71a, 71c, . . . (71b, 71d, . . . ), as needed, so that the selected word line 15a can be selectively determined among all the word lines 15. Thus, the non-volatile semiconductor memory device 61 can also be miniaturized, like in the conventional technique, because independent row-direction address decoders need not be respectively provided for the word line columns (P-type memory wells PW2).

To summarize an operation of a switching mechanism below, in the selected power supply unit 64a to which the selected word line 15a on which the selected memory cell C1 exists is connected among the power supply units 64, when the NMOS switch 70a having the source to which a writing gate voltage (charge storage gate voltage) is applied from the common power supply line 67a and the auxiliary NMOS switch 71a connected to the third power supply line 68a are turned off, and the PMOS switch 69a having the source to which a writing gate voltage (charge storage gate voltage) is applied from the common power supply line 67a is turned on, to apply a writing gate voltage (charge storage gate voltage) to the selected word line 15a from the drain of the PMOS switch 69a.

In the selected power supply unit 64a to which the selected word line 15a on which the selected memory cell C1 exists is connected among the power supply units 64, when a writing inhibition gate voltage (charge storage inhibition gate voltage) is applied to the non-selected word line 15c on which only the non-selected memory cells C2 are arranged, the PMOS switch 69c having the source to which a writing inhibition gate voltage (charge storage inhibition gate voltage) is applied from the common power supply line 67b and the auxiliary NMOS switch 71c connected to the third power supply line 68a are turned off, and the NMOS switch 70c having the source to which a writing inhibition gate voltage (charge storage inhibition gate voltage) is applied from the common power supply line 67b is turned on, to apply a writing inhibition gate voltage (charge storage inhibition gate voltage) to the non-selected word line 15c from the drain of the NMOS switch 70c.

In the non-selected power supply unit 64b having only the non-selected word line on which only the non-selected memory cells C2 are arranged among the power supply units 64, when the PMOS switch 69b, sharing the common power supply line 67a with the PMOS switch 69a, which applies a writing gate voltage (charge storage gate voltage) to the selected word line 15a in the power supply unit 64 in the other column, exists, the PMOS switch 69b and the NMOS switch 70b are turned off, and the auxiliary NMOS switch 71b paired therewith is turned on, to apply a writing inhibition gate voltage (charge storage inhibition gate voltage), which has been applied to the source of the auxiliary NMOS switch 71b from the third power supply line 68b, to the non-selected word line 15b from the drain of the auxiliary NMOS switch 71b.

In the non-selected power supply unit 64b having only the non-selected word line on which only the non-selected memory cells C2 are arranged among the power supply units 64, when the NMOS switch 70d, sharing the common power supply line 67b with the NMOS switch 70c, which applies a writing inhibition gate voltage (charge storage inhibition gate voltage) to the non-selected word line 15c in the power supply unit 64 in the other column, exists, the NMOS switch 70d and the PMOS switch 69d are turned off, and the auxiliary NMOS switch 71d paired therewith is turned on, to apply a writing inhibition gate voltage (charge storage inhibition gate voltage), which has been applied to the source of the auxiliary NMOS switch 71d from the third power supply line 68b, to the non-selected word line 15d from the drain of the auxiliary NMOS switch 71d. Thus, in the non-volatile semiconductor memory device 61, a charge can be stored in only the memory cell C at a predetermined position.

(11) As to Breakdown Voltage Structure of NMOS Switch

The non-volatile semiconductor memory device 21 according to the second embodiment illustrated in FIG. 2 among the above-mentioned first to seventh embodiments is paid attention to as one example, to describe a breakdown voltage structure of NMOS switches 9a, 9c, . . . (9b, 9d, . . . ) in the non-volatile semiconductor memory device 21. In this case, the NMOS switches 9a, 9c, . . . (9b, 9d, . . . ) in each of the power supply units 4 have their respective one ends connected to the second power supply line 6a (6b) and the other ends connected to the word lines 15, and further have their respective gates connected to the common NMOS control lines NGa to NGd.

In the NMOS switches 9a, 9c, . . . (9b, 9d, . . . ), a control voltage of either one of 0[V] and 8[V] is applied to the gates via the common NMOS control lines NGa to NGd and 0[V] is applied to the P-type wells PW1 during data writing and data erasure. Thus, a maximum voltage difference at the gates from the P-type well PW1 can be set to a relatively low voltage of 8[V]. In the NMOS switches 9a, 9c, . . . (9b, 9d, . . . ), a voltage of either one of 0[V] and 6[V] is applied to their sources via the second power supply line 6a (6b) and 0[V] is applied to the P-type well PW1 during data writing and data erasure. Thus, a maximum voltage difference at the sources from the P-type well PW1 can be set to a relatively low voltage of 6[V].

As described above, in the NMOS switches 9a, 9c, . . . (9b, 9d, . . . ), the maximum voltage difference at the gates from the P-type well PW1 is 8[V], and the maximum voltage difference at the sources thereof from the P-type well PW1 is 6[V]. Thus, the NMOS switches 9a, 9c, . . . (9b, 9d, . . . ) may have a breakdown voltage structure of 8[V] that is the maximum voltage difference. Accordingly, a gate insulating film can further be thinned. At the same time, a maximum voltage difference between voltages respectively applied to the common NMOS control lines NGa to NGd and the common PMOS control lines PGa to PGd is 8[V] in the non-volatile semiconductor memory device 21. Thus, a peripheral NMOS transistor used for a peripheral circuit can also have a transistor configuration in which a gate insulating film is thinned to match the maximum voltage difference of 8[V].

However, in the NMOS switches 9a, 9c, . . . (9b, 9d, . . . ), the maximum voltage difference occurring between the gates and the P-type well PW1 and the maximum voltage difference occurring between the sources and the P-type well PW1 are 8[V] while a maximum voltage difference at their drains from the P-type well PW1 is 12[V]. That is, in the NMOS switch in the selected row 3a in the selected unit column 2a among the NMOS switches 9a, 9c, . . . (9b, 9d, . . . ), a writing gate voltage of 12[V] is applied to the selected word line 15a connected to the drain. Thus, the NMOS switch on the drain side needs to have a high breakdown voltage structure to match a high writing gate voltage of 12[V]. Therefore, the non-volatile semiconductor memory device 21 according to the present invention desirably uses NMOS switches 100, 115, 117, 120, 123, 131, and 135 each having a higher breakdown voltage structure on the drain side connected to the word line 15 than that on the source side, as illustrated in FIGS. 10 and 11.

FIGS. 10 and 11 are cross-sectional views illustrating a side sectional configuration of a peripheral NMOS transistor 101 constituting a peripheral circuit and the NMOS switches 100, 115, 117, 120, 123, 131, and 135 (corresponding to the NMOS switches 9a and 9c (9b and 9d) illustrated in FIG. 2)

provided in the non-volatile semiconductor memory device 21. FIGS. 10 and 11 respectively illustrate the NMOS switches 100, 115, 117, 120, and 123 each having a higher breakdown voltage structure on the drain side connected to the word line 15 than that on the source side and having a breakdown voltage structure that is asymmetrical on the drain side and the source side, the NMOS switch 131 having a well concentration that is made low, and the NMOS switch 135 having a gate insulating film the whole of which is thickened. In this case, as illustrated in FIGS. 10 and 11, in the peripheral NMOS transistor 101, a voltage difference on the common NMOS control lines NGa to NGd in the non-volatile semiconductor memory device 21 is set to 8[V] or less. Thus, a voltage difference between voltages applied to match the voltage difference is 8[V]. Therefore, a voltage load is reduced. Accordingly, the gate insulating film 105a can further be thinned.

In practice, in the peripheral NMOS transistor 101, a gate insulating film 105a is provided on a P-type well 102 between a source 103a and a drain 103b, and a channel region is formed between a source-side extension portion 104a at an end of the source 103a and a drain-side extension portion 104b at an end of the drain 103b. The peripheral NMOS transistor 101 has a configuration in which a gate 106a is formed on the channel region in the P-type well 102 serving as a semiconductor substrate with the gate insulating film 105a interposed therebetween. The gate insulating film 105a between the P-type well 102 and the gate 106a can be thinned by being formed to have a film thickness of 12[nm] to match a maximum voltage difference of 8[V] or less on the common NMOS control lines NGa, NGc, and NGd so that the gate insulating film 105a can be thinned.

Figure 10A:
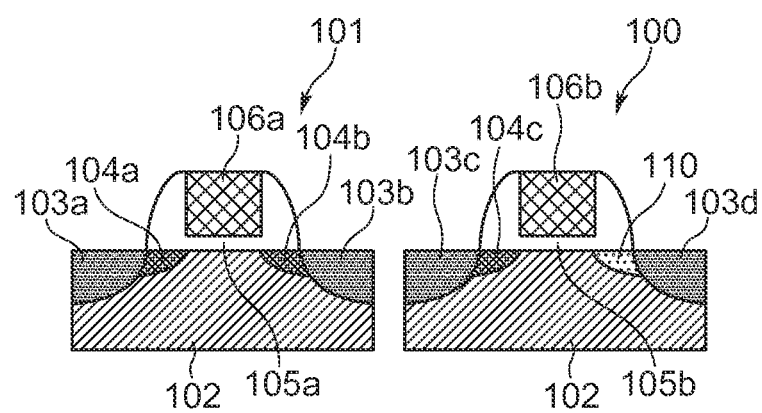
FIG. 10 is a side sectional view illustrating a peripheral NMOS transistor and respective breakdown voltage structures of various types of NMOS switches.

On the other hand, as illustrated in FIG. 10A, the NMOS switch 100 has an asymmetrical breakdown voltage structure having a higher breakdown voltage structure on the drain side connected to the word line 15 than that on the source side, and differs from the peripheral NMOS transistor 101 in that an impurity concentration of a drain-side extension portion 110 formed at an end of a drain 103d is made lower than an impurity concentration of a source-side extension portion 104c. In practice, in the NMOS switch 100, a source 103c and the drain 103d are formed with predetermined spacing in a P-type well 102, and a gate insulating film 105b is provided on the P-type well 102 between the source 103c and the drain 103d. In the P-type well 102, the source-side extension portion 104c is formed at an end of the source 103c while the drain-side extension portion 110 is formed at an end of the drain 103d, a channel region is formed between the source-side extension portion 104c and the drain-side extension portion 110, and a gate 106b is provided on the channel region with the gate insulating film 105b interposed therebetween.

The NMOS switch 100 corresponds to the NMOS switch 9a (9b, 9c, 9d, . . . ) illustrated in FIG. 2. Thus, 0[V] or 8[V] is applied to the gate 106b, 0[V] or 6[V] is applied to the source, and 0[V] is further applied to the P-type well 102, for example, during data writing. Thus, in the NMOS switch 100, a maximum voltage difference occurring between the gate and the P-type well 102 and a maximum voltage difference occurring between the source and the P-type well 102 are suppressed to 8 [V] or less. Therefore, the gate insulating film 105b between the gate and the P-type well 102 can be thinned by being formed to have a film thickness of 12[nm].

On the other hand, in this NMOS switch 100, the word line 15 is connected to the drain, as described above, and thus a writing gate voltage of 12[V] and a writing inhibition gate voltage of 0[V] are applied thereto during data writing. As a result, the NMOS switch 100 needs to have a breakdown voltage structure for a maximum voltage difference of 12[V] on the drain side. Therefore, in the NMOS switch 100, the drain-side extension portion 110 having a low impurity concentration is provided so that a voltage can be lowered in the drain-side extension portion 110. Thus, the NMOS switch 100 is adapted so that the gate insulating film 105b can be thinned by being formed to have a film thickness of 12[nm], similarly to the peripheral NMOS transistor 101, while having a breakdown voltage structure for the voltage difference of 12[V] on the drain side.

Figure 10B:
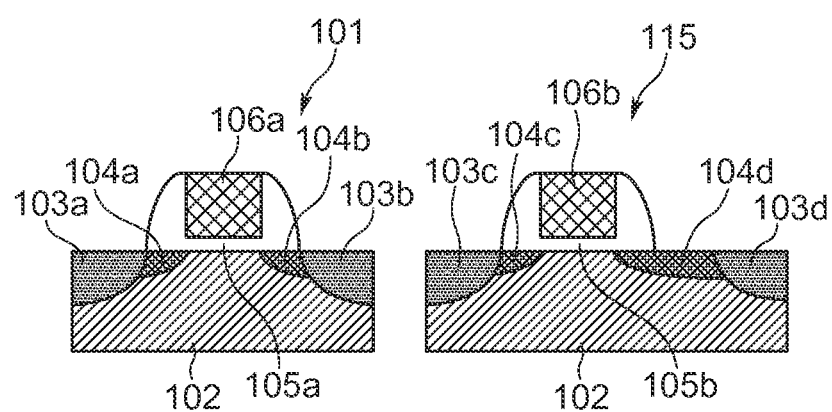

Then, the NMOS switch 115 illustrated in FIG. 10B similarly has an asymmetrical breakdown voltage structure having a higher breakdown voltage structure on the drain side connected to the word line 15 than that on the source side, and has an offset structure in which a drain 103d is formed away from a gate 106b. In practice, the NMOS switch 115 is adapted so that spacing between a source 103c and the drain 103d is made wider, a drain-side extension portion 104d is formed over an area, which is two to three times wider than a source-side extension portion 104c, and accordingly the gate 106b is far apart from the drain 103d, as compared with the above-mentioned NMOS switch 100, and a gate insulating film 105b can be thinned by being formed to have a film thickness of 12[nm], similarly to the peripheral NMOS transistor 101, while alleviating an effect of a maximum voltage difference of 12[V] occurring on the side of the drain 103d.

Figure 10C:
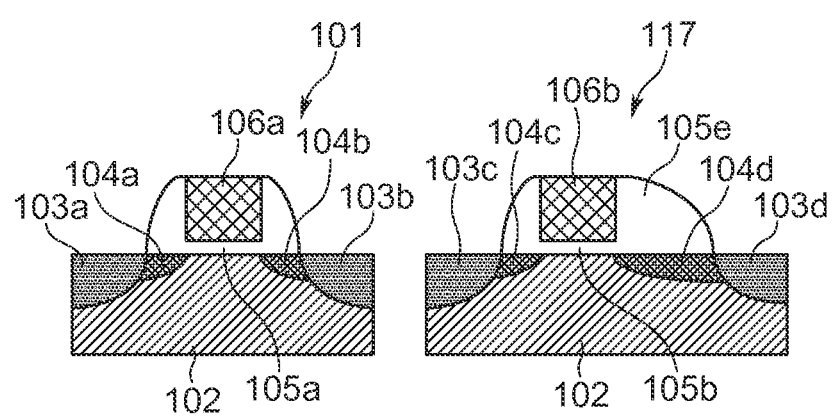

Then, the NMOS switch 117 illustrated in FIG. 10C has a similar asymmetrical breakdown voltage structure to the above, has an offset structure in which a drain 103d is formed away from a gate 106b while differing from the above-mentioned NMOS switch 115 in that a sidewall in a side part of a gate insulating film 105b is formed to cover the whole of a drain-side extension portion 104d extending over a wide area. The NMOS switch 117 having such a configuration is also adapted so that the gate insulating film 105b can be thinned by being formed to have a film thickness of 12[nm], similarly to the peripheral NMOS transistor 101, while alleviating an effect of a maximum voltage difference of 12[V] occurring on the side of the drain 103d because the drain 103d is far apart from the gate 106b.

Figure 11A:
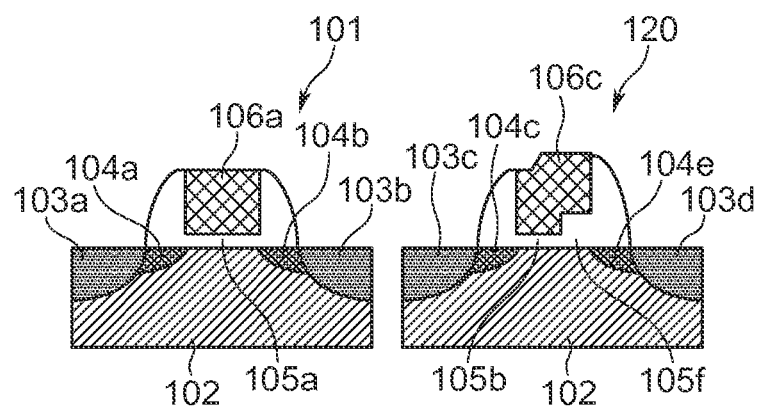
FIG. 11 is a side sectional view illustrating respective other breakdown voltage structures of NMOS switches.

Then, the NMOS switch 120 illustrated in FIG. 11A has a similar asymmetrical breakdown voltage structure to the above, includes a gate insulating film 105b having a film thickness of 12[nm], for example, while having a configuration in which a gate insulating film (hereinafter referred to as a thick-film gate oxide film) 105f having a larger film thickness than that of the gate insulating film 105b. In practice, the NMOS switch 120 is adapted so that a step portion recessed upward is formed at a bottom end, positioned on the side of the drain 103d, of a gate 106c, the gate 106c and the P-type well 102 separate from each other because the bottom of the gate 106c is recessed to be far apart from the P-type well 102 so that an effect of a maximum voltage difference of 12[V] occurring on the side of a drain 103d can be alleviated and the gate insulating film 105b on the side of a source 103c can be thinned by being formed to have a film thickness of 12[nm].

Figure 11B:
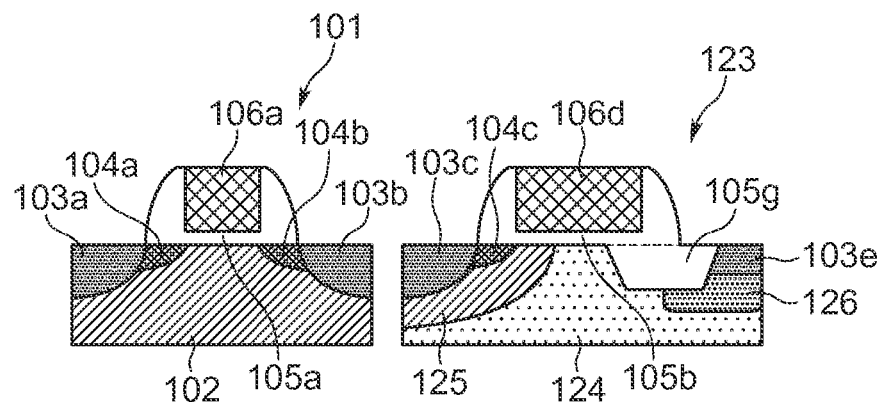

Then, in the NMOS switch 123 illustrated in FIG. 11B, a source 103c and a drain 103e are formed with predetermined spacing in a P-type well 124 having a lower well concentration than a well concentration of the P-type well 102 in the peripheral NMOS transistor 101. A source-side extension portion 104c is formed at an end of the source inside the P-type well 124, and another extension portion 125 having a different impurity concentration is formed to cover the source 103c and the source-side extension portion 104c.

An embedded oxide film 105g is formed at an end of the drain 103e in the P-type well 124, a drain-side extension portion 126 is formed on the bottoms of the drain 103e and the embedded oxide film 105g, and a channel region is formed between the extension portion 125 on the source side and the embedded oxide film 105g. The embedded oxide film 105g in the P-type well 124 is formed at a position, opposing a low end positioned on the side of the drain 103e, of a gate 106d, the gate 106d is far apart from the drain 103e and the drain-side extension portion 126 because the embedded oxide film 105g is provided so that the gate insulating film 105b can be thinned by being formed to have a film thickness of 12[nm] while an effect of a maximum voltage difference of 12[V] occurring on the side of the drain 103e is alleviated.

Figure 11C:
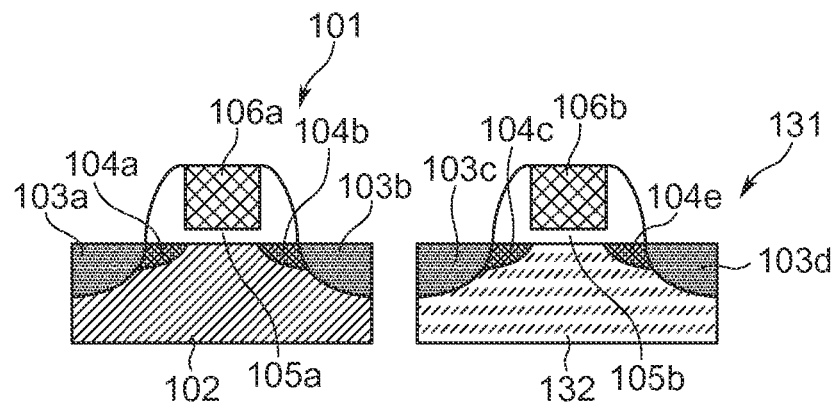
Figure 11D:
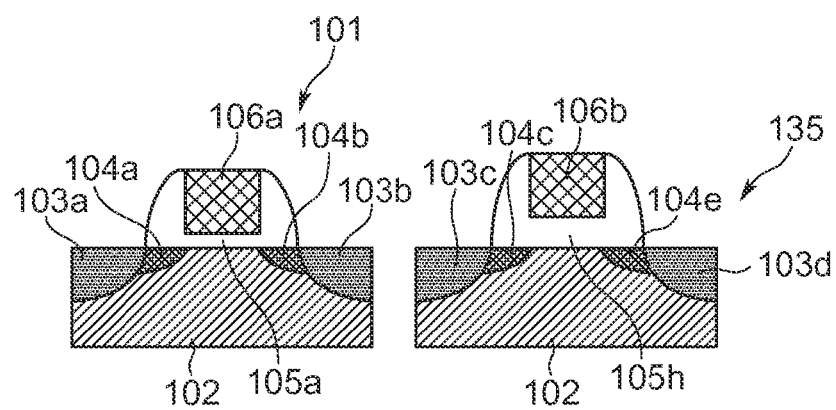

In addition, a breakdown voltage structure for a maximum voltage difference of 12[V] occurring on the side of a drain 103d may be a configuration in which a well concentration of a P-type well 132 is selected to be lower than a well concentration of the P-type well 102 in the peripheral NMOS transistor 101, for example, to raise a breakdown voltage itself between a source 103c and a drain 103d, like in the NMOS switch 131 illustrated in FIG. 11C, or a configuration in which a gate insulating film 105h is selected to have a large film thickness, like in the NMOS switch 135 illustrated in FIG. 11D.

(12) Mixed Chip Using Non-volatile Semiconductor memory device FIG. 12 illustrates a mixed chip 201 using a conventional non-volatile semiconductor memory device 212 (EEPROM or Flash, written as "EEPROM/Flash") and a mixed chip 251 using a non-volatile semiconductor memory device 255 according to the present invention (corresponding to the above-mentioned non-volatile semiconductor memory devices 1, 21, 27, 31, 38, 41, 51, 55, 61, written as "EEPROM/Flash"). In this case, in the conventional mixed chip 201, a large number of external connection electrodes 203 such as bonding pads are arranged at a peripheral edge of a substrate 202, and a logic circuit power supply 207, a CPU (Central Processing Unit) 208, an analog circuit 209, the non-volatile semiconductor memory device 212, and a RAM (Random Access Memory) 210 are provided in an inside region surrounded by the external connection electrodes 203.

In practice, in the conventional mixed chip 201, the logic circuit power supply 207, the CPU 208, the RAM 210, and a peripheral circuit 211 in the non-volatile semiconductor memory device 212 can constitute an area AR10 including a thin film transistor having a breakdown voltage corresponding to a logic circuit voltage of 1.2 [V], for example, applied by the logic circuit power supply 207. In the conventional mixed chip 201, the analog circuit 209 can constitute an area AR11 including a transistor having a breakdown voltage corresponding to an interface voltage of 5.0[V] or 3.3[V], for example. Further, in the conventional mixed chip 201, the non-volatile semiconductor memory device 212 can constitute an area AR12 including a thin film transistor having a breakdown voltage corresponding to a rewritable gate voltage of 12[V] or 10[V], for example.

Thus, the conventional mixed chip 201 generally includes an area AR10 including a low-voltage transistor having a gate insulating film with a film thickness of 3[nm], for example, as a breakdown voltage structure for a logic circuit voltage of 1.2[V] and an area AR11 including a 5[V]transistor having a gate insulating film with a film thickness of 12[nm], for example, as a breakdown voltage structure for an interface voltage of 5.0[V] or 3.3[V]. In this case, the conventional mixed chip 201 contains the non-volatile semiconductor memory device 212, although the film thickness of the gate insulating film can be decreased to approximately 12[nm] using a low-voltage transistor configuration in the area AR10 or the area AR11, so that a high-voltage transistor with a film thickness of 18[nm] needs to be newly added, for example, to match a breakdown voltage structure of the non-volatile semiconductor memory device 212, the number of manufacturing masks correspondingly increases. Accordingly, the process cost also further increases.

On the other hand, in the non-volatile semiconductor memory device 255 according to the present invention, a writing gate voltage of 12[V] or 10[V], for example, is applied to the word line 15 during data writing. However, voltage amplitudes in the PMOS switches 8a, 8c, . . . (8b, 8d, . . . ) and the NMOS switches 9a, 9c, . . . (9b, 9d, . . . ) can be set to 8[V] or less. Thus, electric fields applied to the PMOS switches 8a, 8c, (8b, 8d, . . . ), the NMOS switches 9a, 9c, . . . (9b, 9d, . . . ), first and second PMOS control voltage generation circuits, and first and second NMOS control voltage generation circuits can be reduced.

As a result, in the mixed chip 251 using the non-volatile semiconductor memory device 255 according to the present invention, a standard 5[V]transistor can be used as a circuit, which handles a rewriting gate voltage or the like, while using a writing gate voltage or a writing inhibition gate voltage as they are, and the non-volatile semiconductor memory device 255 serving as a Flash memory or an EEPROM can be mounted without adding a dedicated high-voltage transistor.

(13) Another Embodiment

While in the above-mentioned embodiments the voltage values during data writing and data erasure are clearly written in FIGS. 1 to 12, the present invention is not limited to this. Various voltage values may be used.

For example, the voltage values, for example, the writing gate voltage of 10[V] may be changed, as needed. A case where two types of MOS switches such as the PMOS switches 8a, 8c, . . . (8b, 8d, . . . ) and the NMOS switches 9a, 9c, . . . (9b, 9d, . . . ) constitute a switching mechanism has been described in the second embodiment and the third embodiment, for example, the present invention is not limited to this. Only the PMOS switches may constitute the switching mechanism, or the NMOS switches may constitute the switching mechanism.

Furthermore, a case where an SONOS (Silicon-Oxide-Nitride-Oxide-Silicon)-type memory cell C capable of storing a charge in a silicon nitride film layer is applied as a memory cell capable of storing a charge in a charge storage layer has been described in the above-mentioned embodiments, however, the present invention is not limited to this. For example, various memory cells such as a stack-type memory cell in which polycrystalline silicon (polysilicon) having a conductive property is formed on a tunnel oxide film and a charge is stored in its floating gate may be used.

Furthermore, a case where all values of the voltages applied to the non-selected word lines 15b, 15d, . . . , the P-type memory well PW2, the non-selected first bit line L1c, and the non-selected second bit line L2c in the non-selected unit column 2b are made the same has been described in the first embodiment and the like, for example. On the other hand, a case where a voltage difference between the voltages applied to the non-selected word lines 15b, 15d, . . . and the P-type memory well PW2 and the voltages applied to the non-selected first bit line L1c and the non-selected second bit line L2c in the non-selected unit column 32b is set to 2[V] has been described in the fifth embodiment. However, the present invention is not limited to these. A voltage difference between the voltages respectively applied to the non-selected word lines 15b, 15d, . . . and the P-type memory well PW2 in the non-selected unit columns 2b, 32b, . . . is set to 1[V] or less, or a voltage difference between the voltages applied to the non-selected word lines 15b, 15d, . . . and the P-type memory well PW2 and the voltages applied to the non-selected first bit line L1c and the non-selected second bit line L2c may be set to 1[V] or less. In other words, if no charge is stored in the non-selected memory cell C2 in the non-selected unit columns 2b, 32b, . . . , the voltage difference may be set to various other values.

Furthermore, in the second embodiment, the voltage amplitudes of the control voltages applied to the common PMOS control lines PGa to PGd and the common NMOS control lines NGa to NGd may be set to 8[V] or less. In the third embodiment, the voltage amplitudes of the control voltages applied to the common PMOS control lines PGa to PGd and the common NMOS control lines NGa to NGd may be set to 6[V] or less. In the fifth embodiment, the voltage amplitudes of the control voltages applied to the common PMOS control lines PGa to PGd and the common NMOS control lines NGa to NGd may be set to 6[V] or less. In the sixth embodiment, the voltage amplitudes of the control voltages applied to the common PMOS control lines PGa to PGd and the common NMOS control lines NGa to NGd may be set to 4[V] or less. In addition, if the voltage amplitudes of the control voltages applied to the common PMOS control line PGa to PGd and the common NMOS control lines NGa to NGd are selected between the writing gate voltage (e.g., 12[V]) applied to the selected memory cell C1 and the minimum writing inhibition gate voltage (e.g., 0[V]) applied to non-selected memory cell C2, the voltage amplitudes may be selected to various values.

Furthermore, in the above-mentioned first to seventh embodiments, the operation and the effect in the present invention have been described for each of the embodiments. However, in another embodiment having the same configuration as that in one of the embodiments, the operation and the effect described in the one embodiment are naturally be produced even if not described in the other embodiment.

REFERENCE SIGNS LIST 1, 21, 27, 31, 38, 41, 51, 55, 61 non-volatile semiconductor memory device
2 unit column
4, 34, 44, 64, 78 power supply unit
5a, 5b first power supply line (unit wiring)
6a, 6b second power supply line (unit wiring)
7a, 7b, 45a, 45b auxiliary MOS power supply line (auxiliary switching power supply line)
8a, 8b, 8c, 8d, 69a, 69b, 69c, 69d PMOS switch (switching mechanism)
9a, 9b, 9c, 9d, 70a, 70b, 70c, 70d NMOS switch (switching mechanism)
15 word line
36a, 36b, 36c, 36d, 71a, 71b, 71c, 71d auxiliary NMOS switch (auxiliary switch)
46a, 46b, 46c, 46d auxiliary PMOS switch (auxiliary switch)
C memory cell
C1, C3 selected memory cell
C2, C4 non-selected memory cell
L1 first bit line (bit line)
L2 second bit line (bit line)
PGa, PGb, PGc, PGd common PMOS control line (common wiring)
NGa, NGb, NGc, NGd common NMOS control line (common wiring)
67a, 67b, 67c, 67d common power supply line (common wiring)
VPa, VPb PMOS power supply line (unit wiring)
VNa, VNb NMOS power supply line (unit wiring)
PW2 P-type memory well (memory cell)
NW2 N-type memory well (memory well)

What is claimed is:

1. A non-volatile semiconductor memory device comprising a plurality of word lines formed in a matrix to which either one of a charge storage gate voltage and a charge storage inhibition gate voltage is applied, a plurality of memory cells connected to the respective word lines, and a bit line that applies a selective voltage to the plurality of memory cells, a charge being stored in selected one of the plurality of memory cells due to a voltage difference between the charge storage gate voltage applied to the word line and the voltage applied to the bit line, further comprising power supply units respectively provided for word line columns and common wirings respectively provided for word line rows, each of the common wirings applying a predetermined common voltage to the power supply units on a word-line-row basis, each of the power supply units including switching mechanisms that are respectively provided for the word lines and respectively connect the word lines to the common wirings, and a unit wiring that uniformly applies different unit voltages to each of the switching mechanisms in the power supply unit depending on whether or not the selected memory cell exists in the word line column, wherein the switching mechanisms in each of the power supply units are turned on or off based on a voltage difference between the unit voltages applied to each of the power supply units and the common voltage, to individually apply the charge storage gate voltage or the charge storage inhibition gate voltage to each of the word lines via the power supply unit, and wherein the switching mechanisms respectively include at least a PMOS switch and an NMOS switch, and the PMOS switch and the NMOS switch are individually turned on or off based on a voltage difference between the common voltage and the unit voltages occurring when the common voltage and the unit voltage are respectively applied thereto.

2. The non-volatile semiconductor memory device according to claim 1, wherein
wells having the switching mechanisms formed therein are formed in the respective power supply units to electrically separate from each other.

3. The non-volatile semiconductor memory device according to claim 1, wherein
the common wiring includes a common PMOS control line connected to a control gate of the PMOS switch and a common NMOS control line connected to a control gate of the NMOS switch,
the unit wiring includes a first power supply line connected to a source of the PMOS switch and a second power supply line connected to a source of the NMOS switch, and
the word line is connected to each of drains of the PMOS switch and the NMOS switch.

4. The non-volatile semiconductor memory device according to claim 1, wherein
in the selected power supply unit to which the selected word line having the selected memory cell thereon is connected among the power supply units,
the NMOS switch is turned off and the PMOS switch having the source to which the charge storage gate voltage is applied is turned on so that the charge storage gate voltage is applied to the selected word line from the drain of the PMOS switch.

5. The non-volatile semiconductor memory device according to claim 3, wherein
a first PMOS power supply line and a second PMOS power supply line are connected to the common PMOS control line via first selection means,
the common PMOS control line applies a control voltage on either one of the first PMOS power supply line and the second PMOS power supply line to the PMOS switch in each of the power supply units using the first selection means,
a first NMOS power supply line and a second NMOS power supply line are connected to the common NMOS control line via second selection means, and
the common NMOS control line applies a control voltage on either one of the first NMOS power supply line and the second NMOS power supply line to the NMOS switch in each of the power supply units using the second selection means.

6. The non-volatile semiconductor memory device according to claim 1, wherein
the common wiring is a common power supply line connected to each of the sources of the PMOS switch and the NMOS switch,
the unit wiring includes
a PMOS power supply line connected to the control gate of the PMOS switch, and
an NMOS power supply line connected to the control gate of the NMOS switch, and
the word line is connected to each of the drains of the PMOS switch and the NMOS switch.

7. A non-volatile semiconductor memory device comprising a plurality of word lines formed in a matrix to which either one of a charge storage gate voltage and a charge storage inhibition gate voltage is applied, a plurality of memory cells connected to the respective word lines, and a bit line that applies a selective voltage to the plurality of memory cells, a charge being stored in selected one of the plurality of memory cells due to a voltage difference between the charge storage gate voltage applied to the word line and the voltage applied to the bit line,
further comprising power supply units respectively provided for word line columns and common wirings respectively provided for word line rows, each of the common wirings applying a predetermined common voltage to the power supply units on a word-line-row basis,
each of the power supply units including
switching mechanisms that are respectively provided for the word lines and respectively connect the word lines to the common wirings,
a unit wiring that uniformly applies different unit voltages to each of the switching mechanisms in the power supply unit depending on whether or not the selected memory cell exists in the word line column,
auxiliary switches that are respectively provided for the switching mechanisms and are connected to the unit wiring, and
an auxiliary switching power supply line that uniformly applies different auxiliary control voltages, respectively, to the auxiliary switches in the power supply unit depending on whether or not the selected memory cell exists in the word line column, wherein
the switching mechanisms in each of the power supply units are turned on or off based on a voltage difference between the unit voltages applied to each of the power supply units and the common voltage, to individually apply the charge storage gate voltage or the charge storage inhibition gate voltage to each of the word lines via the power supply unit, and
the auxiliary switch is turned on based on a voltage difference between the unit voltages and the auxiliary control voltages when only non-selected memory cells exist in the word line column, to apply the unit voltages to a non-selected word line to which only the non-selected memory cells other than the selected memory cell are connected as the charge storage inhibition gate voltage.

8. A non-volatile semiconductor memory device comprising a plurality of word lines formed in a matrix to which either one of a charge storage gate voltage and a charge storage inhibition gate voltage is applied, a plurality of memory cells connected to the respective word lines, and a bit line that applies a selective voltage to the plurality of memory cells, a charge being stored in selected one of the plurality of memory cells due to a voltage difference between the charge storage gate voltage applied to the word line and the voltage applied to the bit line,
further comprising power supply units respectively provided for word line columns and common wirings respectively provided for word line rows, each of the common wirings applying a predetermined common voltage to the power supply units on a word-line-row basis,
each of the power supply units including
switching mechanisms that are respectively provided for the word lines and respectively connect the word lines to the common wirings, and
a unit wiring that uniformly applies different unit voltages to each of the switching mechanisms in the power supply unit depending on whether or not the selected memory cell exists in the word line column, wherein
the switching mechanisms in each of the power supply units are turned on or off based on a voltage difference between the unit voltages applied to each of the power supply units and the common voltage, to individually apply the charge storage gate voltage or the charge storage inhibition gate voltage to each of the word lines via the power supply unit, wherein
a control voltage difference between one control voltage applied as the common voltage to the common wiring in the selected word line row to which the selected memory cell is connected and another control voltage that is applied as the common voltage to the common wiring in the non-selected word line row to which only non-selected memory cells other than the selected memory cell are connected is selected as a voltage difference between the charge storage gate voltage and the charge storage inhibition gate voltage.

9. The non-volatile semiconductor memory device according to claim 8, wherein
the control voltage difference is 6 [V] or less.

10. The non-volatile semiconductor memory device according to claim 8, wherein
the control voltage difference is 4 [V] or less.

11. A non-volatile semiconductor memory device comprising a plurality of word lines formed in a matrix to which either one of a charge storage gate voltage and a charge storage inhibition gate voltage is applied, a plurality of memory cells connected to the respective word lines, and a bit line that applies a selective voltage to the plurality of memory cells, a charge being stored in selected one of the plurality of memory cells due to a voltage difference between the charge storage gate voltage applied to the word line and the voltage applied to the bit line, further comprising power supply units respectively provided for word line columns and common wirings respectively provided for word line rows, each of the common wirings applying a predetermined common voltage to the power supply units on a word-line-row basis, each of the power supply units including switching mechanisms that are respectively provided for the word lines and respectively connect the word lines to the common wirings, and a unit wiring that uniformly applies different unit voltages to each of the switching mechanisms in the power supply unit depending on whether or not the selected memory cell exists in the word line column, wherein the switching mechanisms in each of the power supply units are turned on or off based on a voltage difference between the unit voltages applied to each of the power supply units and the common voltage, to individually apply the charge storage gate voltage or the charge storage inhibition gate voltage to each of the word lines via the power supply unit, wherein each of the word line columns includes P-type memory wells, which electrically separate from one another, and the memory cell has an N-channel type configuration, and the switching mechanism applies the unit voltage having a higher voltage value than the voltage applied to the bit line as the charge storage gate voltage to the selected word line to which the selected memory cell is connected.

12. A non-volatile semiconductor memory device comprising a plurality of word lines arranged in a row direction and a column direction to which either one of a charge storage gate voltage and a charge storage inhibition gate voltage is applied, a plurality of memory cells connected to the respective word lines, and a bit line that applies a selective voltage to the plurality of memory cells, a charge being stored in selected one of the plurality of memory cells due to a voltage difference between the charge storage gate voltage applied to the word line and the voltage applied to the bit line, further comprising power supply units respectively provided for word line columns in which the plurality of word lines are arranged in the column direction, and common wirings extending in the row direction so as to intersect the power supply units and respectively provided for word line rows in which the plurality of word lines are arranged in the row direction, each of the common wirings applying a predetermined common voltage to the power supply units on a word-line-row basis, each of the power supply units including switching mechanisms that are respectively provided for the word lines and respectively connect the word lines to the common wirings, and a unit wiring that extends in the column direction, connects to the switching mechanisms and uniformly applies unit voltage to the switching mechanisms, the unit voltage being different for each of the power supply units depending on whether or not the selected memory cell exists in the word line column, wherein the switching mechanisms in each of the power supply units are turned on or off based on a voltage difference between the unit voltages applied to each of the power supply units and the common voltage, to individually apply the charge storage gate voltage or the charge storage inhibition gate voltage to each of the word lines via the power supply unit.

* * * * *